(12) United States Patent
Lutz et al.

(10) Patent No.: US 7,427,905 B2
(45) Date of Patent: Sep. 23, 2008

(54) TEMPERATURE CONTROLLED MEMS RESONATOR AND METHOD FOR CONTROLLING RESONATOR FREQUENCY

(75) Inventors: Markus Lutz, Palo Alto, CA (US); Aaron Partridge, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 11/895,502

(22) Filed: Aug. 23, 2007

(65) Prior Publication Data
US 2007/0296527 A1 Dec. 27, 2007

Related U.S. Application Data

(60) Continuation of application No. 11/252,349, filed on Oct. 17, 2005, now Pat. No. 7,268,646, which is a division of application No. 10/794,976, filed on Mar. 4, 2004, now Pat. No. 7,068,125.

(51) Int. Cl.
H03H 9/02 (2006.01)
H03H 9/46 (2006.01)
H03H 3/013 (2006.01)

(52) U.S. Cl. .................. 333/186; 333/188; 333/197; 333/200; 324/691; 324/703

(58) Field of Classification Search ......... 333/186–188, 333/193, 200
See application file for complete search history.

(56) References Cited

U.S. PATENT DOCUMENTS

| | | | | |
|---|---|---|---|---|
| 4,674,319 A | 6/1987 | Muller et al. | .......... | 73/23 |
| 4,849,071 A | 7/1989 | Evans et al. | .......... | 156/644 |
| 4,945,769 A | 8/1990 | Sidner et al. | .......... | 73/727 |
| 4,990,462 A | 2/1991 | Sliwa, Jr. | .......... | 437/51 |
| 5,053,627 A | 10/1991 | Ruffell et al. | .......... | 250/492.2 |
| 5,075,253 A | 12/1991 | Sliwa, Jr. | .......... | 437/209 |

(Continued)

FOREIGN PATENT DOCUMENTS

DE    198 19 458    11/1999

(Continued)

OTHER PUBLICATIONS

Syms, R.R.A,., "Electrothermal Frequency Tuning of Folded and Coupled Vibrating Micromechanical Resonators," IEEE Journal of Microelectromechanical Systems, vol. 7, No. 2, Jun. 1998, pp. 164-171.

(Continued)

*Primary Examiner*—Barbara Summons
(74) *Attorney, Agent, or Firm*—Kenyon & Kenyon LLP

(57) ABSTRACT

There are many inventions described and illustrated herein. In one aspect, the present invention is directed to a temperature compensated microelectromechanical resonator as well as fabricating, manufacturing, providing and/or controlling microelectromechanical resonators having mechanical structures that include integrated heating and/or temperature sensing elements. In another aspect, the present invention is directed to fabricate, manufacture, provide and/or control microelectromechanical resonators having mechanical structures that are encapsulated using thin film or wafer level encapsulation techniques in a chamber, and including heating and/or temperature sensing elements disposed in the chamber, on the chamber and/or integrated within the mechanical structures. Other aspects of the inventions will be apparent from the detailed description and claims herein.

23 Claims, 61 Drawing Sheets

U.S. PATENT DOCUMENTS

| | | | |
|---|---|---|---|
| 5,080,730 A | 1/1992 | Wittkower | 148/33 |
| 5,156,903 A | 10/1992 | Okumura et al. | 428/209 |
| 5,196,355 A | 3/1993 | Wittkower | 437/24 |
| 5,288,650 A | 2/1994 | Sandow | 437/24 |
| 5,369,544 A | 11/1994 | Mastrangelo | 361/283.4 |
| 5,445,991 A | 8/1995 | Lee | 216/2 |
| 5,455,547 A | 10/1995 | Lin et al. | 333/186 |
| 5,461,916 A | 10/1995 | Fujii et al. | 73/514.32 |
| 5,470,797 A | 11/1995 | Mastrangelo | 437/225 |
| 5,476,819 A | 12/1995 | Warren | 437/228 |
| 5,491,604 A | 2/1996 | Nguyen et al. | 361/278 |
| 5,504,026 A | 4/1996 | Kung | 437/51 |
| 5,510,156 A | 4/1996 | Zhao | 427/534 |
| 5,517,123 A | 5/1996 | Zhao et al. | 324/485 |
| 5,537,083 A | 7/1996 | Lin et al. | 333/186 |
| 5,540,095 A | 7/1996 | Sherman et al. | 73/514.18 |
| 5,583,290 A | 12/1996 | Lewis | 73/514.18 |
| 5,589,082 A | 12/1996 | Lin et al. | 216/2 |
| 5,604,312 A | 2/1997 | Lutz | 73/504.14 |
| 5,605,598 A | 2/1997 | Greiff | 156/630.1 |
| 5,613,611 A | 3/1997 | Johnson et al. | 206/728 |
| 5,616,514 A | 4/1997 | Muchow et al. | 438/50 |
| 5,617,065 A * | 4/1997 | Dydyk | 333/186 |
| 5,620,931 A | 4/1997 | Tsang et al. | 438/50 |
| 5,627,317 A | 5/1997 | Offenberg et al. | 73/514.32 |
| 5,627,318 A | 5/1997 | Fujii et al. | 73/514.32 |
| 5,631,422 A | 5/1997 | Sulzberger et al. | 73/514.32 |
| 5,640,039 A | 6/1997 | Chau et al. | 257/417 |
| 5,645,684 A | 7/1997 | Keller | 156/643.1 |
| 5,660,680 A | 8/1997 | Keller | 438/50 |
| 5,679,436 A | 10/1997 | Zhao | 428/141 |
| 5,683,591 A | 11/1997 | Offenberg | 216/2 |
| 5,703,293 A | 12/1997 | Zabler et al. | 73/504.2 |
| 5,721,377 A | 2/1998 | Kurle et al. | 73/504.12 |
| 5,723,353 A | 3/1998 | Muenzel et al. | 437/51 |
| 5,725,729 A | 3/1998 | Greiff | 156/657.1 |
| 5,728,936 A | 3/1998 | Lutz | 73/504.14 |
| 5,747,353 A | 5/1998 | Bashir et al. | 437/21 |
| 5,751,041 A | 5/1998 | Suzuki et al. | 257/357 |
| 5,760,305 A | 6/1998 | Greiff | 73/514.15 |
| 5,760,455 A | 6/1998 | Hierold et al. | 257/415 |
| 5,761,957 A | 6/1998 | Oba et al. | 73/727 |
| 5,804,083 A | 9/1998 | Ishii et al. | 216/2 |
| 5,818,227 A | 10/1998 | Payne et al. | 324/259 |
| 5,839,062 A | 11/1998 | Nguyen et al. | 455/323 |
| 5,847,280 A | 12/1998 | Sherman et al. | 73/514.32 |
| 5,858,809 A | 1/1999 | Chau et al. | 438/52 |
| 5,872,024 A | 2/1999 | Fujii et al. | 438/52 |
| 5,880,369 A | 3/1999 | Samuels et al. | 73/514.32 |
| 5,882,532 A | 3/1999 | Field et al. | 216/2 |
| 5,889,207 A | 3/1999 | Lutz | 73/504.13 |
| 5,898,218 A | 4/1999 | Hirose et al. | 257/710 |
| 5,919,364 A | 7/1999 | Lebouitz et al. | 210/321.84 |
| 5,922,212 A | 7/1999 | Kano et al. | 216/2 |
| 5,937,275 A | 8/1999 | Münzel et al. | 438/50 |
| 5,942,836 A * | 8/1999 | Yoshida et al. | 310/320 |
| 5,948,991 A | 9/1999 | Nomura et al. | 73/727 |
| 5,955,932 A | 9/1999 | Nguyen et al. | 333/186 |
| 5,959,208 A | 9/1999 | Muenzel et al. | 73/514.32 |
| 5,962,949 A | 10/1999 | Dhuler et al. | 310/307 |
| 5,969,249 A | 10/1999 | Roessig et al. | 73/514.15 |
| 5,969,250 A | 10/1999 | Greiff | 73/514.38 |
| 5,976,994 A | 11/1999 | Nguyen et al. | |
| 5,986,316 A | 11/1999 | Toyoda et al. | 257/419 |
| 5,987,989 A | 11/1999 | Yamamoto et al. | 73/514.24 |
| 5,992,233 A | 11/1999 | Clark | 73/514.35 |
| 6,009,753 A | 1/2000 | Tsang et al. | 73/514.32 |
| 6,028,332 A | 2/2000 | Kano et al. | 257/254 |
| 6,035,714 A | 3/2000 | Yazdi et al. | 73/514.32 |
| 6,048,774 A | 4/2000 | Yamamoto et al. | 438/406 |
| 6,055,858 A | 5/2000 | Muenzel et al. | 73/504.12 |
| 6,060,692 A * | 5/2000 | Bartley et al. | 219/210 |
| 6,065,341 A | 5/2000 | Ishio et al. | 73/514.32 |
| 6,067,858 A | 5/2000 | Clark et al. | 73/504.16 |
| 6,090,718 A | 7/2000 | Soga et al. | 438/714 |
| 6,100,108 A | 8/2000 | Mizuno et al. | 438/51 |
| 6,106,735 A | 8/2000 | Kurle et al. | 216/2 |
| 6,117,701 A | 9/2000 | Buchan et al. | 438/52 |
| 6,119,518 A | 9/2000 | Itou et al. | 73/504.12 |
| 6,122,964 A | 9/2000 | Mohaupt et al. | 73/514.32 |
| 6,125,700 A | 10/2000 | Tsugai et al. | 73/504.12 |
| 6,136,630 A | 10/2000 | Weigold et al. | 438/50 |
| 6,137,206 A | 10/2000 | Hill | 310/306 |
| 6,140,709 A | 10/2000 | Muenzel et al. | 257/781 |
| 6,142,358 A | 11/2000 | Cohn et al. | 228/44.7 |
| 6,146,917 A | 11/2000 | Zhang et al. | 438/51 |
| 6,147,756 A | 11/2000 | Zavracky et al. | 356/352 |
| 6,149,190 A | 11/2000 | Galvin et al. | 280/735 |
| 6,151,966 A | 11/2000 | Sakai et al. | 73/514.32 |
| 6,153,839 A | 11/2000 | Zavracky et al. | 200/181 |
| 6,156,652 A | 12/2000 | Michalicek | 438/674 |
| 6,163,643 A | 12/2000 | Bergmann et al. | 385/140 |
| 6,169,321 B1 | 1/2001 | Nguyen et al. | |
| 6,170,332 B1 | 1/2001 | MacDonald et al. | 73/514.38 |
| 6,171,881 B1 | 1/2001 | Fujii | 438/52 |
| 6,187,210 B1 | 2/2001 | Lebouitz et al. | 216/11 |
| 6,187,607 B1 | 2/2001 | Offenberg et al. | 438/48 |
| 6,191,007 B1 | 2/2001 | Matsui et al. | 438/459 |
| 6,192,757 B1 | 2/2001 | Tsang et al. | 73/514.32 |
| 6,199,430 B1 | 3/2001 | Kano et al. | 73/514.32 |
| 6,199,874 B1 | 3/2001 | Galvin et al. | 280/5.514 |
| 6,204,085 B1 | 3/2001 | Strumpell et al. | 438/51 |
| 6,210,988 B1 | 4/2001 | Howe et al. | 438/50 |
| 6,214,243 B1 | 4/2001 | Muenzel et al. | 216/2 |
| 6,218,717 B1 | 4/2001 | Toyoda et al. | 257/419 |
| 6,218,762 B1 | 4/2001 | Hill et al. | 310/307 |
| 6,227,049 B1 | 5/2001 | Fujii | 73/514.18 |
| 6,227,050 B1 | 5/2001 | Fujii et al. | 73/514.32 |
| 6,230,567 B1 | 5/2001 | Greiff | 73/514.37 |
| 6,233,811 B1 | 5/2001 | Payne et al. | 29/602.1 |
| 6,236,281 B1 | 5/2001 | Nguyen et al. | 331/154 |
| 6,238,946 B1 | 5/2001 | Ziegler | |
| 6,240,782 B1 | 6/2001 | Kato et al. | 73/514.32 |
| 6,244,112 B1 | 6/2001 | Fujii | 73/514.32 |
| 6,245,593 B1 | 6/2001 | Yoshihara et al. | 438/106 |
| 6,248,642 B1 | 6/2001 | Dolan et al. | 438/407 |
| 6,249,073 B1 | 6/2001 | Nguyen et al. | 310/309 |
| 6,250,156 B1 | 6/2001 | Seshia et al. | 73/504.12 |
| 6,250,165 B1 | 6/2001 | Sakai et al. | 73/754 |
| 6,251,754 B1 | 6/2001 | Ohshima et al. | 438/506 |
| 6,255,741 B1 | 7/2001 | Yoshihara et al. | 257/792 |
| 6,257,059 B1 | 7/2001 | Weinberg et al. | 73/504.16 |
| 6,264,363 B1 | 7/2001 | Takahashi et al. | 374/185 |
| 6,274,452 B1 | 8/2001 | Miura et al. | 438/384 |
| 6,275,034 B1 | 8/2001 | Tran et al. | 324/252 |
| 6,276,207 B1 | 8/2001 | Sakai et al. | 73/514.16 |
| 6,279,585 B1 | 8/2001 | Shiraki et al. | 134/1.3 |
| 6,282,960 B1 | 9/2001 | Samuels et al. | 73/514.32 |
| 6,284,670 B1 | 9/2001 | Abe et al. | 438/745 |
| 6,287,885 B1 | 9/2001 | Muto et al. | 438/48 |
| 6,291,315 B1 | 9/2001 | Nakayama et al. | 438/459 |
| 6,291,875 B1 | 9/2001 | Clark et al. | 257/622 |
| 6,291,922 B1 | 9/2001 | Dhuler | 310/307 |
| 6,296,779 B1 | 10/2001 | Clark et al. | 216/66 |
| 6,297,072 B1 | 10/2001 | Tilmans et al. | 438/106 |
| 6,300,294 B1 | 10/2001 | Robbins et al. | 508/524 |
| 6,307,815 B1 | 10/2001 | Polosky et al. | 368/220 |
| 6,308,567 B1 | 10/2001 | Higuchi et al. | 73/504.12 |
| 6,311,555 B1 | 11/2001 | McCall et al. | 73/488 |
| 6,315,062 B1 | 11/2001 | Alft et al. | 175/45 |
| 6,318,175 B1 | 11/2001 | Muchow et al. | 73/514.29 |
| 6,318,177 B2 | 11/2001 | Buchan et al. | 73/514.32 |
| 6,323,550 B1 | 11/2001 | Martin et al. | 257/704 |
| 6,325,886 B1 | 12/2001 | Harris et al. | 156/314 |

| | | | |
|---|---|---|---|
| 6,352,935 B1 | 3/2002 | Collins et al. | 438/708 |
| 6,355,534 B1 | 3/2002 | Cheng et al. | 438/379 |
| 6,373,007 B1 | 4/2002 | Calcatera et al. | 200/181 |
| 6,378,989 B1 | 4/2002 | Silverbrook | 347/54 |
| 6,379,989 B1 | 4/2002 | Kubby et al. | 438/52 |
| 6,386,032 B1 | 5/2002 | Lemkin et al. | 73/504.02 |
| 6,388,279 B1 | 5/2002 | Sakai et al. | 257/254 |
| 6,389,899 B1 | 5/2002 | Partridge et al. | 73/514.33 |
| 6,389,903 B1 | 5/2002 | Oba et al. | 73/756 |
| 6,391,673 B1 | 5/2002 | Ha et al. | 438/51 |
| 6,391,674 B2 | 5/2002 | Ziegler | |
| 6,392,144 B1 | 5/2002 | Filter et al. | 174/52.4 |
| 6,396,372 B1 | 5/2002 | Sakata et al. | 335/80 |
| 6,396,711 B1 | 5/2002 | Degani et al. | 361/760 |
| 6,402,968 B1 | 6/2002 | Yazdi et al. | 216/2 |
| 6,410,361 B2 | 6/2002 | Dhuler et al. | 438/54 |
| 6,413,793 B1 | 7/2002 | Lin et al. | 438/50 |
| 6,416,831 B1 | 7/2002 | Hara et al. | 428/34.6 |
| 6,417,078 B1 | 7/2002 | Dolan et al. | 438/480 |
| 6,422,078 B2 | 7/2002 | Imai | 73/514.32 |
| 6,423,563 B2 | 7/2002 | Fukada et al. | 438/50 |
| 6,423,975 B1 | 7/2002 | Smick et al. | 250/442.11 |
| 6,424,074 B2 | 7/2002 | Nguyen | 310/309 |
| 6,429,458 B1 | 8/2002 | Weigold et al. | 257/69 |
| 6,429,506 B1 | 8/2002 | Fujii et al. | 257/620 |
| 6,429,755 B2 | 8/2002 | Speidell et al. | 333/197 |
| 6,433,342 B1 | 8/2002 | Cordts, III et al. | 250/440.11 |
| 6,433,401 B1 | 8/2002 | Clark et al. | 257/524 |
| 6,433,411 B1 | 8/2002 | Degani et al. | 257/678 |
| 6,437,551 B1 | 8/2002 | Krulevitch et al. | 324/71.1 |
| 6,440,766 B1 | 8/2002 | Clark | 438/52 |
| 6,441,481 B1 | 8/2002 | Karpman | 257/711 |
| 6,443,008 B1 | 9/2002 | Funk et al. | 73/504.12 |
| 6,444,543 B2 | 9/2002 | Sakai et al. | 438/460 |
| 6,445,106 B1 | 9/2002 | Ma et al. | 310/309 |
| 6,448,109 B1 | 9/2002 | Karpman | 438/108 |
| 6,448,604 B1 | 9/2002 | Funk et al. | 257/312 |
| 6,448,622 B1 | 9/2002 | Franke et al. | 257/415 |
| 6,449,406 B1 | 9/2002 | Fan et al. | 385/17 |
| 6,450,029 B1 | 9/2002 | Sakai et al. | 73/488 |
| 6,460,234 B1 | 10/2002 | Gianchandani | 29/25.35 |
| 6,462,566 B1 | 10/2002 | Schoefthaler et al. | 324/750 |
| 6,463,803 B2 | 10/2002 | Fujii et al. | 73/514.32 |
| 6,465,281 B1 | 10/2002 | Xu et al. | 438/127 |
| 6,472,290 B2 | 10/2002 | Cho et al. | 438/411 |
| 6,477,901 B1 | 11/2002 | Tadigadapa et al. | 73/862.352 |
| 6,479,921 B2 | 11/2002 | Ma et al. | 310/309 |
| 6,483,957 B1 | 11/2002 | Hamerly et al. | 385/11 |
| 6,495,389 B2 | 12/2002 | Ishio et al. | 438/53 |
| 6,507,044 B1 | 1/2003 | Santana, Jr. et al. | 257/48 |
| 6,507,082 B2 | 1/2003 | Thomas | 257/414 |
| 6,507,983 B1 * | 1/2003 | Ruby et al. | 29/25.35 |
| 6,508,124 B1 | 1/2003 | Zerbini et al. | 73/514.32 |
| 6,508,126 B2 | 1/2003 | Sakai et al. | 73/514.32 |
| 6,508,561 B1 | 1/2003 | Alie et al. | 359/883 |
| 6,512,255 B2 | 1/2003 | Aoki et al. | 257/254 |
| 6,521,508 B1 | 2/2003 | Cheong et al. | 438/416 |
| 6,521,965 B1 | 2/2003 | Lutz | 257/415 |
| 6,522,052 B2 | 2/2003 | Kihara et al. | 310/366 |
| 6,524,890 B2 | 2/2003 | Ueda et al. | 438/133 |
| 6,529,093 B2 | 3/2003 | Ma | 333/101 |
| 6,531,668 B1 | 3/2003 | Ma | 200/181 |
| 6,531,767 B2 | 3/2003 | Shrauger | 257/678 |
| 6,534,340 B1 | 3/2003 | Karpman et al. | 438/113 |
| 6,550,331 B2 | 4/2003 | Fujii et al. | 73/514.32 |
| 6,550,339 B1 | 4/2003 | Toyoda et al. | 73/716 |
| 6,551,853 B2 | 4/2003 | Toyoda | 438/90 |
| 6,552,404 B1 | 4/2003 | Hynes et al. | 257/415 |
| 6,555,417 B2 | 4/2003 | Spooner et al. | 438/113 |
| 6,555,901 B1 | 4/2003 | Yoshihara et al. | 257/684 |
| 6,555,904 B1 | 4/2003 | Karpman | 257/704 |
| 6,558,976 B2 | 5/2003 | Shrauger | 438/106 |
| 6,568,267 B2 | 5/2003 | Chida et al. | 73/504.12 |
| 6,569,754 B2 | 5/2003 | Wong et al. | 438/612 |
| 6,570,468 B2 | 5/2003 | Ma et al. | 333/188 |
| 6,573,822 B2 | 6/2003 | Ma et al. | 336/223 |
| 6,586,836 B1 | 7/2003 | Ma et al. | 257/723 |
| 6,593,672 B2 | 7/2003 | Ma et al. | 307/109 |
| 6,600,389 B2 | 7/2003 | Ma et al. | 333/186 |
| 6,707,351 B2 * | 3/2004 | Gorrell | 333/188 |
| 7,176,770 B2 * | 2/2007 | Ayazi et al. | 333/186 |
| 7,310,029 B2 * | 12/2007 | Robert et al. | 333/188 |
| 2001/0001931 A1 | 5/2001 | Fujii et al. | 73/682.68 |
| 2001/0009110 A1 | 7/2001 | Tmai | 73/514.32 |
| 2001/0013630 A1 | 8/2001 | Cho et al. | 254/419 |
| 2001/0017058 A1 | 8/2001 | Buchan et al. | 73/514.32 |
| 2001/0034076 A1 | 10/2001 | Martin | 438/50 |
| 2001/0045127 A1 | 11/2001 | Chida et al. | 73/504.12 |
| 2002/0074621 A1 | 6/2002 | Cheng et al. | 257/532 |
| 2002/0074897 A1 | 6/2002 | Ma et al. | 310/311 |
| 2002/0081824 A1 | 6/2002 | Dolan et al. | 438/480 |
| 2002/0096967 A1 | 7/2002 | Ma et al. | 310/309 |
| 2002/0118850 A1 | 8/2002 | Yeh et al. | 381/313 |
| 2002/0123211 A1 | 9/2002 | Dolan et al. | 438/480 |
| 2002/0127760 A1 | 9/2002 | Yeh et al. | 438/50 |
| 2002/0135047 A1 | 9/2002 | Funk et al. | 257/595 |
| 2002/0164111 A1 | 11/2002 | Mirza | 385/18 |
| 2002/0177252 A1 | 11/2002 | Muto et al. | 438/48 |
| 2002/0180563 A1 | 12/2002 | Ma et al. | 333/197 |
| 2002/0190603 A1 | 12/2002 | Ma et al. | 310/309 |
| 2002/0190607 A1 | 12/2002 | Paden et al. | 310/328 |
| 2003/0001694 A1 | 1/2003 | Ma et al. | 333/188 |
| 2003/0006468 A1 | 1/2003 | Ma et al. | 257/416 |
| 2003/0006858 A1 | 1/2003 | Ma | 333/101 |
| 2003/0042117 A1 | 3/2003 | Ma | 200/181 |
| 2003/0048520 A1 | 3/2003 | Ma et al. | 359/295 |
| 2003/0051550 A1 | 3/2003 | Nguyen et al. | 73/514.36 |
| 2003/0062961 A1 | 4/2003 | Ma et al. | 331/100 |
| 2003/0077871 A1 | 4/2003 | Cheng et al. | 438/381 |
| 2003/0085109 A1 | 5/2003 | Ma | 200/181 |
| 2003/0085779 A1 | 5/2003 | Ma et al. | 333/188 |
| 2003/0112097 A1 | 6/2003 | Ma et al. | 333/187 |
| 2003/0132824 A1 | 7/2003 | Ma | 335/78 |
| 2003/0160539 A1 | 8/2003 | Ma et al. | 310/307 |
| 2005/0162040 A1 * | 7/2005 | Robert | 310/322 |

FOREIGN PATENT DOCUMENTS

| | | |
|---|---|---|
| WO | WO 01/77008 | 10/2001 |
| WO | WO 01/77009 | 10/2001 |
| WO | WO 03/069776 * | 8/2003 |

OTHER PUBLICATIONS

"Vacuum Sealing of Microcavities Using Metal Evaporation", Bartek et al., Sensors and Actuators A 61, 1997, pp. 364-368.

"Vacuum Packaging Technology Using Localized Aluminum/Silicon-to-Glass Bonding", Cheng et al., MEMS 2001, 14th IEEE International Conference, pp. 18-21.

"A Hermetic Glass-Silicon Package Formed Using Localized Aluminum/Silicon-Glass Bonding", Cheng et al., Journal of Microelectromechanical Systems, vol. 10, No. 3, Sep. 2001, pp. 392-399.

"MEMS Post-Packaging by Localized Heating and Bonding", Lin, IEEE Transactions on Advanced Packaging, vol. 23, No. 4, Nov. 2000, pp. 608-616.

"Localized Silicon Fusion and Eutectic Bonding for MEMS Fabrication and Packaging", Cheng et al., Journal of Microelectromechanical Systems, vol. 9, No. 1, Mar. 2000, pp. 3-8.

"Localized Bonding with PSG or Indium Solder as Intermediate Layer", Cheng et al., MEMS 1999, 12th IEEE International Conference, pp. 285-289.

"Vacuum encapsulation of resonant devices using permeable polysilicon", Lebouitz et al., Micro Electro Mechanical Systems, IEEE International Conference, Jan. 1999, pp. 470-475.

"Electrical and optical characteristics of vacuum-sealed polysilicon microlamps", Mastrangelo et al., IEEE Transactions on Electron Devices, v.39, No. 6, Jun. 1992, pp. 1363-1375.

"Vacuum-sealed silicon micromachined incandescent light source", Mastrangelo et al., IEDM Intnl. Electron Devices Meeting, Dec. 1989, pp. 503-506.

"Sealing of Micromachined Cavities Using Chemical Vapor Deposition Methods: Characterization and Optimization", Liu and Tai, IEEE Journal of Microelectromechanical Systems, vol. 8, No. 2, Jun. 1999, pp. 135-145.

"Vacuum Packaging Technology Using Localized Aluminum/Silicon-to-Glass Bonding", Cheng et al., IEEE Journal of Microelectromechanical Systems, vol. 11, No. 5, Oct. 2002, pp. 556-565.

"Novel Process for a Monolithic Integrated Accelerometer", Offenberg et al., The 8th International Conference on Solid-State Sensors and Actuators, and Eurosensors IX, Stockholm, Sweden, Jun. 25-29, 1995, pp. 589-592.

"An Integrated Wafer-Scale Packaging Process for MEMS", Kenny et al., Proceedings of IMECE2002, ASME International Mechanical Engineering Congress & Exposition, Nov. 17-22, 2002, New Orleans, Louisiana, pp. 51-54.

"Polysilicon Vibrating Gyroscope Vacuum-Encapsulated in an on-chip Micro Chamber", Tsuchiya et al., Sensors and Actuators A 90 (2001), pp. 49-55.

"New Thin Film Epitaxial Polysilicon Encapsulated for Piezoresistive Accelerometers", Partridge et al., IEEE 14th Intnl. Conference on MEMS, Jan. 2001, pp. 54-59.

"A Low Temperature Bi-CMOS Compatible Process for MEMS RF Resonators and Filters", Lund et al., Solid-State Sensor, Actuator and Microsystems Workshop, Hilton Head Island, South Carolina, Jun. 2-6, 2002, pp. 38-41.

"Wafer Scale Encapsulation of High-Q Micromechanical Resonator", Candler et al., Hilton Head, Open Poster, 2002.

"Sealed Vacuum Electronic Devices by Surface Micromachining", Zum et al., IEEE IEDM Intnl. Electron Devices Meeting 91, Sep. 1991, pp. 205-208.

"Stiffness-Compensated Temperature-Insensitive Micromechanical Resonators", Hsu and Nguyen, IEEE 15th Intnl. Conference on MEMS, Feb. 2002, pp. 731-734.

"Fine Frequency Tuning in Resonant Sensors", Cabuz et al., IEEE MEMS Proceedings, Jan. 1994, pp. 245-250.

"Frequency Trimming and Q-Factor Enhancement of Micromechanical Resonators Via Localized Filament Annealing", Wang et al., IEEE Transducers '97, 1997 International Conference on Solid-State Sensors and Actuators, Chicago, Jun. 16-19, 1997, pp. 109-112.

"MEMS Resonators That Are Robust to Process-Induced Feature Width Variations", Liu et al., IEEE International Frequency Control Symposium and PDA Exhibition, 2001, pp. 556-563.

"MEMS Resonators That Are Robust to Process-Induced Feature Width Variations", Liu et al., IEEE Journal of Microelectromechanical Systems, vol. 11, No. 3, Oct. 2002, pp. 505-511.

"Active Frequency Tuning for Micro Resonators by Localized Thermal Stressing Effects", Remtema et al., Elsevier, Sensors and Actuators A 91 (2001), pp. 326-332.

"Mechanically Temperature-Compensated Flexural-Mode Micromechanical Resonators", Hsu et al., IEEE IEDM Intnl. Electron Device Meeting, Dec. 2000, pp. 399-402.

"Geometric Stress Compensation for Enhanced Thermal Stability in Micromechanical Resonators", Hsu et al., IEEE Ultrasonics Symposium, 1998, pp. 945-848.

* cited by examiner

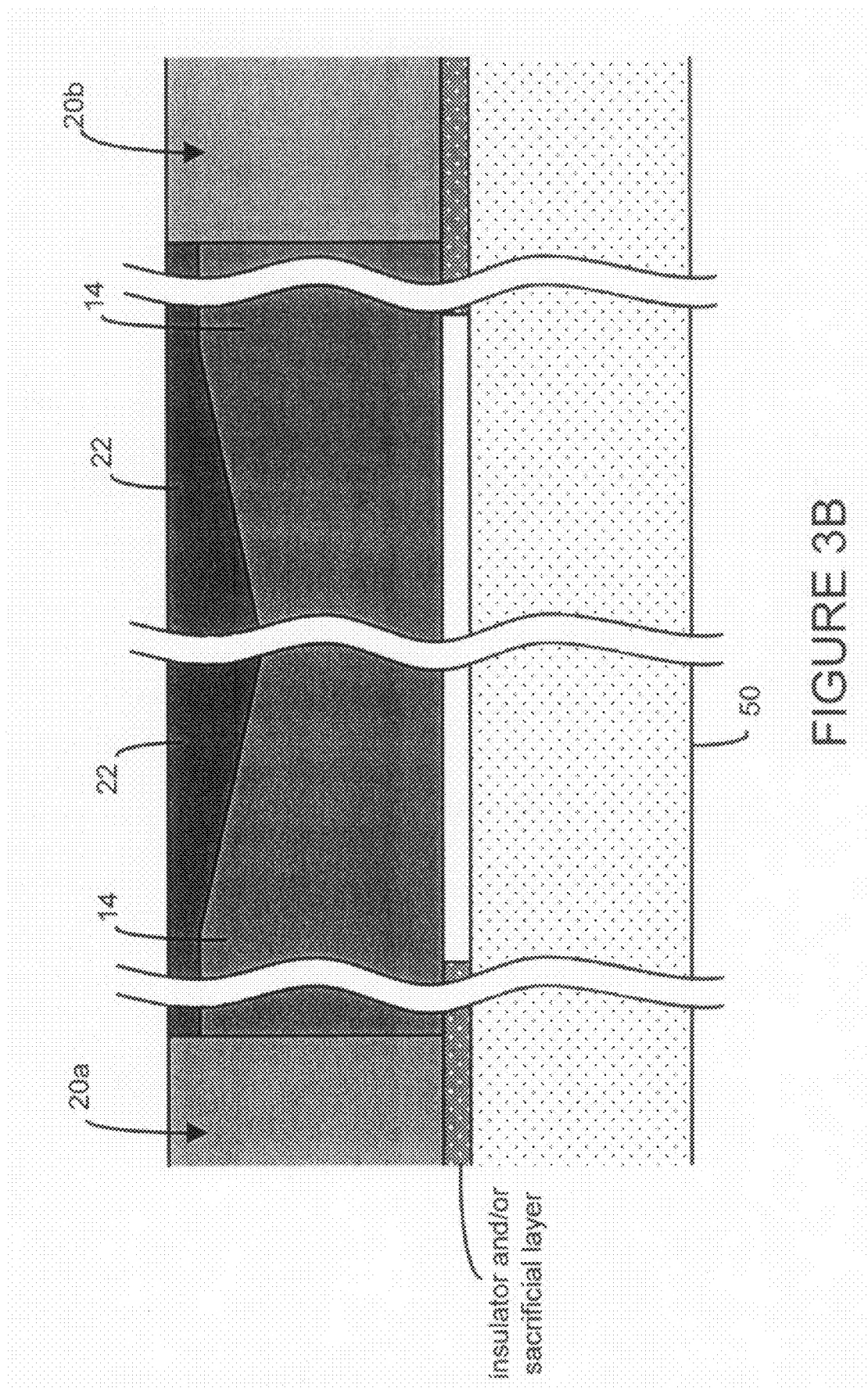

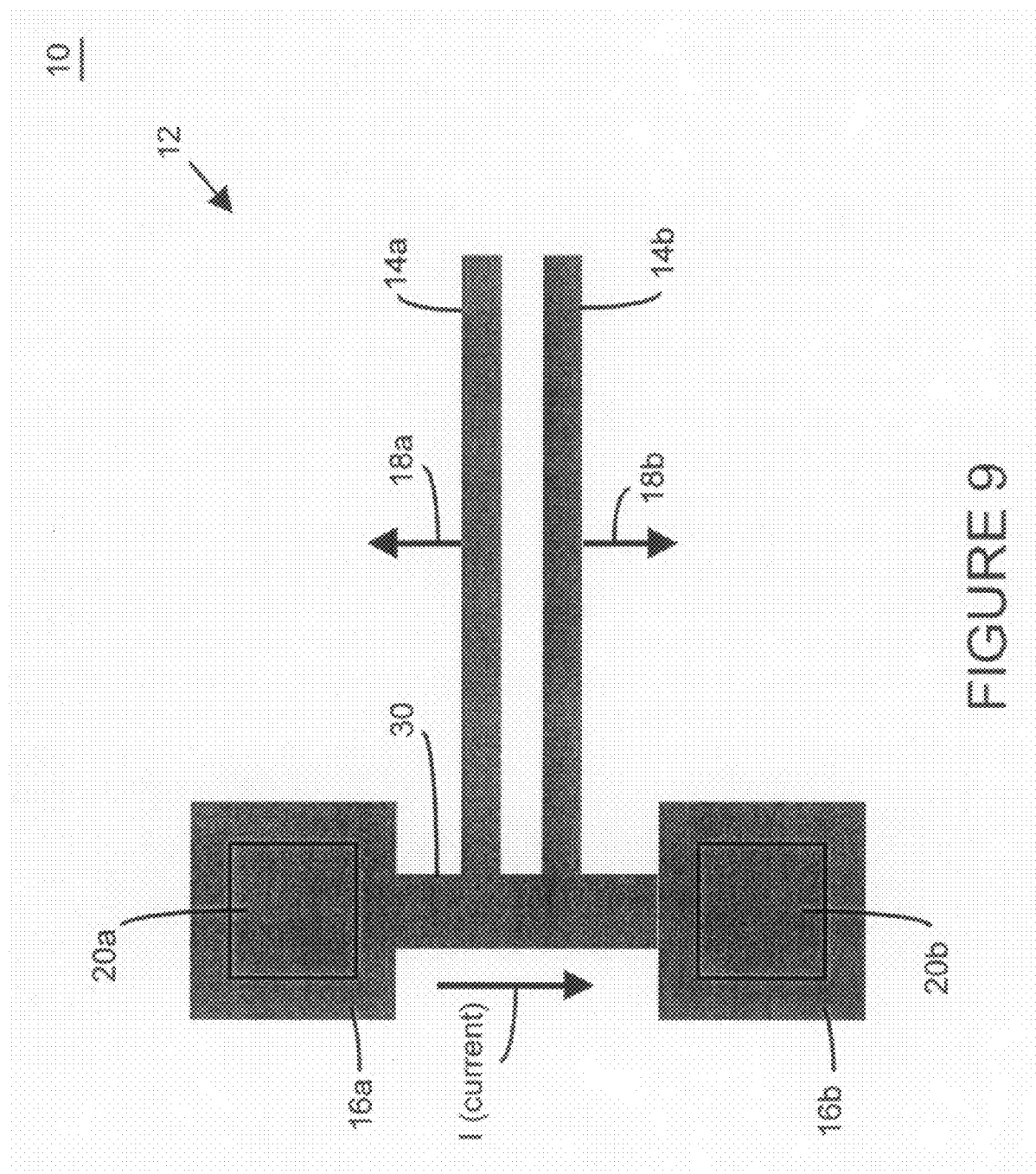

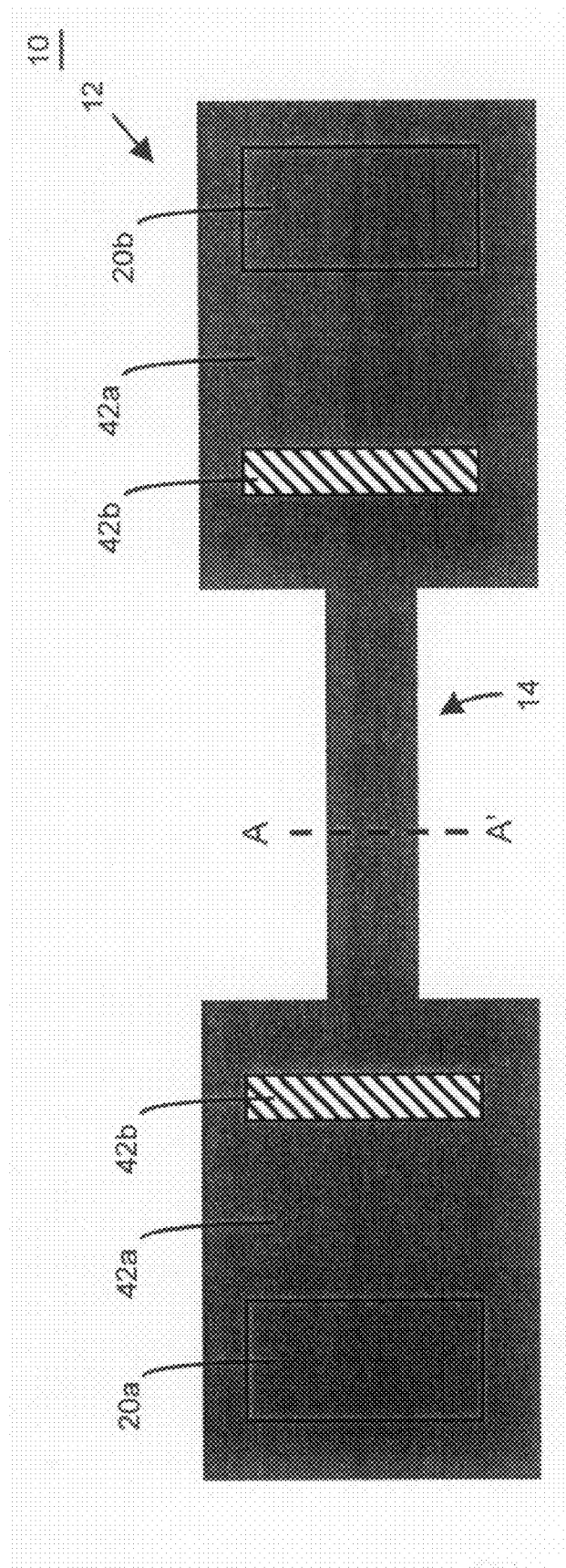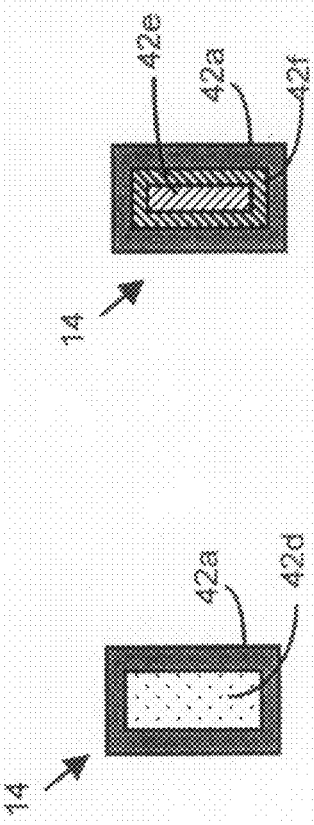
FIGURE 12B
FIGURE 12C
FIGURE 12D

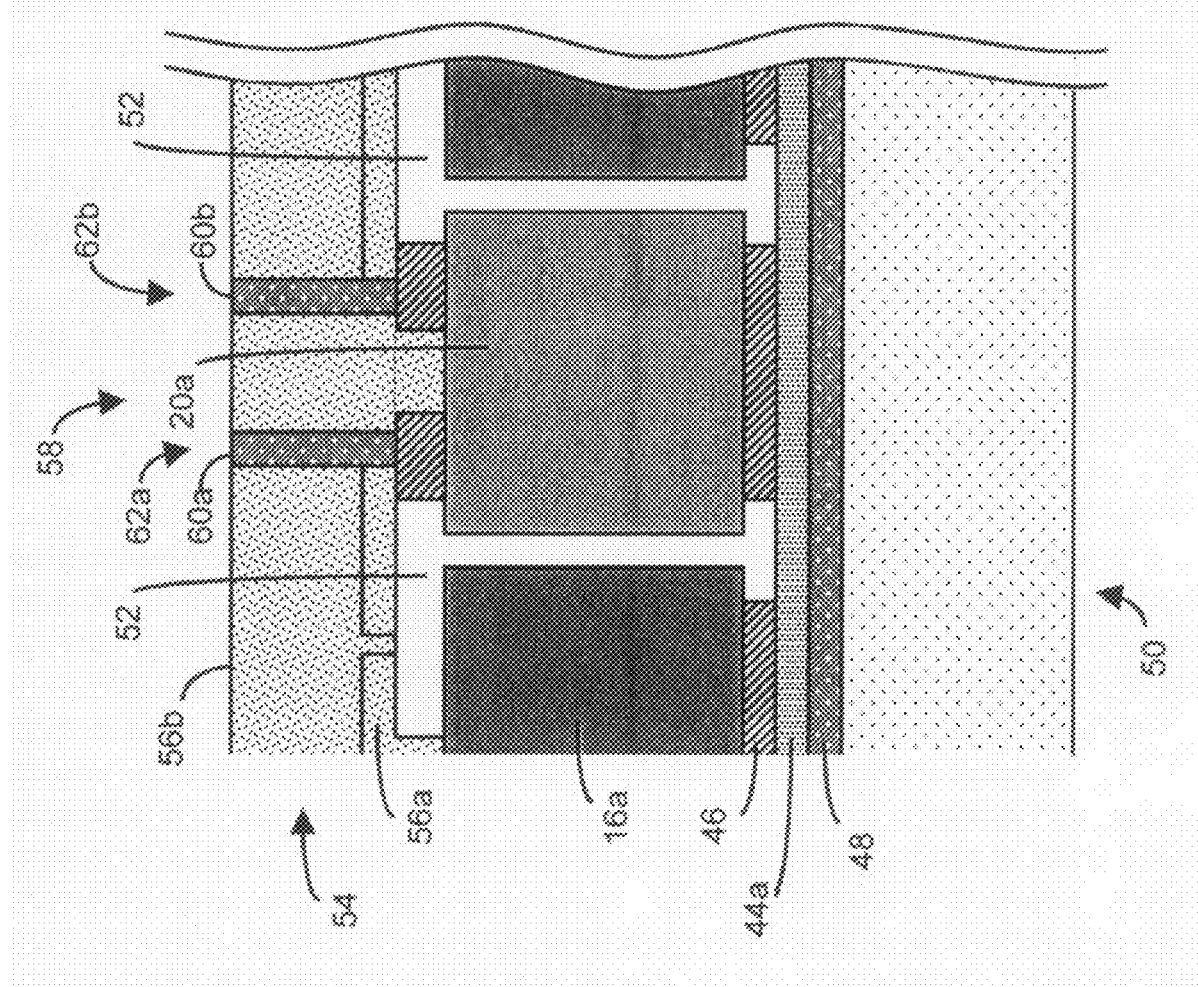

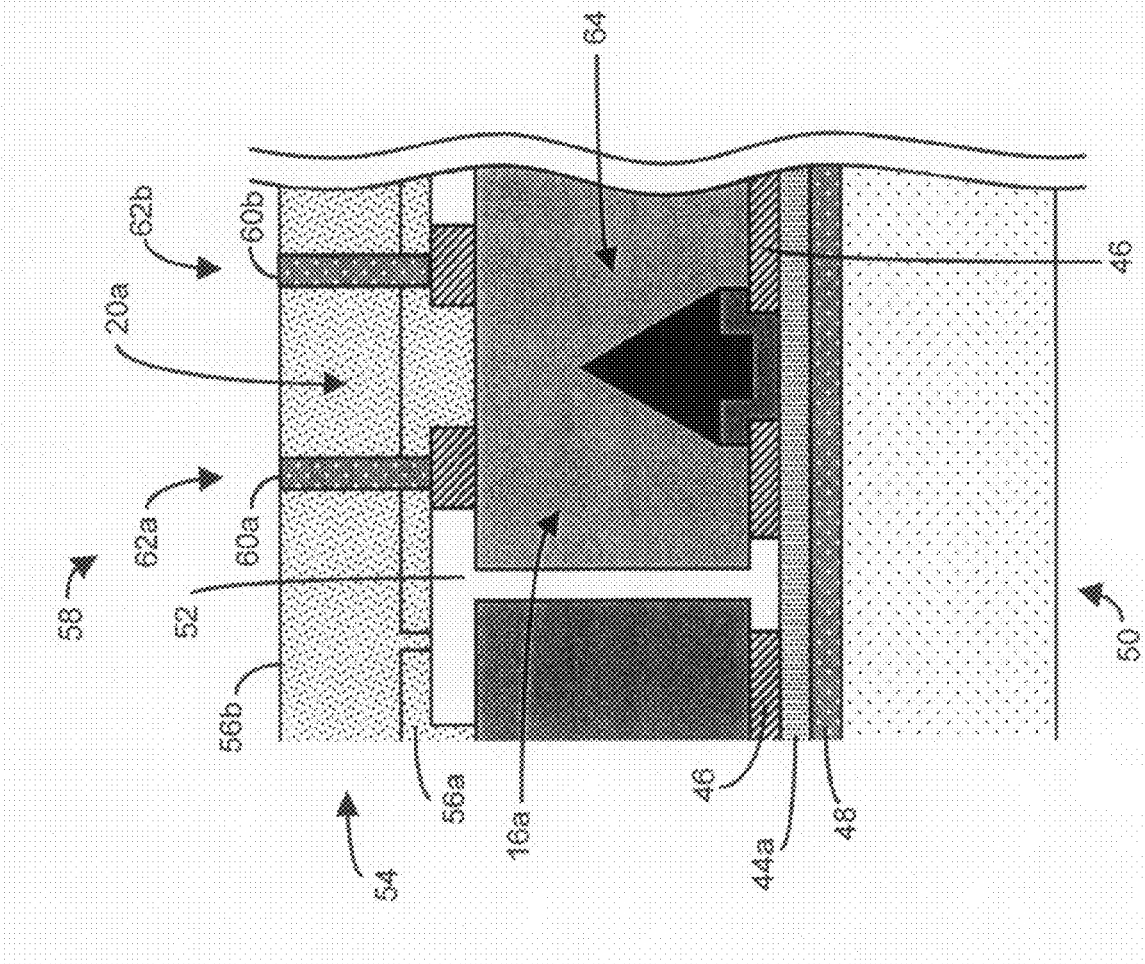

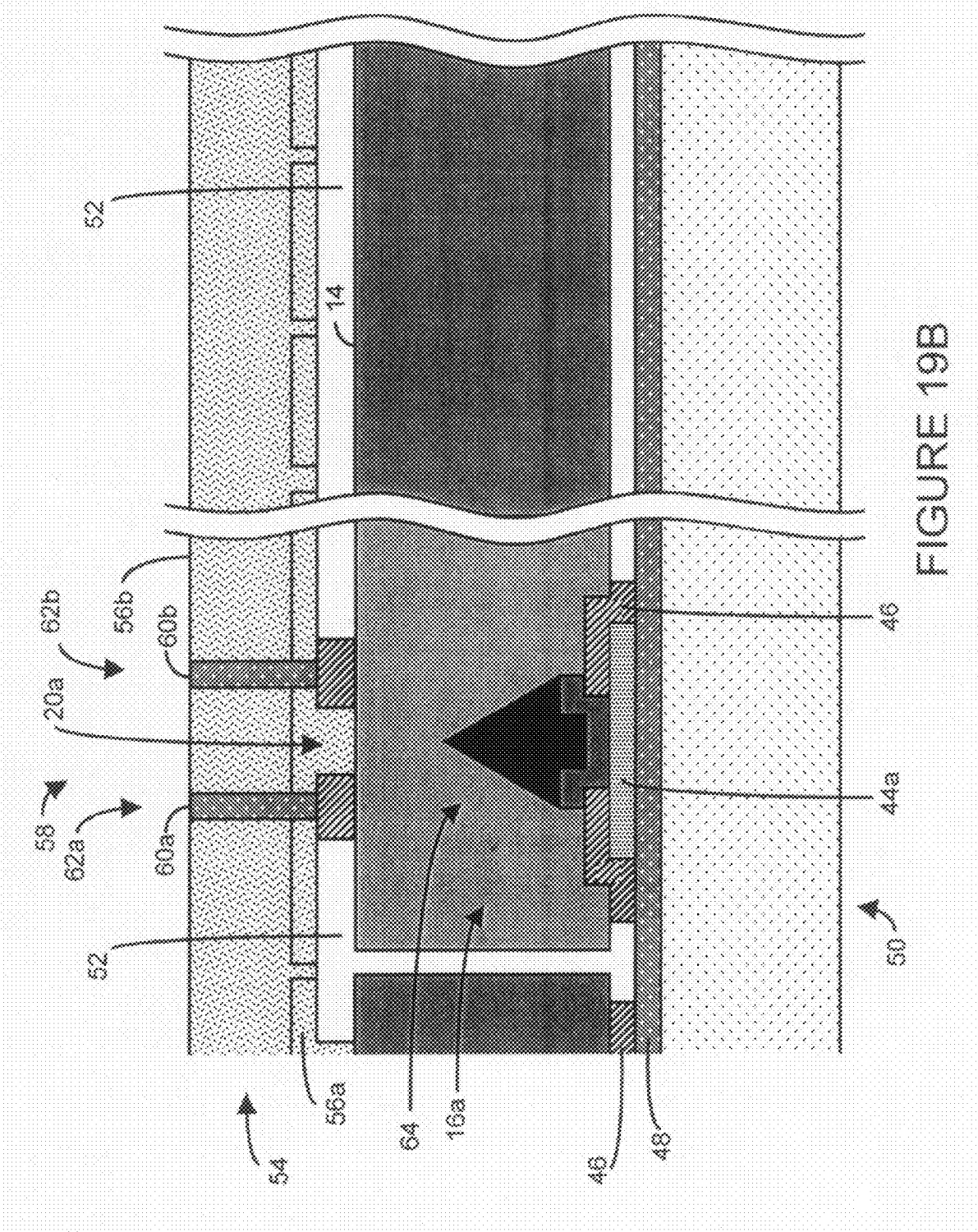

TEMPERATURE CONTROLLED MEMS RESONATOR AND METHOD FOR CONTROLLING RESONATOR FREQUENCY

CROSS-REFERENCE TO RELATED APPLICATIONS

This application is a Continuation Application of prior U.S. patent application Ser. No. 11/252,349, filed Oct. 17, 2005, now U.S. Pat. No. 7,268,646, which was a Divisional Application of U.S. patent application Ser. No. 10/794,976, filed Mar. 4, 2004, now U.S. Pat. No. 7,068,125, both of which are incorporated herein by reference in their entirety.

BACKGROUND

This invention relates to microelectromechanical systems and/or nanoelectromechanical systems (collectively hereinafter "microelectromechanical systems") and techniques for fabricating microelectromechanical systems; and more particularly, in one aspect, for fabricating, manufacturing, providing and/or controlling microelectromechanical resonators having mechanical structures that include integrated heating and/or temperature sensing elements; and in another aspect for fabricating, manufacturing, providing and/or controlling microelectromechanical resonators having mechanical structures that are encapsulated using thin film or wafer level encapsulation techniques in a chamber, and include heating and/or temperature sensing elements disposed in the chamber, on the chamber and/or integrated within the mechanical structures.

Many conventional micromechanical structures are based on the reaction (for example, oscillation, deflection or torsion) of a beam structure to an applied force. Such beam structures are fabricated from monocrystalline or polycrystalline semiconductors, such as silicon. These materials have excellent mechanical strength and a high intrinsic quality factor. Furthermore, the formation and processing of silicon-based materials are well-developed fields of endeavor.

For example, using polycrystalline silicon, one may design micromechanical resonators having great flexibility in geometry. Such resonators typically rely upon the bending beam and lateral oscillating beam structures. Notably, the beam structures are often rectangular in shape and/or cross section.

The mechanical stiffness, $k_M$, of a beam, as calculated with respect to the oscillation direction parallel to the width of the beam (w), is proportional to its Young's modulus (E) and certain measures of its geometry, including for a beam with a rectangular cross section, length (L) and height (h).

$$k_M \approx \frac{E \cdot h \cdot w^3}{L^3} \qquad \text{EQUATION 1}$$

As is well understood, the Young's modulus for most materials of interest changes with temperature according to known thermal coefficients ($\alpha_E$). For example, the Young's modulus of polysilicon has a thermal coefficient of approximately 30 ppm/K°. Furthermore, the geometry of a beam structure also changes with temperature, generally expanding with increasing in temperature. Again, as an example, polysilicon has a thermal expansion coefficient ($\alpha_{exp}$) of approximately 2.5 ppm/K°.

For some beam designs and related modeling purposes (given a material with an isotropic thermal coefficient), the effect of thermal expansion on the width of the beam is essentially offset by the effect of thermal expansion on the length of the beam, thus resulting in a remaining linear effect on the height of the beam.

Setting aside electrostatic forces, the resonance frequency (f) of a beam may thus be defined under these assumptions by the equation:

$$f \approx \frac{1}{2 \cdot \pi} \cdot \sqrt{\frac{k_M}{m_{\it{eff}}}} \qquad \text{EQUATION 2}$$

where $m_{\it{eff}}$ is the effective mass of the beam, which is constant over temperature.

Given the critical nature of a beam's resonance frequency to the overall performance of the resonator, it should remain relatively stable over a range of operating temperatures. In view of the relationship set forth in EQUATION 2, the frequency of the resonator will remain constant if the mechanical stiffness remains constant. This, however, will not normally be the case as thermally induced changes to the Young's modulus tend to change the mechanical stiffness of the beam.

There have been many attempts to address the issue of resonant beam frequency stabilization in the presence of a changing operating temperature. See, for example, Wan-Thai Hsu, "Stiffness-Compensated Temperature Insensitive Micromechanical Resonators", MEMS 2002 (0-7803-7185-2/02, 2002 IEEE) and Wan-Thai Hsu et al., "Mechanically Temperature-Compensated Flexural-Mode Micromechanical Resonators", IEDM 00-399 (0-7803-6438-4/00, 2000 IEEE) (hereinafter, "the Mechanically Temperature-Compensated Resonators reference"). Such approaches focus on compensating changes in vertical oscillation, prescribe the remedial use of gold or similar materials that are incompatible with CMOS integration, and/or propose techniques that employ significant power consumption.

For example, in the Mechanically Temperature-Compensated Resonators reference, it is proposed to employ an undulating heating element disposed beneath the entire micromechanical resonator. Such a configuration, and, in particular, the heating element, may, among other things, consume a significant amount of power because of the large heat loss to the surroundings/environment. In addition, such a configuration employs unfocused or non-specific heating of the entire micromechanical resonator. (See, FIG. 1 of the Mechanically Temperature-Compensated Resonators reference).

Thus, there is a need for a micromechanical resonator whose output frequency is relatively stable over an operating range of temperatures and that overcomes one, some or all of the shortcomings of conventional resonators. There is a need for a micromechanical resonator that compensates for, and/or addresses, minimizes and/or eliminates the adverse affects of variations in operating temperature by employing focused or specific heating of critical aspects of micromechanical resonator.

Moreover, there is a need for an efficient compensation technique for frequency stability of micromechanical resonators over an operating temperature range that overcome one, some or all of the shortcomings of conventional resonators. Notably, it may be advantageous if such a technique does not rely on the incorporation of materials that are incompatible with CMOS integration.

SUMMARY OF THE INVENTION

There are many inventions described and illustrated herein. In a first principal aspect, the present invention is a MEMS resonator having a resonant frequency that is defined in relation to an operating temperature. The MEMS resonator includes a first substrate anchor, including a first electrical contact, and a second substrate anchor, including a second electrical contact. A beam structure (for example, comprised of a conducting or semi-conducting material) is disposed between the first and the second substrate anchors (for example, fixed) and is electrically coupled to the first and the second electrical contacts.

The MEMS resonator of this aspect of the invention also includes an electrical source, coupled to the first and second electrical contacts, to provide an electrical current to the beam structure and thereby heat the beam structure. The electrical source may be adapted to provide an electrical current to either the first or second electrical contacts.

In one embodiment, the MEMS resonator may further include a temperature sensor, placed in proximity to the beam structure, to measure temperature and control circuitry, coupled to the temperature sensor, to generate control information and provide the control information to the electrical source to maintain the beam structure at the operating temperature. The control circuitry, in response to temperature data measured by the temperature sensor, may generate the control information using a mathematical relationship or data contained in a look-up table.

The beam structure may include one or more oscillating beams and/or oscillating masses. Moreover the beam structure may include a plurality of moveable beams disposed between the first and second substrate anchors.

The first and second substrate anchors may include a composite structure formed from a plurality of materials, wherein at least two of the materials in the plurality of materials have different thermal expansion coefficients. Further, the beam structure may include a composite structure formed from a plurality of materials, wherein at least two of the materials in the plurality of materials have different thermal expansion coefficients.

In a second principal aspect, the present invention is a MEMS resonator that has a resonant frequency which is defined in relation to an operating temperature. The MEMS resonator includes first and second substrate anchors, each including electrical contacts, and a first beam, comprised of a conductive or semi-conductive material, which is electrically connected between the electrical contacts. The MEMS resonator also includes a first moveable beam having a first end that is thermally coupled to the first beam and an electrical source, coupled to the electrical contacts, to provide a controlled current to the first electrical contact and thereby heat the first beam.

The MEMS resonator of this aspect of the invention may also include third and fourth substrate anchors, each including electrical contacts, and a second beam, comprised of a conductive or semi-conductive material, electrically connected between the electrical contacts of the third and fourth substrate anchors. The first moveable beam includes a second end that is thermally coupled to the second beam. The electrical source is further coupled to the electrical contacts of third and fourth substrate anchors to provide a controlled current to the third electrical contact and thereby heat the second beam. Notably, the electrical source may include one or more electrical sources that are independently or dependently controlled.

The MEMS resonator may include temperature measurement circuitry to determine the resistance of the first moveable beam. In one embodiment, the temperature measurement circuitry applies an electrical signal (AC or DC voltage or AC or DC current) to the first moveable beam and measures the response to the electrical signal by the first moveable beam to determine information that is representative of the temperature of the first moveable beam.

The MEMS resonator may also include control circuitry, coupled to the temperature measurement circuitry, to generate control information and provide the control information to the electrical source to maintain the first moveable beam at a predetermined operating temperature. The control circuitry, in response to information which is representative of the temperature of the first moveable beam, generates the control information using a mathematical relationship or data contained in a look-up table.

The MEMS resonator may include a temperature sensor, disposed in proximity to the first moveable beam, to measure temperature and control circuitry, coupled to the temperature sensor, to generate control information and provide the control information to the electrical source to control the operating temperature of the first moveable beam. In one embodiment, the control circuitry, in response to temperature data measured by the temperature sensor, generates the control information using a mathematical relationship or data contained in a look-up table.

Notably, the first substrate anchor may be comprised of a composite structure formed from a plurality of materials, wherein at least two of the materials in the plurality of materials have different thermal expansion coefficients.

In one embodiment, the MEMS resonator also includes a first test contact electrically coupled to the first electrical contact and a second test contact electrically coupled to the second electrical contact. In this embodiment, temperature measurement circuitry, coupled to the first and second test contacts, may apply an electrical signal (AC or DC voltage or AC or DC current) thereto to determine information that is representative of the temperature of the first moveable beam.

In a third principal aspect, the present invention is a method of controlling the resonant frequency of a MEMS resonator, wherein the MEMS resonator includes a first substrate anchor comprising a first electrical contact, a second substrate anchor comprising a second electrical contact, and a beam structure (for example, an oscillating beam or multiple beam tuning fork structure) fixed at a first end by the first substrate anchor and at a second end by the second substrate anchor. The method comprising passing a heating current from the first electrical contact to the second electrical contact in order to heat the beam structure and adjusting the heating current in relation to an actual operating temperature for the beam structure.

The method of this aspect of the invention, in one embodiment, further includes measuring the actual operating temperature using a temperature sensor placed in proximity to the beam structure.

In a fourth principal aspect, the present invention is a method of controlling the resonant frequency of a MEMS resonator, wherein the MEMS resonator comprises a first substrate anchor comprising a first electrical contact, a second substrate anchor comprising a second electrical contact, and a beam structure fixed at a first end by the first substrate anchor and at a second end by the second substrate anchor. The method of this aspect of the invention comprises passing a heating current from the first electrical contact to the second electrical contact in order to maintain the beam structure at the operating temperature and adjusting the heating current in relation to a calculated resistance of the beam structure.

In one embodiment, the method may further comprise calculating the resistance of the beam structure by applying a measurement voltage across the first electrical contact to the second electrical contact and determining the resistance of the beam structure in relation to the measurement voltage. In another embodiment, the method may further comprise calculating the resistance of the beam structure by passing a measurement current from the first electrical contact to the second electrical contact and determining the resistance of the beam structure in relation to the measurement current.

In a fifth principal aspect, the present invention is a method of controlling the resonant frequency of a MEMS resonator at an operating temperature, wherein the MEMS resonator comprises a first substrate anchor fixed between first and second electrical contacts and a beam structure comprising a first end thermally coupled to the first substrate anchor. The method of this aspect of the invention comprises heating the first substrate anchor to the operating temperature and maintaining the operating temperature of the first substrate anchor in relation to a calculated resistance of the first substrate anchor.

Notably, in one embodiment, maintaining the operating temperature of the first substrate anchor includes applying a measurement voltage across the first and second electrical contacts and determining the resistance of the first substrate anchor in relation to the measurement voltage. Further, heating the first substrate anchor may include passing a first heating current from the first electrical contact to the second electrical contact.

In one embodiment, maintaining the operating temperature of the first substrate anchor includes passing a measurement current between first and second electrical contacts and determining the resistance of the first substrate anchor in relation to the measurement current.

The MEMS resonator may further comprise a second substrate anchor fixed between third and fourth electrical contacts, and wherein the beam structure further comprises a second end thermally coupled to the second substrate anchor. In this regard, the method may include heating the second substrate anchor to the operating temperature by passing a second heating current from the third electrical contact to the fourth electrical contact and maintaining the operating temperature of at least one of the first and second substrate anchors in relation to a calculated resistance of the beam structure.

Notably, in one embodiment, maintaining the operating temperature of the first substrate anchor includes applying a measurement voltage across the first and second electrical contacts and another electrical contact selected from the third and fourth electrical contacts. Thereafter, the resistance of the beam structure may be determined in relation to the measurement voltage.

Alternatively, maintaining the operating temperature of the first substrate anchor includes applying a measurement current between one electrical contact selected from the first and second electrical contacts and another electrical contact selected from the third and fourth electrical contacts. Thereafter, the resistance of the beam structure may be determined in relation to the measurement current.

Again, there are many inventions described and illustrated herein. This Summary of the Invention is not exhaustive of the scope of the present invention. Moreover, this Summary is not intended to be limiting of the invention and should not be interpreted in that manner. While certain embodiments, features, attributes and advantages of the inventions have been described in this Summary, it should be understood that many others, as well as different and/or similar embodiments, features, attributes and/or advantages of the present inventions, which are apparent from the description, illustrations and claims, which follow.

BRIEF DESCRIPTION OF THE DRAWINGS

In the course of the detailed description to follow, reference will be made to the attached drawings. These drawings show different aspects of the present invention and, where appropriate, reference numerals illustrating like structures, components, materials and/or elements in different figures are labeled similarly. It is understood that various combinations of the structures, components, materials and/or elements, other than those specifically shown, are contemplated and are within the scope of the present invention.

FIGS. 3A and 3B illustrate cross-sectional views of the resonator of FIG. 2, sectioned along dotted lines A-A' and B-B', respectively, wherein the moveable beam is comprised of a plurality of materials and/or doping having a distinct integrated heating element disposed in or on the beam;

FIG. 9 illustrates a top view of a resonator, having two oscillating beams that are configured in a cantilever, tuning fork beam structure, according to another embodiment of the present invention;

FIGS. 12A and 12B illustrate top view of a resonator having anchor(s) that consist of a plurality of materials having, for example, different thermal expansion coefficients of expansion, according to another embodiment of the present invention;

FIGS. 12C and 12D illustrate cross-sectional views of the embodiment of FIG. 12B, sectioned along dotted lines A-A' and B-B', respectively, wherein the beam consisting of a plurality of materials having, for example, different thermal expansion coefficients of expansion, according to another embodiment of the present invention;

FIGS. 14A and 14B illustrate cross-sectional views of the resonator of FIG. 13, sectioned along dotted lines A-A' and B-B', respectively;

FIGS. 19A and 19B illustrate cross-sectional views of the resonator of FIG. 13, sectioned along dotted lines A-A' and B-B', respectively, wherein the heating element is disposed beneath the anchors of the resonator and the anchors are formed using techniques that are different than the anchors of FIGS. 14A and 14B;

DETAILED DESCRIPTION

There are many inventions described and illustrated herein. In a first aspect, the present invention is directed to a microelectromechanical resonator and method of fabricating, manufacturing and/or controlling a microelectromechanical resonator having mechanical structures that include integrated heating and/or temperature sensing elements. In this regard, in one embodiment, the mechanical structure is configured, in conjunction with the heating circuitry, to integrate the heating element within the moveable beam(s) such that a constant temperature and/or relatively constant temperature (for example, ±5%, and preferable less than 1%) exists over the length of the moveable beam. In this regard, the heating element is, or incorporated into, the moveable beam(s) is resistively heated by a heating current (I) flowing within, in and/or on the moveable beam(s).

Figure 1:
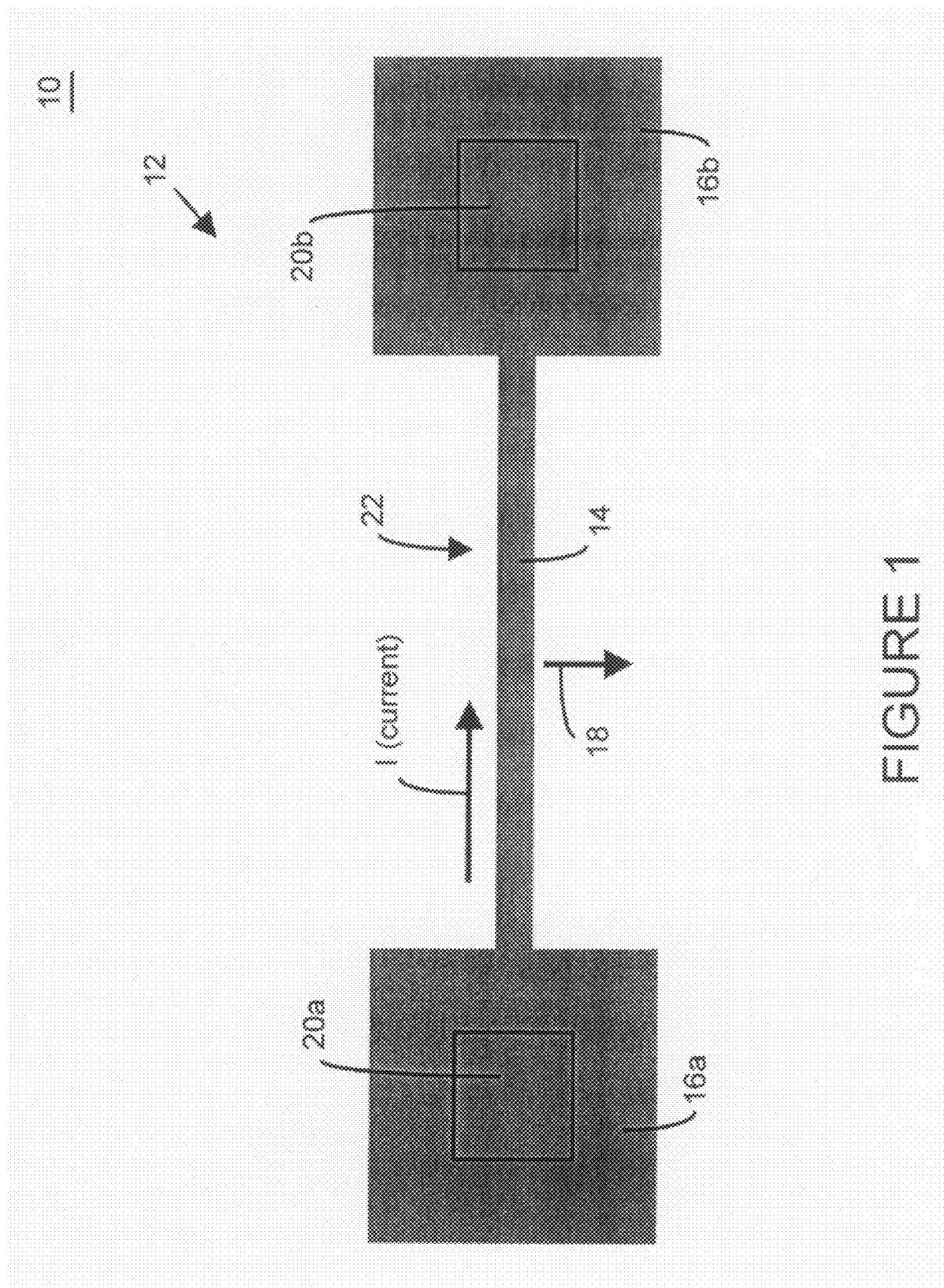
FIG. 1 illustrates a top view of a resonator, having a single oscillating beam, according to one embodiment of a first aspect of the present invention.

With reference to FIG. 1, in a first embodiment of this aspect of the present invention, MEMS resonator 10 includes mechanical structure 12 having moveable beam 14 disposed between anchors 16a and 16b. The moveable beam 14, in this embodiment, is comprised of a material that includes a resistance in the presence of an electrical current such as a conducting material (for example, a metal material) or semiconducting material (for example, silicon and/or germanium). Notably, the direction of oscillation is indicated as arrow 18.

The MEMS resonator 10 further includes electrical contacts 20a and 20b. The electrical contacts 20a and 20b, in this embodiment, are connected to an electrical source (not illustrated) that provides an electrical current. For example, in one embodiment, electrical contact 20a is connected to the electrical source and electrical contact 20b is connected to a common and/or ground potential. In another embodiment, electrical contacts 20a and 20b are connected between terminals and/or contacts of the electrical source.

Notably, electrical contacts 20a and 20b may be comprised of a conducting material (for example, a metal material such as aluminum) or semi-conducting material (for example, silicon, germanium, and/or impurity doped versions thereof). It may be advantageous to employ a material that has a relatively low resistivity and is suitable for, or compatible with, additional processing, for example, CMOS integration.

The electrical source (not illustrated) provides an electrical current that flows through moveable beam 14 and between electrical contacts 20a and 20b. In operation, an electrical current flows through moveable beam 14, which is resistively heated. For example, where a higher voltage is applied to electrical contact 20a and a lower voltage is applied to (or exists at) electrical contact 20b, the electrical current (as conventionally designated) flows from electrical contact 20a to electrical contact 20b, as illustrated in FIG. 1. Notably, in this embodiment, moveable beam 14 is also heating element 22.

Briefly, by way of background, an element having an electrical resistance (R) will convert electrical energy to thermal energy when an electrical current (I) is passed through the resistive element. In the context of the present invention, the power (P) dissipated in the form of heat by means of the resistive heating arising from application of a heating current (I) to the electrical resistance inherent in the beam structure may be characterized by the following equation:

$$P_{heat} = I^2 \cdot R_{beam} \quad \text{EQUATION 3}$$

As such, heating current (I) flowing between electrical contacts 20a and 20b generates resistive heating in moveable beam 14. This resistive heating process may be accurately controlled, as described in detail below, to provide a stable or constant (or substantially constant) operating temperature for moveable beam 14. Thus, MEMS resonator 10 of this aspect of the present invention enhances and/or maintains output frequency stability over a range of ambient temperatures by integrating the heating element within the moveable beam such that moveable beam 14 is heated to, and maintained at a predetermined, selected and/or defined operating temperature. The MEMS resonator 10 of this aspect of the present invention provides a predetermined, selected and/or defined output frequency over a range of ambient temperatures.

Notably, "operating temperature" may mean any temperature identified by a MEMS designer in relation to operation of a beam structure. For example, the selection of a desired resonant frequency for a beam structure may be characterized as a function of many physical characteristics associated with the beam structure, including, for example, absolute and/or relative lengths, widths, masses and/or material compositions. The resonant frequency is also a function of an operating temperature for the beam structure, due to the change of the Young's Modulo over temperature or the induced mechanical stress (for example, tension) due to the thermal expansion coefficient of the used materials (as described above).

Accordingly, a resonant frequency for a given geometry of mechanical structure 12 of MEMS resonator 10 includes an associated predetermined, selected and/or defined operating temperature or predetermined, selected and/or defined range of operating temperatures. Typically, the resonant frequency is intended to be stable or constant (or substantially constant) over a range of ambient temperatures.

Notably, although anchors 16 are illustrated as free-standing and square-shaped, any anchor structure may be employed which secures the mechanical structure 12 to, for example, the substrate. That is, anchors 16 may be directly attached to the substrate or fixed in relation to a substrate through intervening/overlaying layer(s) or structure(s). Indeed, anchors 16 may employ any form of anchoring techniques, whether now known or later developed. For example, the present invention may employ the anchoring techniques described and illustrated in non-provisional patent application entitled "Anchors for Microelectromechanical Systems Having an SOI Substrate, and Method for Fabricating Same", which was filed on Jul. 25, 2003 and assigned Ser. No. 10/627, 237 (hereinafter "Anchors for Microelectromechanical Systems patent application"). In this regard, any and all of the embodiments of MEMS resonator 10 according to the present inventions may be anchored, for example, to a substrate, using the anchors (and anchoring techniques) as described and illustrated in Anchors for Microelectromechanical Systems Patent Application. For the sake of brevity, the anchoring techniques of Anchors for Microelectromechanical Systems patent application, implemented in conjunction with the inventions described and illustrated herein, will not be repeated in detail. It is expressly noted, however, that the entire contents of the Anchors for Microelectromechanical Systems patent application, including, for example, the features, attributes, alternatives, materials, techniques and advantages of all of the embodiments and/or inventions, are incorporated by reference herein.

Figure 2:
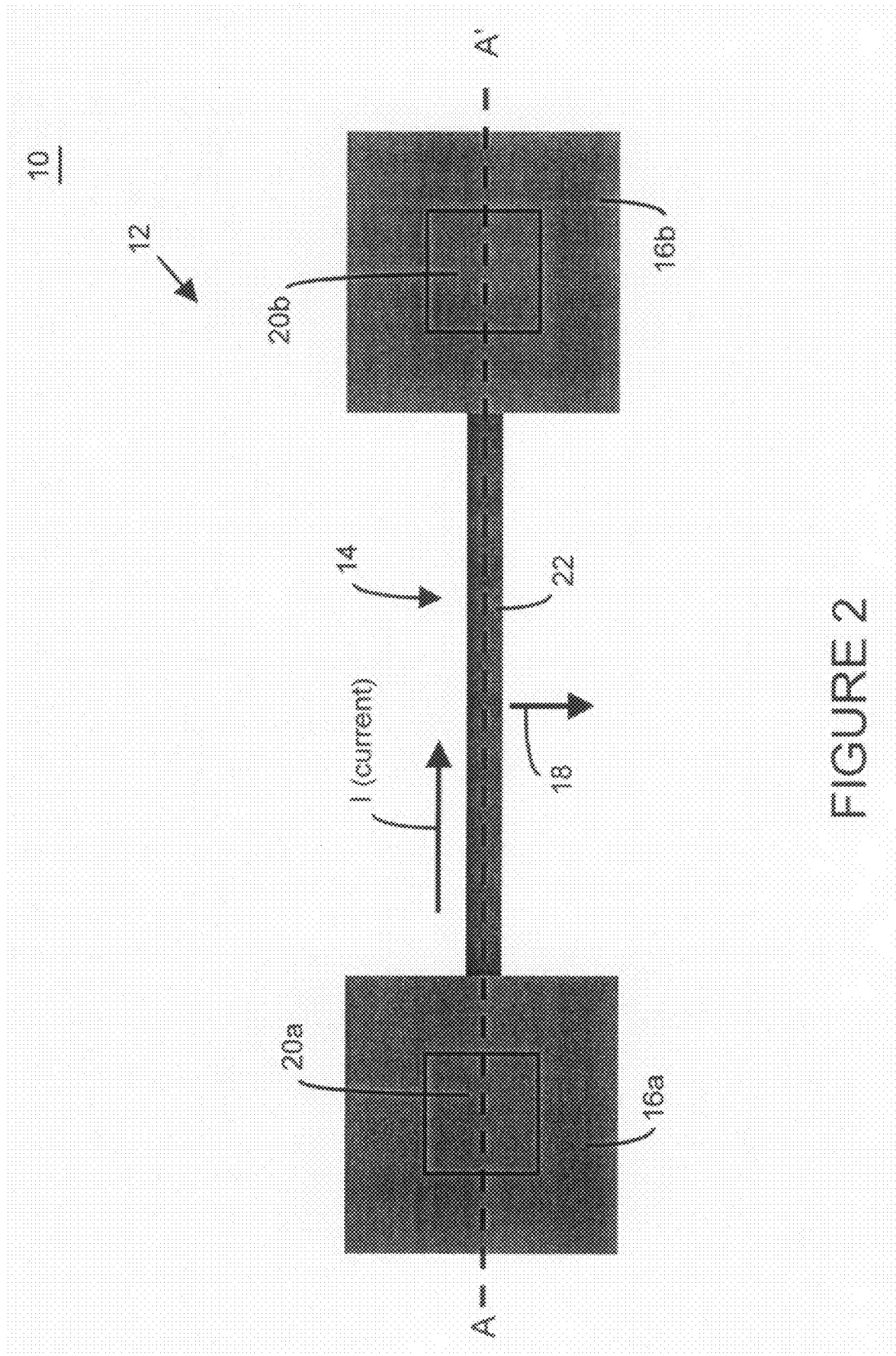
FIG. 2 illustrates a top view of a resonator, having a single oscillating beam including a distinct heating element disposed therein or thereon, according to one embodiment of a first aspect of the present invention.
Figure 3A:
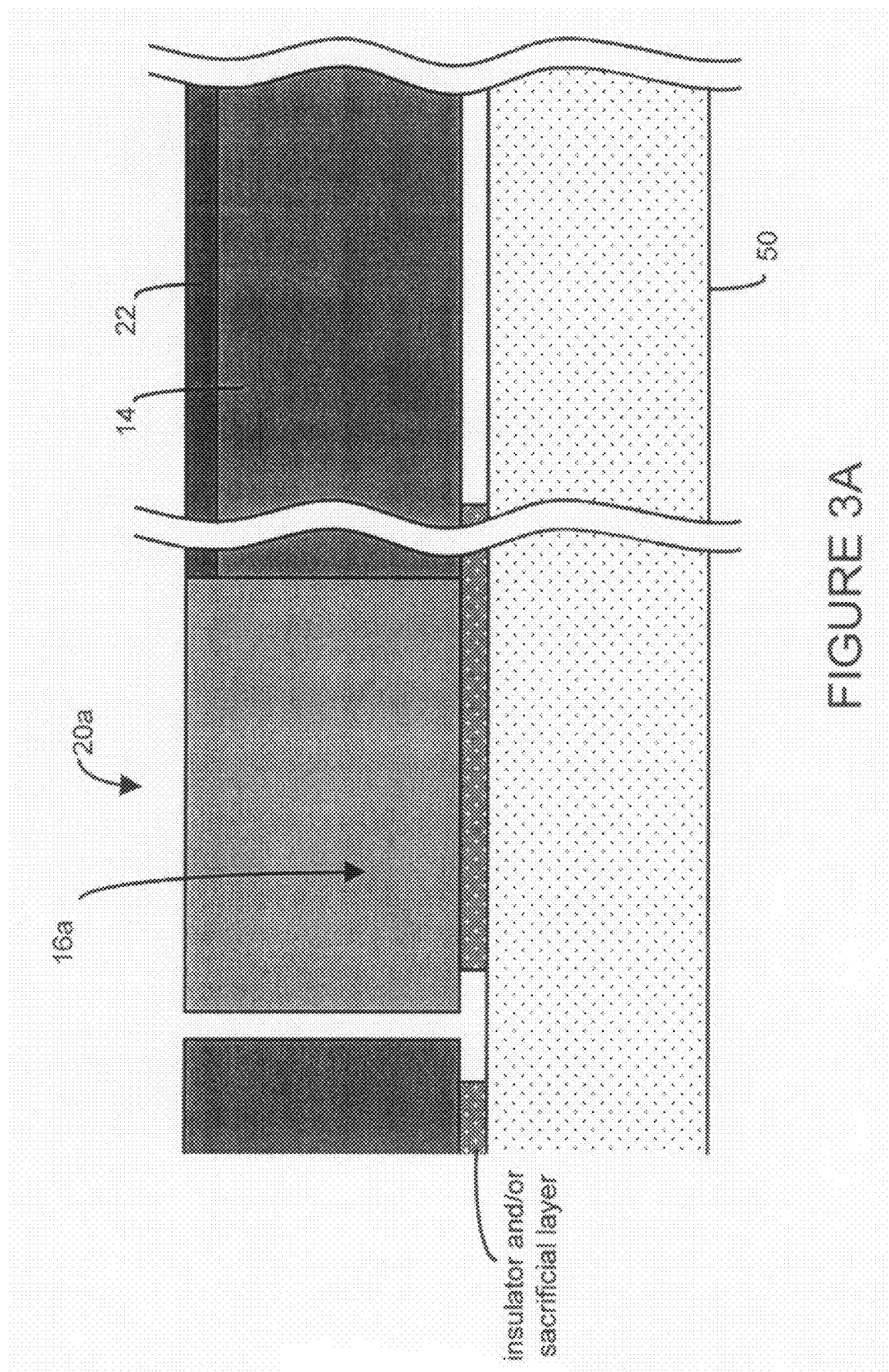

With reference to FIGS. 2 and 3A, in another embodiment, heating element 22 may be disposed in and/or on moveable beam 14. For example, heating element 22 may be formed in moveable beam 14 via doping with impurities having the same or an opposite conductivity relative to the impurities (if any) within moveable beam 14. That is, for example, moveable beam 14 may include n-type impurities (such as phosphorous) and heating element 22 may be formed and/or created in or on moveable beam 14 by doping selected regions of moveable beam 14 with additional n-type impurities. In this way, a substantial portion of the electrical current will pass through heating element 22.

Alternatively, moveable beam 14 may be heavily counter-doped with P-type impurities (such as boron to create a p-type region) to form and/or create heating element 22. In this way, after formation of moveable beam 14 and through the use of selected voltages applied to moveable beam 14 and heating element 22, a reverse biased junction exists such that heating element 22 is electrically "isolated" from the remaining portion of moveable beam 14. Notably, the frequency of the output of MEMS resonator 10 depends on the characteristics of moveable beam 14 and heating element 22, for example, the physical characteristics such as the absolute and/or relative lengths, widths, masses and/or material compositions of moveable beam 14 and heating element 22.

Thus, the electrical source (not illustrated) provides an electrical current that flows through heating element 22 and between electrical contacts 20a and 20b. In certain embodiments, all or substantially all of the electrical current flows through heating element 22 because of the relative resistivities between moveable beam 14 and heating element 22. In response, heating element 22 is resistively heated. Because moveable beam 14 is in direct contact with heating element 22, moveable beam 14 is also heated.

Notably, there are many methods and techniques for fabricating heating element 22 on or in moveable beam 14. For example, the materials and/or layers of moveable beam 14 and heating element 22 may be deposited and thereafter, using well known lithographic and etching techniques, moveable beam 14 and heating element 22 may be formed from such materials and/or layers. All methods of fabricating moveable beam 14 and heating element 22, whether now known or later developed, are intended to be within the scope of the present invention.

Further, heating element 22 may have a predetermined lateral and/or vertical profile such that certain areas of moveable beam 14 may be heated differently from other areas. With reference to FIG. 3B, in one embodiment, the vertical doping profile in or on moveable beam 14 may provide different resistances along moveable beam 14. In the illustrative embodiment, heating element 22 includes a higher resistance near electrical contacts 20a and 20b and smaller resistance near the center of moveable beam 14. Accordingly, heating element 22 provides more heating near electrical contacts 20a and 20b and less heating near the center of moveable beam 14. That is, differing amounts of heating may be provided to predetermined and/or selected areas of moveable beam 14. In this way, heating element 22 may compensate for, minimize and/or eliminate any (anticipated and/or mathematically modeled) temperature gradient along moveable beam 14 as a result of the thermal conductivity of anchors 16a and 16b. The mechanical structure 12 of this embodiment may exhibit a more controlled, constant and/or substantially constant temperature over the entire length of moveable beam 14.

Figure 4A:
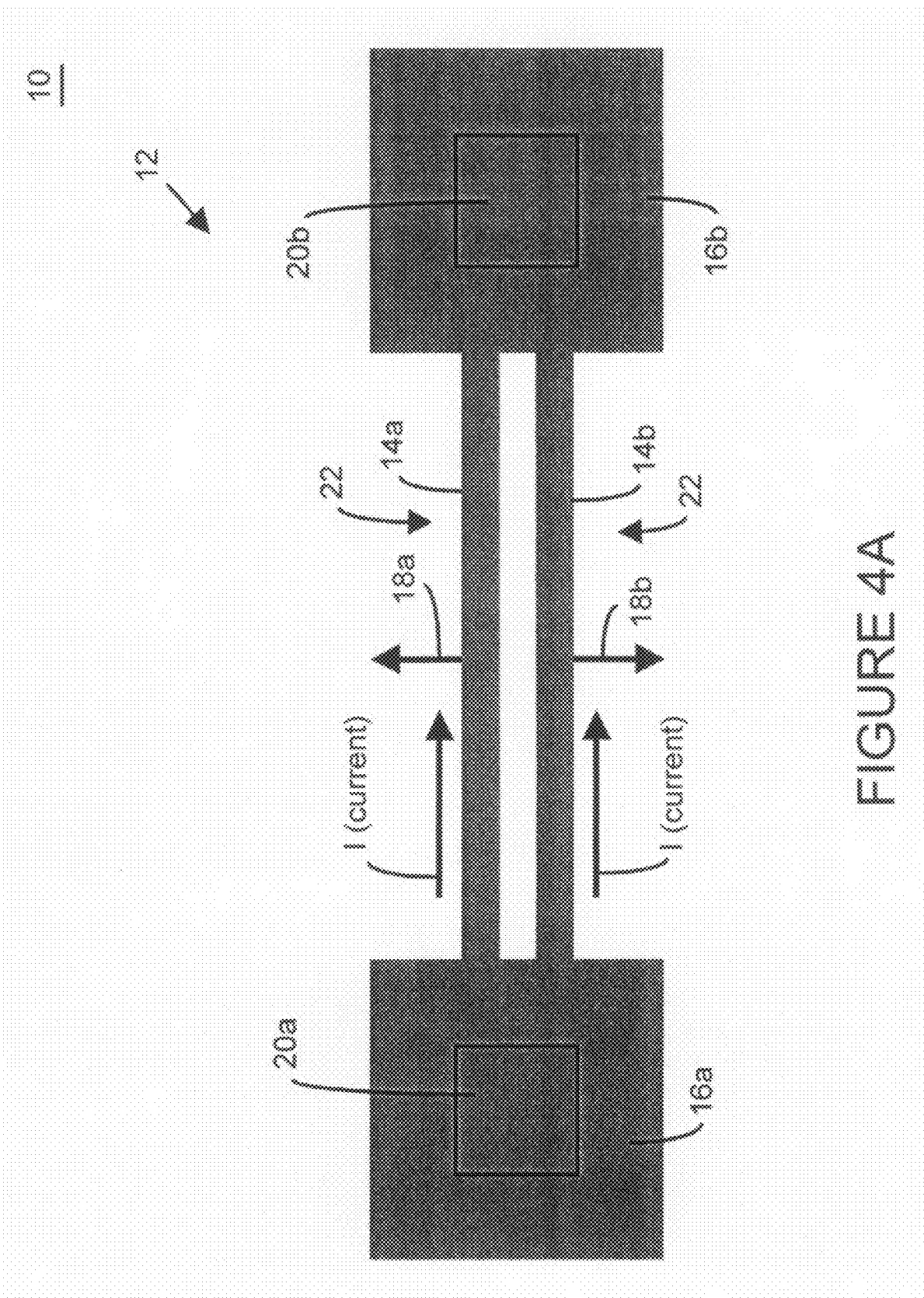
FIGS. 4A and 4B illustrate top views of a resonator, having two oscillating beams that are arranged in a tuning fork beam structure, according to another embodiment of a first aspect of the present invention.
Figure 4B:
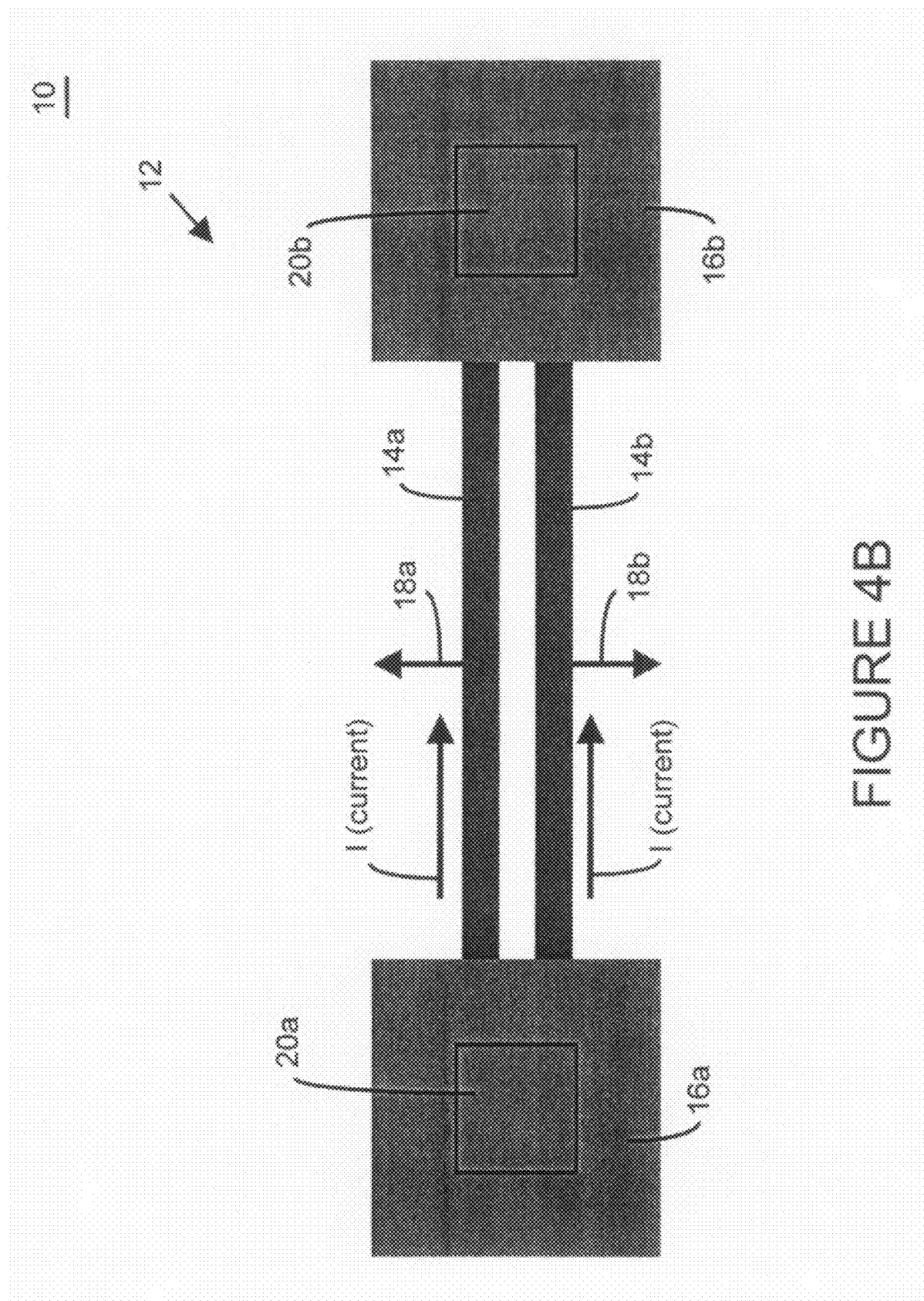

It should be noted that this aspect of the present invention may employ any configuration of mechanical structure 12 of MEMS resonator 10. For example, mechanical structure 12 may include a plurality of moveable beams and/or more than two anchors. In this regard, with reference to FIGS. 4A and 4B, mechanical structure 12 may include moveable beams 14a and 14b disposed between anchors 16a and 16b. The heating element 22 may be integral with moveable beams 14a and 14b (FIG. 4A) and/or may also be disposed on or in moveable beams 14a and 14b (FIG. 4B).

In those instances where heating element 22 is disposed in or on moveable beam 14, moveable beam 14 may or may not be comprised of conducting and/or semi-conducting materials. In this regard, (all, or a substantial portion on current is provided through heating element 22. As such, there may be no need for moveable beam 14 to be comprised of conducting and/or semi-conducting materials.

Figure 5:
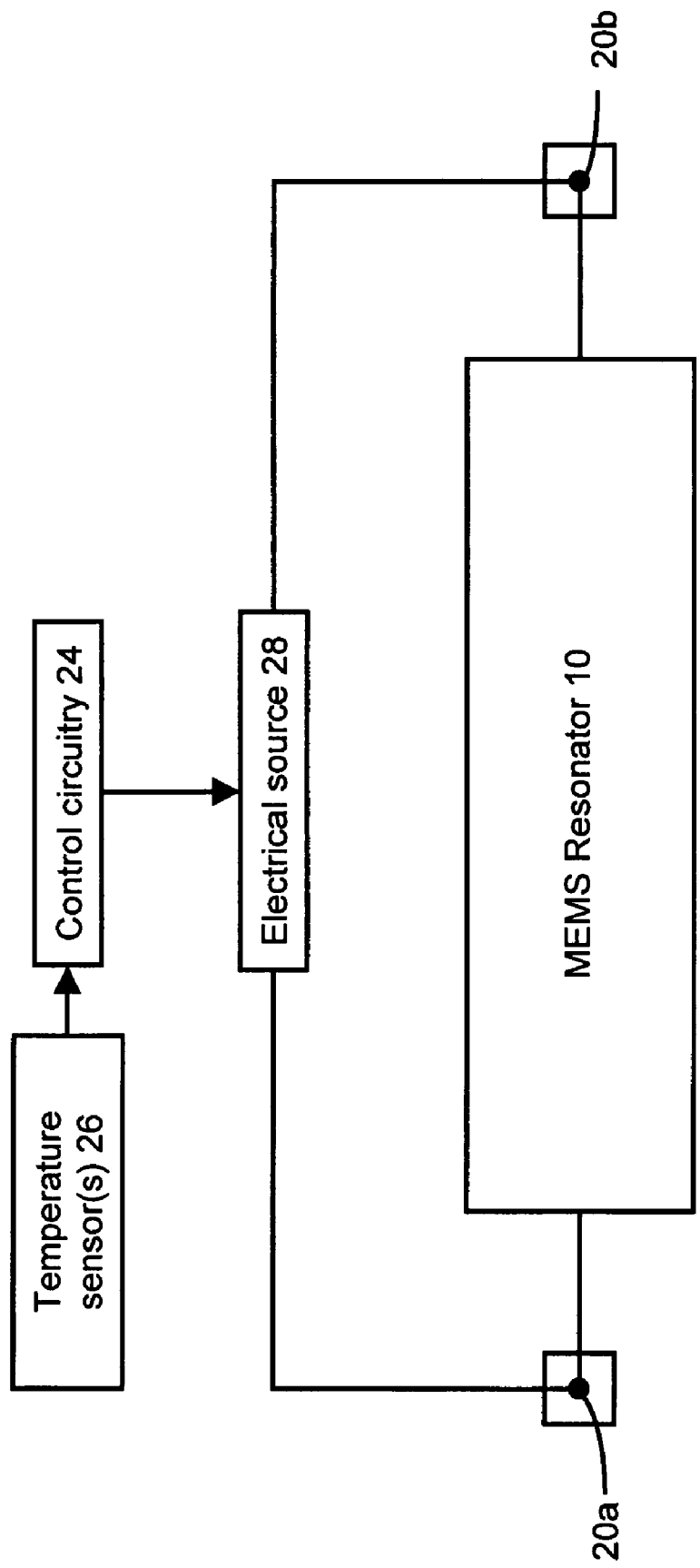
FIG. 5 is a schematic representation of an exemplary configuration, control circuitry, an electrical source and temperature sensors, for measuring and controlling the operating temperature of the MEMS resonator, according to the first aspect of the present invention.

With reference to FIG. 5, in one embodiment of this aspect of the invention, control circuitry 24 determines and/or calculates the electrical current required to maintain and/or control the operating temperature of mechanical structure 12 and, in turn, provide a predetermined, selected, desired and/or defined output frequency over, for example, a range of ambient temperatures. In one embodiment, the control circuitry 24 employs information/data from temperature sensors 26 (for example, diodes, transistors, resistors or varistors, and/or one or more MEMS temperature transducers which are disposed and/or located on or in the substrate of MEMS resonator 10) to appropriately control electrical source 28.

The temperature sensors 26 may be employed on and/or in close proximity to moveable beam 14 and/or anchor 20 to measure, sense and/or sample information of the actual temperature of moveable beam 14. The temperature sensors 26 provide information of the actual temperature of moveable beam 14 or region(s) in proximity to the moveable beam 14 to control circuitry 24. In this way, control circuitry 24 may determine, calculate and/or estimate the operating temperature of moveable beam 14 and, in response, control and/or instruct electrical source 28 to apply or provide a current through heating element 22 to thereby conductively heat moveable beam 14 via resistive heating. The control circuitry 24 compares the actual operating temperature to the predetermined, selected and/or desired operating temperature using one of a number of conventional feedback and/or control techniques, as discussed in more detail below.

Notably, other temperature sensing and operating temperature control techniques and/or configurations are described below. Moreover, as mentioned below, all temperature sensing and operating temperature control techniques and/or configurations, whether now known or later developed, including those discussed above, are intended to be within the scope of the present invention.

In a second aspect, the present invention is directed to a microelectromechanical resonator having an isothermal beam structure. In this aspect, the moveable beam of the microelectromechanical resonator of this aspect of the invention is arranged such that over the length of the moveable beam, there is a constant temperature and/or substantially constant temperature (for example, ±5%, and preferable less than 1%).

Figure 6:
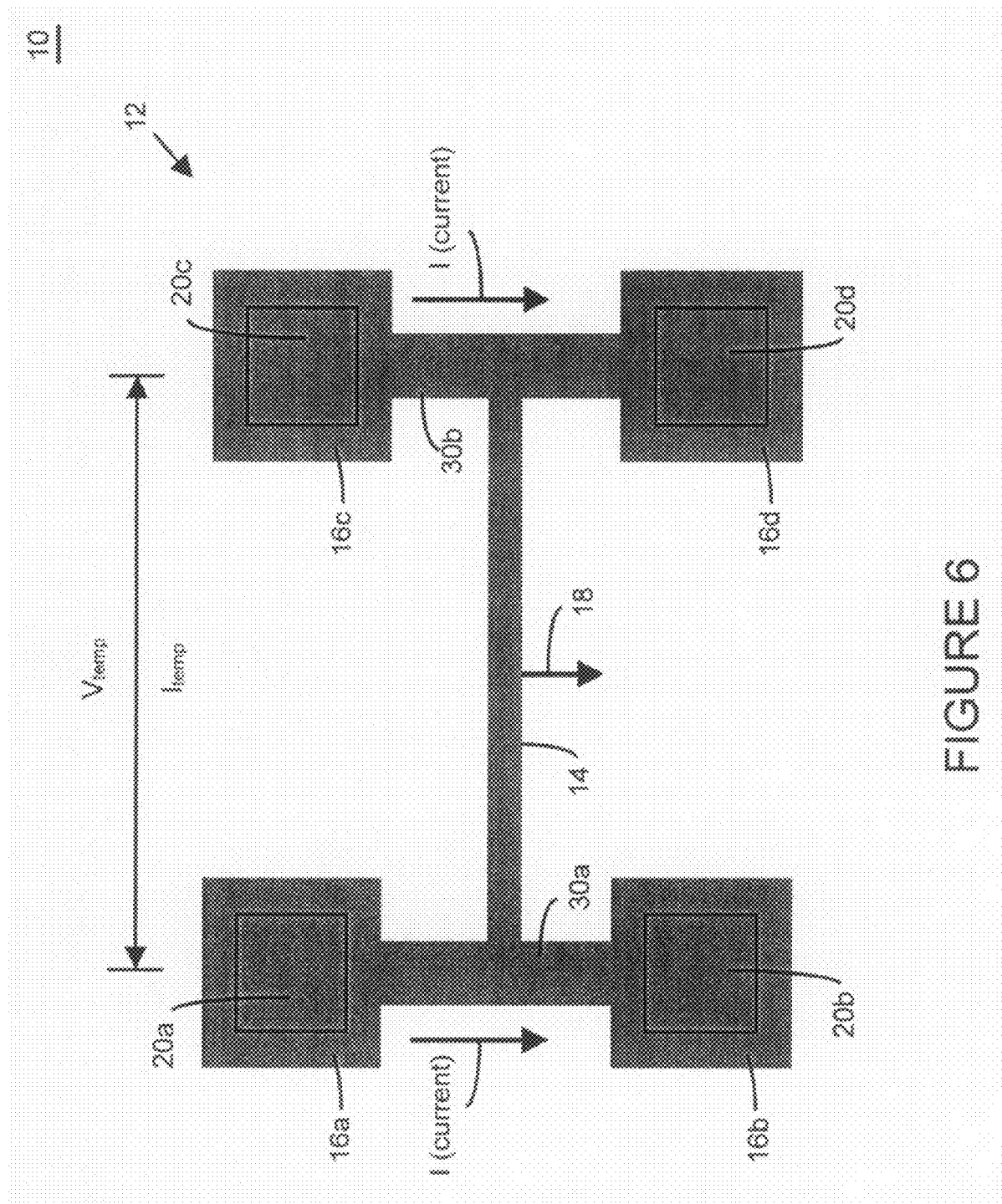
FIG. 6 illustrates a top view of a resonator, having a single oscillating beam that is arranged between four substrate anchors in a four point probe-like configuration, according to a first embodiment of a second aspect of the present invention.

With reference to FIG. 6, in a first embodiment of this aspect of the present invention, moveable beam 14 is conductively heated via heating anchors 16a-16d. The moveable beam 14 is affixed to beam 30a, which is disposed between anchors 16a and 16b. The moveable beam 14 is also affixed to beam 30b, which is disposed between anchors 16c and 16d. Each of anchors 16a-d includes an associated electrical contacts 20a-d, respectively. The electrical contacts are coupled to electrical source 28 (not illustrated) to provide an electrical current and/or voltage to electrical contacts 20a-d.

In operation, beam 30a is resistively heated by electrical current flowing therein, between electrical contacts 20a and 20b. Similarly, beam 30b is resistively heated by electrical current flowing therein, between electrical contacts 20c and 20d. The moveable beam 14 will be conductively heated by beams 30a and 30b. Moreover, moveable beam 14 will reach thermal equilibrium between these two heat sources. Indeed, in this embodiment, the temperature over the entire length of moveable beam 14 is constant or substantially constant (for example, no more than 5% difference over the length of beam 14, and preferable less than 1%).

Notably, conductive heating of moveable beam 14 and temperature stabilization of moveable beam 14 may be enhanced where mechanical structure 12 (and, in particular, moveable beam 14) is maintained in a vacuum. Further, the thermal conductivity ($\lambda$) of mechanical structure 12 may be expressed as:

$$\lambda = -q/(A \cdot dT/dx) \qquad \text{EQUATION 4}$$

where: q is a flux of heat in the anchor,
dT/dx describes a temperature gradient across the combination of substrate anchor and beam structure, and
A is the cross-sectional area of the beam structure.

This relationship is well understood and may be used to model the conductive heating of moveable beam 14.

Figure 7:
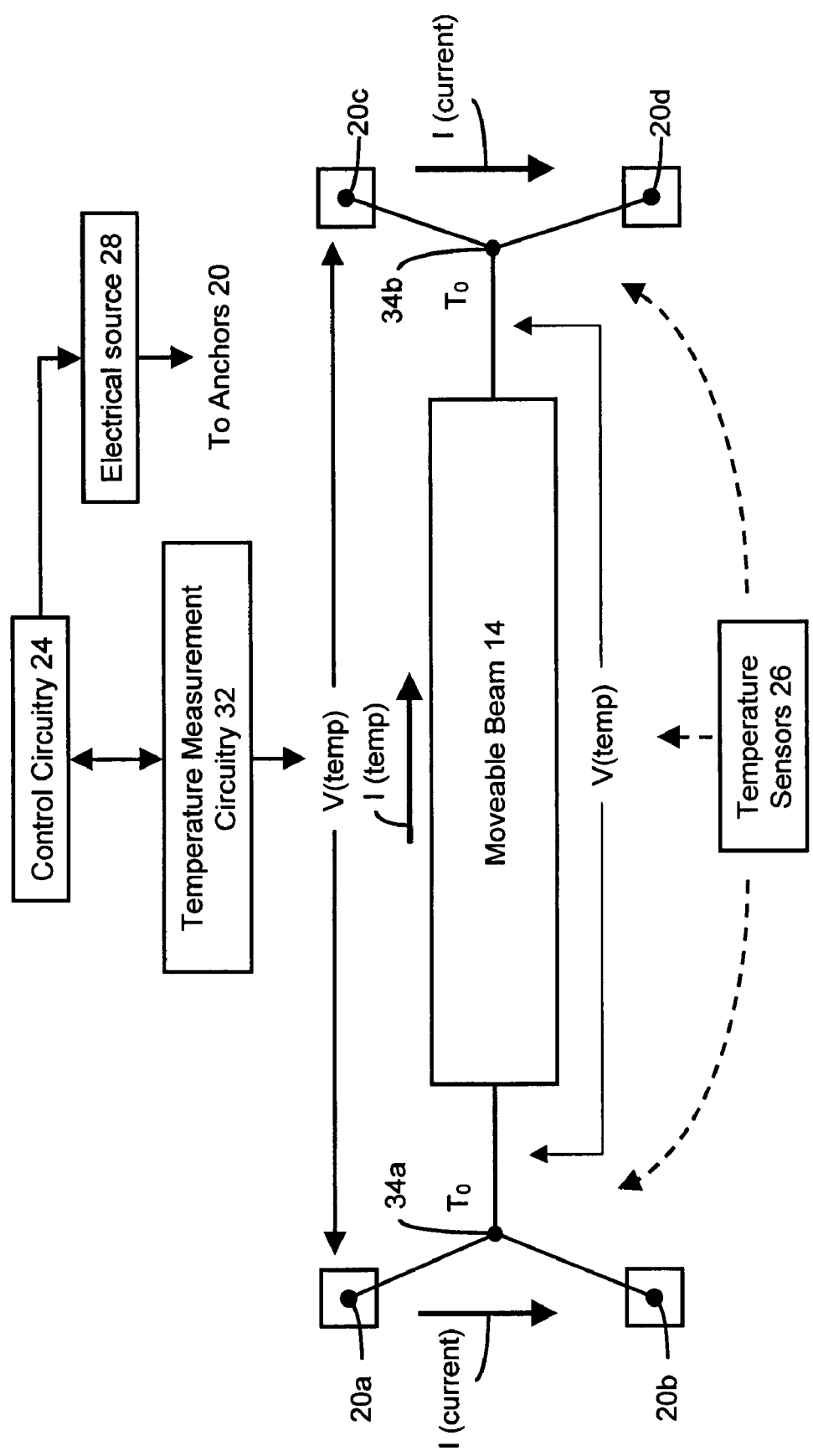
FIG. 7 is a schematic representation of exemplary configurations (including control circuitry, an electrical source, and temperature measurement circuitry and/or temperature sensors) for measuring and controlling the operating temperature of the beam structure of FIG. 6.

With reference to FIG. 7, the conductive heating of moveable beam 14 may be conceptually viewed as both ends of moveable beam 14 being maintained at the same operating temperature. That is, by design, moveable beam 14 is conductively heated by beams 30a and 30b until a predetermined, selected and/or desired operating temperature ($T_o$) is reached.

The operating temperature of moveable beam 14 may be determined using a number of approaches and/or techniques. For example, one or more temperature sensors 26 may be formed and placed in close proximity to the beam structure and/or an associated substrate anchor. The data which is representative of the actual temperature of moveable beam 14 and/or anchors 16 as measured by temperature sensors 26 is compared to a predetermined, selected and/or desired operating temperature using a conventional feedback technique.

In those instances where physical sensors that are incorporated in and around MEMS 10 do not provide precise and/or accurate data which is representative of the operating temperature of moveable beam 14 (because, for example, it may be costly and/or overly complex to locate temperature sensors 26 close to the desired thermally controlled beam), it may be advantageous to employ other temperature measuring techniques. For example, with continued reference to FIG. 7, temperature measurement circuitry 32 may be employed to generate a temperature measuring current ($I_{temp}$) which is passed through moveable beam 14. The measuring current (which may be an AC or DC current) induces a corresponding voltage difference across moveable beam 14. The temperature measurement circuitry 32 may measure, detect and/or sample the voltage difference between, for example, sense points 34a and 34b. This voltage difference ($V_{temp}$) will vary with the resistance of moveable beam 14 for a given measurement current and, as such, control circuitry 24 may determine and/or calculate the operating temperature of moveable beam 14.

Notably, the measuring current may be an AC or a DC current. Indeed, temperature measurement circuitry 32 may apply a measuring voltage (an AC or a DC voltage) in addition to or in lieu of a measuring current. The measuring current or voltage may be superimposed or modulated on the electrical current that heats beams 30a and/or 30b. Under this situation, temperature measurement circuitry 32 may sample, determine and/or detect the AC and/or DC component and thereby measure and/or sample information that is representation of the temperature of moveable beam 14.

The control circuitry 24 (in conjunction with temperature measurement circuitry 32) may periodically, intermittently and/or continuously sample, inspect, measure and/or evaluate the operating temperature of moveable beam 14 in order to detect, determine and/or predict a change in the output frequency of MEMS resonator 10. In this way, the control of the operating temperature of moveable beam 14 is enhanced. That is, by periodically, intermittently and/or continuously determining a resistance value of moveable beam 14 in relation to the temperature measuring current and/or temperature measuring voltage, and using the resistance value to calculate an approximate operating temperature, a temperature feedback technique and/or configuration is implemented.

The control circuitry 24 may use the data/information which is representative of the operating temperature of moveable beam 14 to control electrical source 28. In this regard, electrical source 28 may (dependently or independently) change and/or modify the currents applied through beams 30a and 30b and thereby adjust the operating temperature of moveable beam 14. Thus, in one embodiment, the beam structure resistance is used as a form of temperature feedback information. The temperature feedback information is used to control the heating currents applied to electrical contacts 20a-d.

Figure 8A:
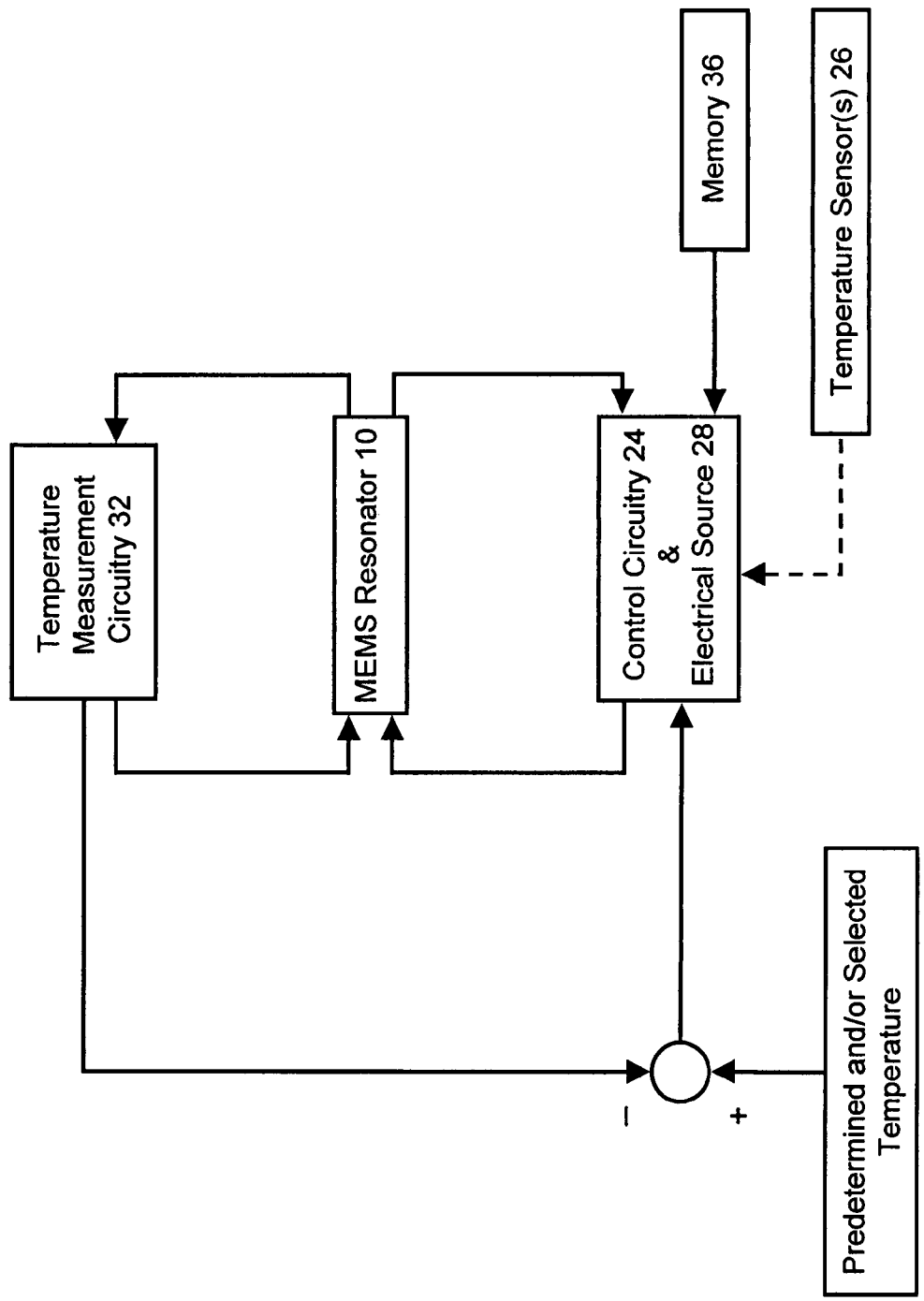
FIGS. 8A and 8B are schematic block diagram representations of exemplary configurations of electrical/electronic circuitry (including control circuitry, an electrical source, and temperature measurement circuitry and/or temperature sensors), in conjunction with a resonator, that measures, senses, samples and/or determines the operating temperature of the resonator and, in addition, adjusts, controls and/or modifies the operating temperature of the resonator of, for example, FIGS. 1, 2, 3, 4A, 4B and 6.
Figure 8B:
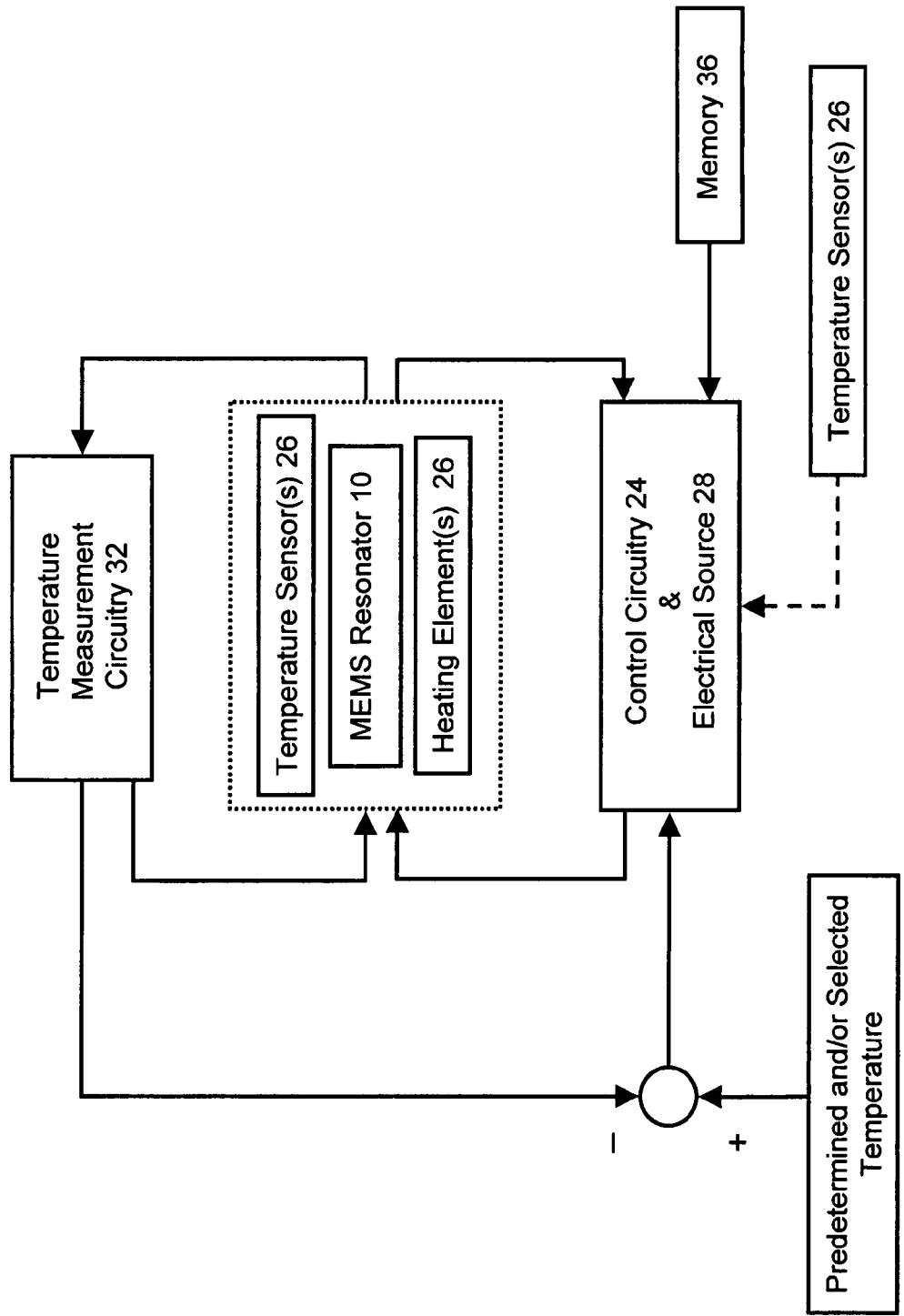

Notably, there are many techniques and/or configurations for detecting, sampling, measuring and/or evaluating the operating temperature of moveable beam 14. For example, with reference to FIGS. 8A and 8B, control circuitry 24 may employ a look-up table and/or a predetermined or mathematical relationship (either or both contained in memory 36) to adjust and/or control the heating of certain beam structures (for example, moveable beam 14) of MEMS resonator 10 to compensate and/or correct for changes in ambient temperature (i.e., the temperature of MEMS resonator 10). All techniques and/or configurations for detecting, sampling, measuring and/or evaluating the operating temperature of moveable beam 14, whether now known or later developed, including those discussed above, are intended to be within the scope of the present invention.

The temperature measuring and control techniques described above with respect to FIGS. 7, 8A and 8B may also be applied to any of the embodiments of any aspect of the inventions described and/or illustrated herein. For example, in the context of the first aspect of the invention, the resistance of moveable beam 14 (FIGS. 1, 2 3A and 3B) and moveable beams 14a and 14b (FIGS. 4A and 4B) may be periodically or intermittently measured by interrupting the flow of a heating current (I(current)) with the application of a temperature measuring current or voltage. Alternatively, the heating current may be employed as a temperature measuring current. Notably, with reference to FIGS. 4A and 4B, a temperature measuring current may be applied to either one of electrical contacts 16a or 16c through moveable beam 14a or 14b, respectively, to either one of electrical contacts 16b or 16d respectively.

The MEMS resonator 10 may employ any type of design and/or control of mechanical structure 12. For example, with reference to FIG. 9, mechanical structure 12 may be configured in a cantilever, tuning fork beam structure that includes moveable electrodes 14a and 14b, which are connected to beam 30. In operation, beam 30 is resistively heated, via heating current I(current), which, in turn, conductively heats moveable electrodes 14a and 14b.

The mechanical structure 12 illustrated in FIG. 9 may also be configured with additional electrical contacts to facilitate and enhance temperature measurements of moveable electrodes 14a and 14b. In this regard, with reference to FIG. 10, in one embodiment, MEMS resonator 10 may include measurement contacts 38a and 38b to facilitate sampling, measuring and/or detecting data which is representative of the temperature of moveable electrodes 14a and 14b. The measurement contacts 38a and 38b provide "test points" from which control circuitry 24 (not shown) and temperature measurement circuitry 32 (not shown) may periodically, intermittently and/or continuously sample, inspect, measure and/or evaluate the operating temperature of moveable beams 14a and 14b in order to detect, determine or predict a change in the output frequency of MEMS resonator 10 due to changes in operating temperature. Moreover, measurement contacts 38a and 38b enable such periodic, intermittent and/or continuous sampling, inspecting and/or measuring without interfering with the operation of MEMS resonator 10 in that measurement contacts 38a and 38b may be used, for example, to measure the measurement voltage, resistance, or current independent of electrical contacts 20a and 20b.

Figure 11:
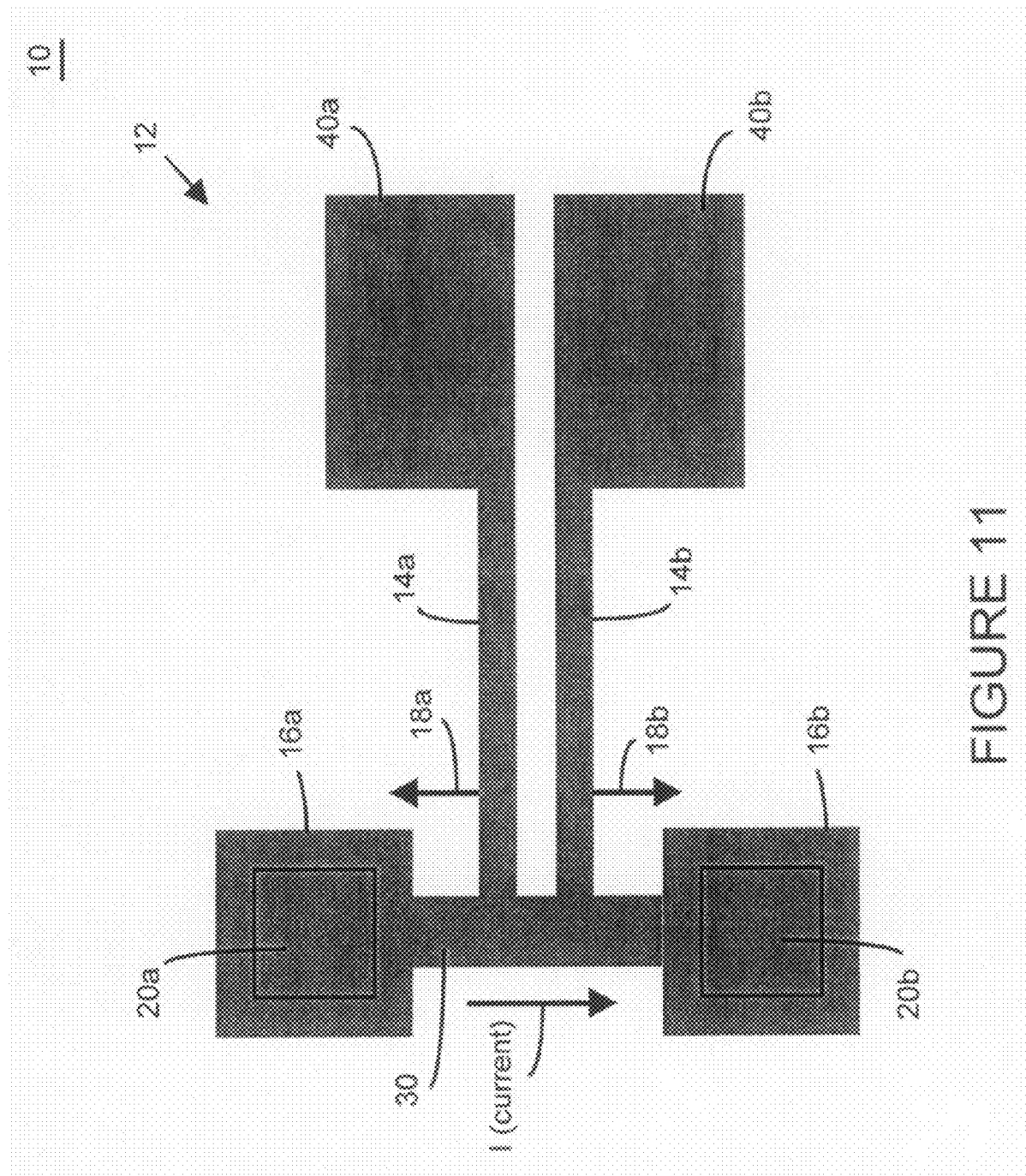
FIG. 11 illustrates a top view of a resonator, having two oscillating/moveable beams that are configured in a cantilever, tuning fork beam structure, each having an oscillating mass disposed on a moveable beam, according to another embodiment of the present invention.

In addition, with reference to FIG. 11, MEMS resonator 10 may include spring masses 40a and 40b connected to moveable beams 14a and 14b, respectively. In this embodiment, at least moveable beams 14a and 14b, are conductively heated via the heating current passing through beam 30.

Thus, as stated above, MEMS resonator 10 may employ any type of design and/or control of mechanical structure 12. As such, any design and/or control of mechanical structure 12, whether now known or later developed, is intended to fall within the scope of the present invention.

Figure 10:
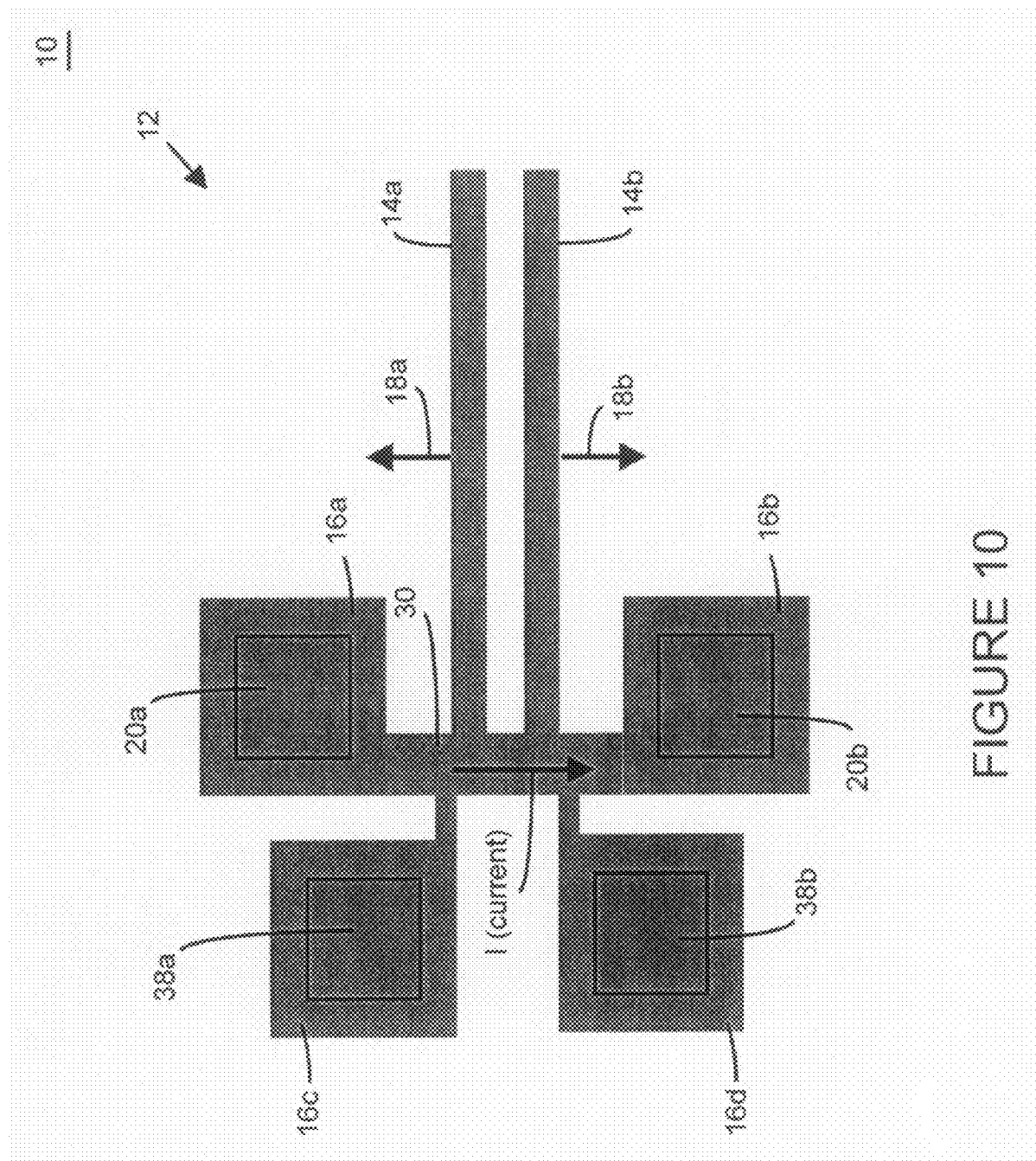
FIG. 10 illustrates a top view of a resonator, having two oscillating beams that are configured in a cantilever, tuning fork beam structure having more than two anchors and/or electrical contacts to, among other things, facilitate acquisition of information which is representative of the temperature of the oscillating beams, according to another embodiment of the present invention.

Notably, the measurement and control techniques discussed above, for example, with respect to FIG. 6, are applicable to the embodiments of FIGS. 9-11. For the sake of brevity, that discussion will not be repeated.

As mentioned above, anchors 16 may employ any form of anchoring techniques, whether now known or later developed. Moreover, anchors 16 may be homogenous in composition or may be comprised of a composite structure. In this regard, the overall performance of a resonator may be enhanced using a composite structure, as described and illustrated in non-provisional patent application entitled "Temperature Compensation for Silicon MEMS", which was filed on Apr. 16, 2003 and assigned Ser. No. 10/414,793 (hereinafter "Temperature Compensated Silicon MEMS patent application"). Thus, any and all of the embodiments described and illustrated in the Temperature Compensated Silicon MEMS patent application may be incorporated in to MEMS resonator 10 according to the present inventions. For the sake of brevity, the composite anchoring and beam structures and techniques of the Temperature Compensated Silicon MEMS patent application, implemented in conjunction with the inventions described and illustrated herein, will be summarized and not be repeated in detail. It is expressly noted, however, that the entire contents of the Temperature Compensated Silicon MEMS patent application, including, for example, the features, attributes, alternatives, materials, techniques and advantages of all of the embodiments and/or inventions, are incorporated by reference herein.

Figure 12A:
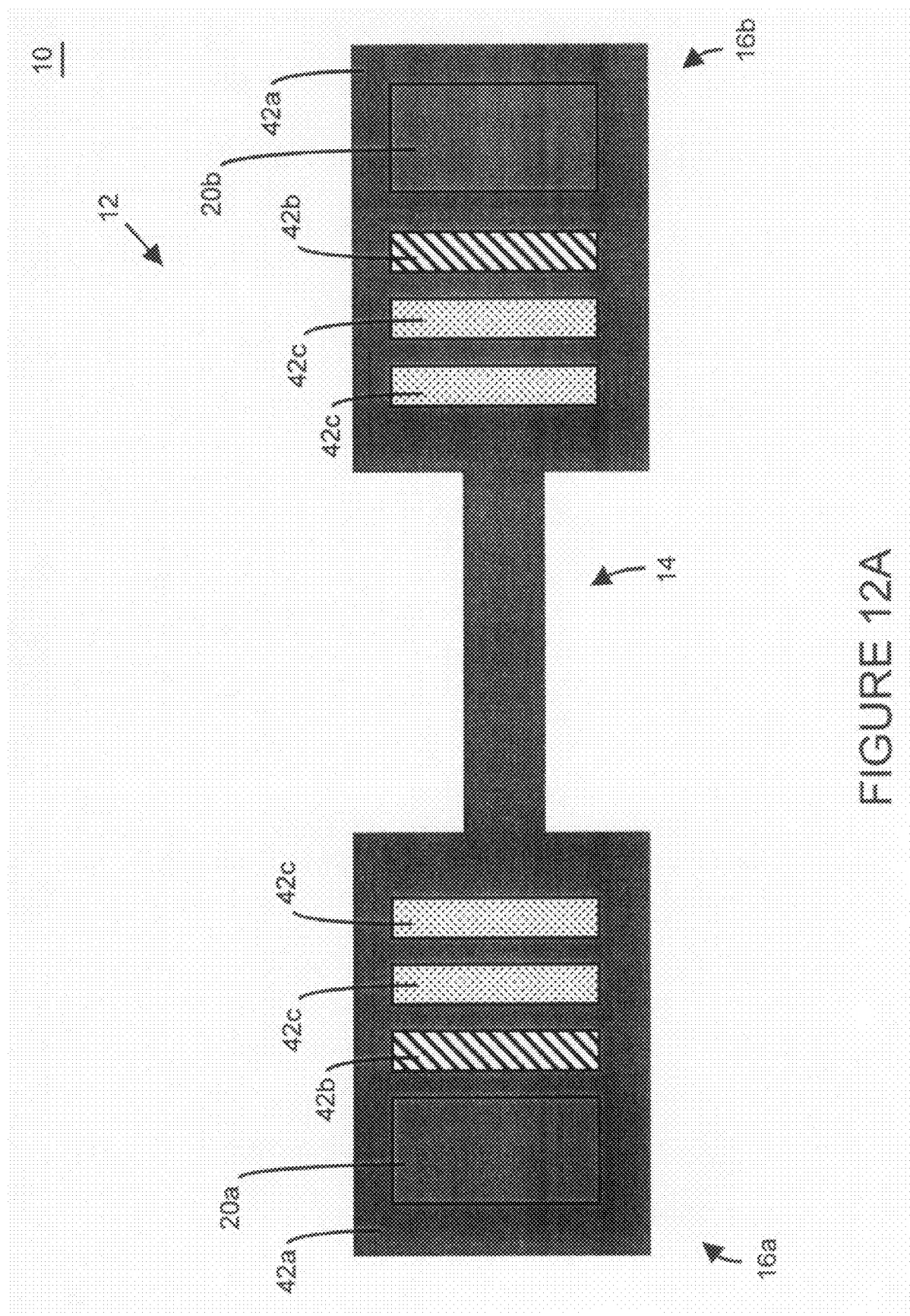

For example, with reference to FIGS. 12A and 12B, in one embodiment, MEMS resonator 10 may include moveable beam 14 disposed between anchors 16a and 16b. The anchors 16a and 16b, in this embodiment, are comprised of two or more materials (for example, silicon, silicon dioxide, silicon nitride and/or germanium), each material 42a-c having a different thermal expansion coefficient. Thus, as the resonator is heated, under the influence of heating current (I(current)), the relatively greater or lesser thermal expansion of the different materials of the composite anchors together with the beam 14, relative to the thermal expansion coefficient of the substrate, may create a tensile or a compressive force on the beam structure. This tensile or a compressive force may lead to a change in frequency due to the induced stress in or on moveable beam 14.

With continued reference to FIGS. 12A and 12B, where anchors 16a and 16b are formed, for example, by silicon dioxide re-fill into selectively vacated portions of a polysilicon anchor, anchors 16a and 16b may exhibit a lower overall thermal expansion coefficient with respect to a moveable beam consisting of polysilicon and/or a silicon-based substrate. The length of the composite anchors provides leverage for the compressive or tensile strain applied to moveable beam 14 by the disparate thermal expansion of the selected materials.

The relative beam composition may also be used to effect and/or control thermal compensation for resonance beam frequency variations. In this regard, with reference to FIGS. 12C and 12D, moveable beam 14 may consist of a plurality of materials 42a and 42d-f (for example, silicon, germanium, silicon oxide and/or silicon nitride) that have different thermal coefficients of expansion. For example, moveable beam 14 may be comprised of an inner-core of silicon and an outer-layer of silicon oxide. Alternatively, moveable beam 14 may be comprised of silicon, germanium and silicon dioxide (42a, 42e and 42f, respectively—see, FIG. 12D). Indeed, any of the materials discussed herein (or other materials) may be employed to comprise anchors 16 and/or moveable beam 14.

The invention illustrated in FIGS. 12C and 12D may also be incorporated with the inventions illustrated in any of the embodiments (for example, MEMS resonator 10 of FIGS. 2, 3A, 3B, 4A, 4B, 6, 9, 10 and 11) of any inventive aspects described and illustrated herein and/or any of the embodiments incorporated by reference. In this regard, moveable beam 14 may consist of a plurality of materials, each having different thermal coefficients of expansion, and anchors 16a and/or 16b may consists of two or more materials having in combination a different thermal expansion coefficient from that of the substrate. That is, by selecting composition materials having dissimilar thermal expansion coefficients for anchors 16a and/or 16b, moveable beam 14, and/or the substrate, an appropriate compressive or tensile strain may be applied to moveable beam 14 that compensates for temperature induced frequency variations.

In a third aspect, the present invention is directed to a thin film or wafer level encapsulated microelectromechanical resonator and method of fabricating, manufacturing, providing and/or controlling microelectromechanical resonators having mechanical structures that are encapsulated using thin film or wafer level encapsulation techniques in a chamber and include heating and/or temperature sensing elements disposed in the chamber, on the chamber and/or integrated within the mechanical structures.

Figure 13:
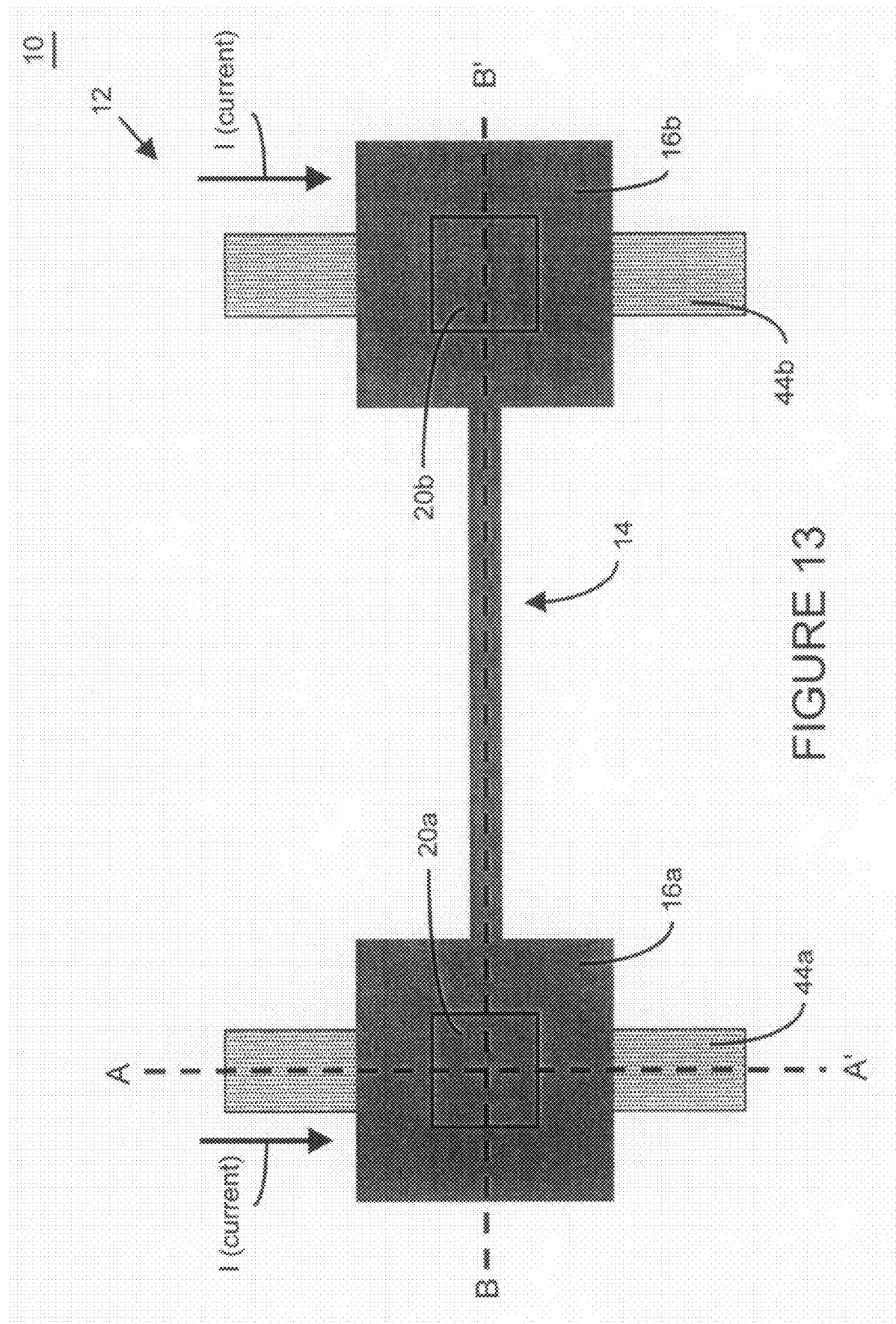
FIG. 13 illustrates a top view of a resonator, having a single oscillating beam, according to one embodiment of a third aspect of the present invention, wherein the heating elements are disposed beneath the anchors of the resonator.
Figure 14B:
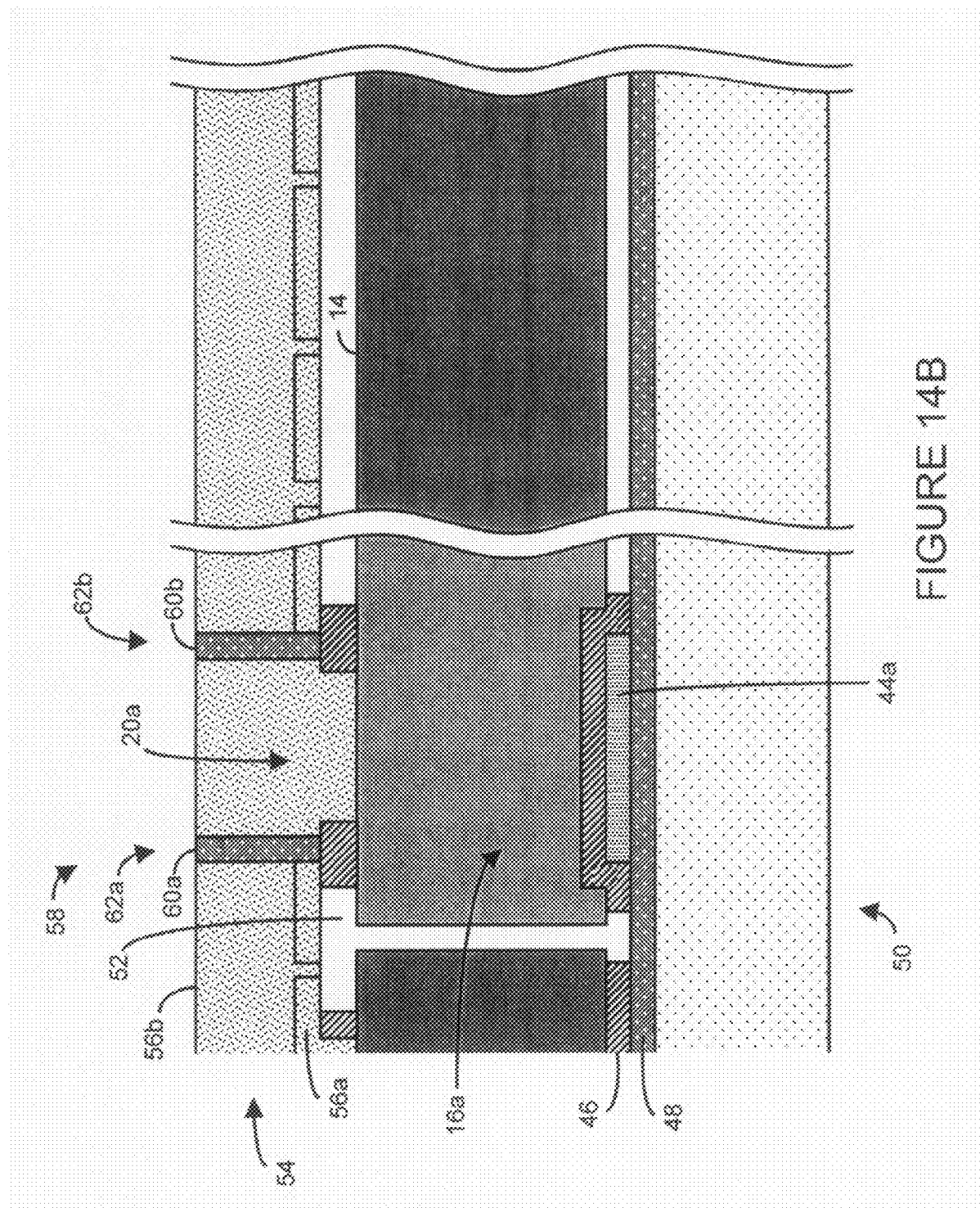

With reference to FIGS. 13, 14A and 14B, in one embodiment, MEMS resonator 10 is encapsulated using thin film or wafer level encapsulation techniques and includes heating elements 44a and 44b to conductively heat anchors 16a and 16b, respectively, in response to an electrical current provided by electrical source 28 (not illustrated). Where anchors 16a and 16b are comprised of an electrically conductive material, insulator 46 may be employed to insulate the current in heating element 44a and 44b and/or electrically isolate heating element 44a and 44b from anchors 16a and 16b, respectively. Similarly, insulator 48 may be employed to electrically isolate heating element 44a and 44b from substrate 50 in those instances where substrate 50 is comprised of an electrically conductive material.

After formation of mechanical structure 12, MEMS resonator 10 may be encapsulated to form cavity 52. In this regard, MEMS resonator 10 may be sealed or encapsulated using conventional thin film encapsulation techniques and structures. (See, for example, WO 01/77008 A1 and WO 01/77009 A1). Other thin film encapsulation techniques are suitable. Indeed, all thin film encapsulation techniques, whether now known or later developed, are intended to be within the scope of the present invention.

For example, the encapsulation techniques described and illustrated in non-provisional patent application "Microelectromechanical Systems Having Trench Isolated Contacts, and Methods of Fabricating Same", which was filed on Jun. 4, 2003 and assigned Ser. No. 10/455,555 (hereinafter "Microelectromechanical Systems Having Trench Isolated Contacts patent application") may be employed. All of the inventions/embodiments (including, for example, the encapsulation and electrical isolation techniques) described and illustrated in the Microelectromechanical Systems Having Trench Isolated Contacts patent application may be implemented in conjunction with the temperature compensation techniques described and illustrated herein. For the sake of brevity, the embodiments described and illustrated in the Microelectromechanical Systems Having Trench Isolated Contacts patent application, implemented in conjunction with the temperature compensation techniques described and illustrated herein, will not be repeated in detail but will only be summarized. It is expressly noted, however, that the entire contents of the Microelectromechanical Systems Having Trench Isolated Contacts patent application, including, for example, the features, attributes, alternatives, materials, techniques and advantages of all of the inventions, are incorporated by reference herein.

Briefly, with reference to FIGS. 14A and 14B, encapsulation structure 54, in one embodiment, may include one or more encapsulation layers to seal chamber 52. In the illustrative embodiment, encapsulation structure 54 includes first encapsulation layer 56a and second encapsulation layer 56b. As described in detail in the Microelectromechanical Systems Having Trench Isolated Contacts patent application, in one embodiment, first encapsulation layer 56a is deposited on a sacrificial layer, for example, silicon dioxide or silicon nitride, to secure, space and/or protect mechanical structure 12, including moveable electrode 14. Thereafter, passages or vents are formed and/or etched in encapsulation layer 56a to permit or facilitate etching and/or removal of at least selected portions of the sacrificial layer and insulator layer 46.

After etching and/or removal of at least selected portions of the sacrificial layer and insulator layer 46 and releasing of, for example, moveable beam 14, second encapsulation layer 56b is deposited on first encapsulation layer 56a and in the vents or passages within first encapsulation layer 56a thereby "sealing" chamber 52.

With continued reference to FIGS. 13, 14A and 14B, electrical contacts 20a and 20b may be employed to facilitate measuring, detecting and/or sampling the temperature of moveable beam 14. The electrical contacts 20a and 20b may be electrically isolated using the inventions/embodiments described and illustrated in the Microelectromechanical Systems Having Trench Isolated Contacts patent application. For the sake of brevity, the isolation techniques described and illustrated in the Microelectromechanical Systems Having Trench Isolated Contacts patent application, implemented in conjunction with the temperature compensation techniques described and illustrated herein, will not be repeated in detail but will only be summarized.

With reference to FIGS. 13, 14A and 14B, as described in detail in the Microelectromechanical Systems Having Trench Isolated Contacts patent application, in one embodiment, trench isolation structure 58 electrically isolates electrical contacts 20a and/or 20b from nearby electrically conducting regions (for example, second encapsulation layer 56b and/or field regions (not illustrated)). In this regard, in one embodiment, trench isolation structure 58 includes dielectric isolation regions 60a and 60b that include an insulating material disposed in trenches 62a and 62b. The dielectric isolation regions 60a and 60b (and trenches 62a and 62b) may surround electrical contact 20a to electrically isolate contact 20a from any nearby electrically conducting regions. The details regarding, for example, the fabrication, features, attributes, alternatives, materials, techniques and advantages of the isolation of electrical contacts are described in Microelectromechanical Systems Having Trench Isolated Contacts patent application, which, as mentioned above, is incorporated by reference herein in its entirety.

As mentioned above, electrical contacts 20a and 20b may be employed to measure, detect and/or sample, for example, the temperature of moveable beam 14. In this regard, temperature measurement circuitry 32 (not shown) may be coupled to electrical contacts 20a and 20b to measure, detect and/or sample the electrical resistance of moveable beam 14. This control circuitry 24 (not shown) may determine and/or calculate the operating temperature of moveable beam 14 using the resistance of moveable beam 14, for a given measurement current.

Figure 15:
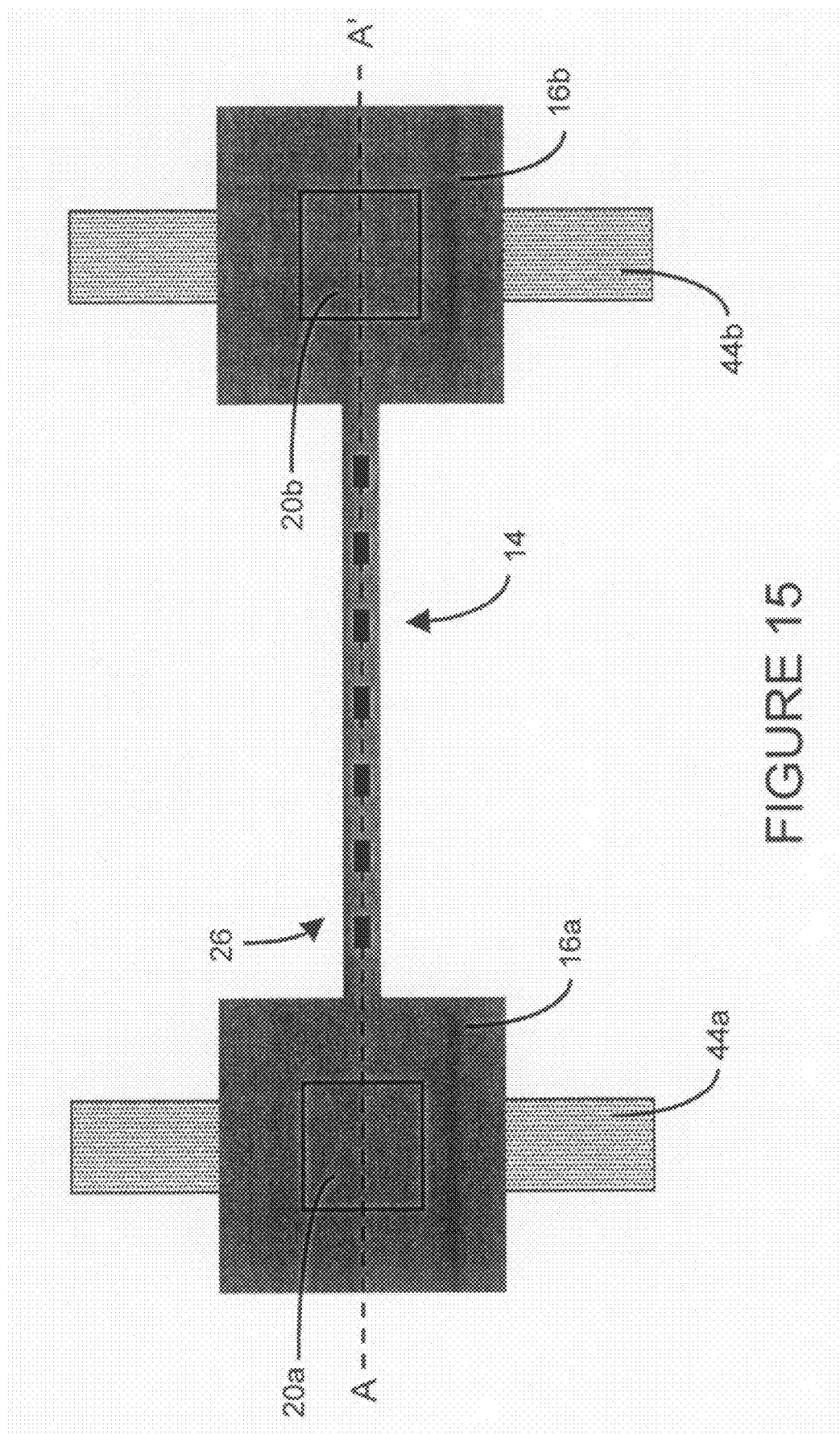
FIGS. 15-18 illustrate top views of a resonator, having a single oscillating beam including physical/discrete temperature sensors disposed in or on the moveable beam and/or the anchors.
Figure 16:
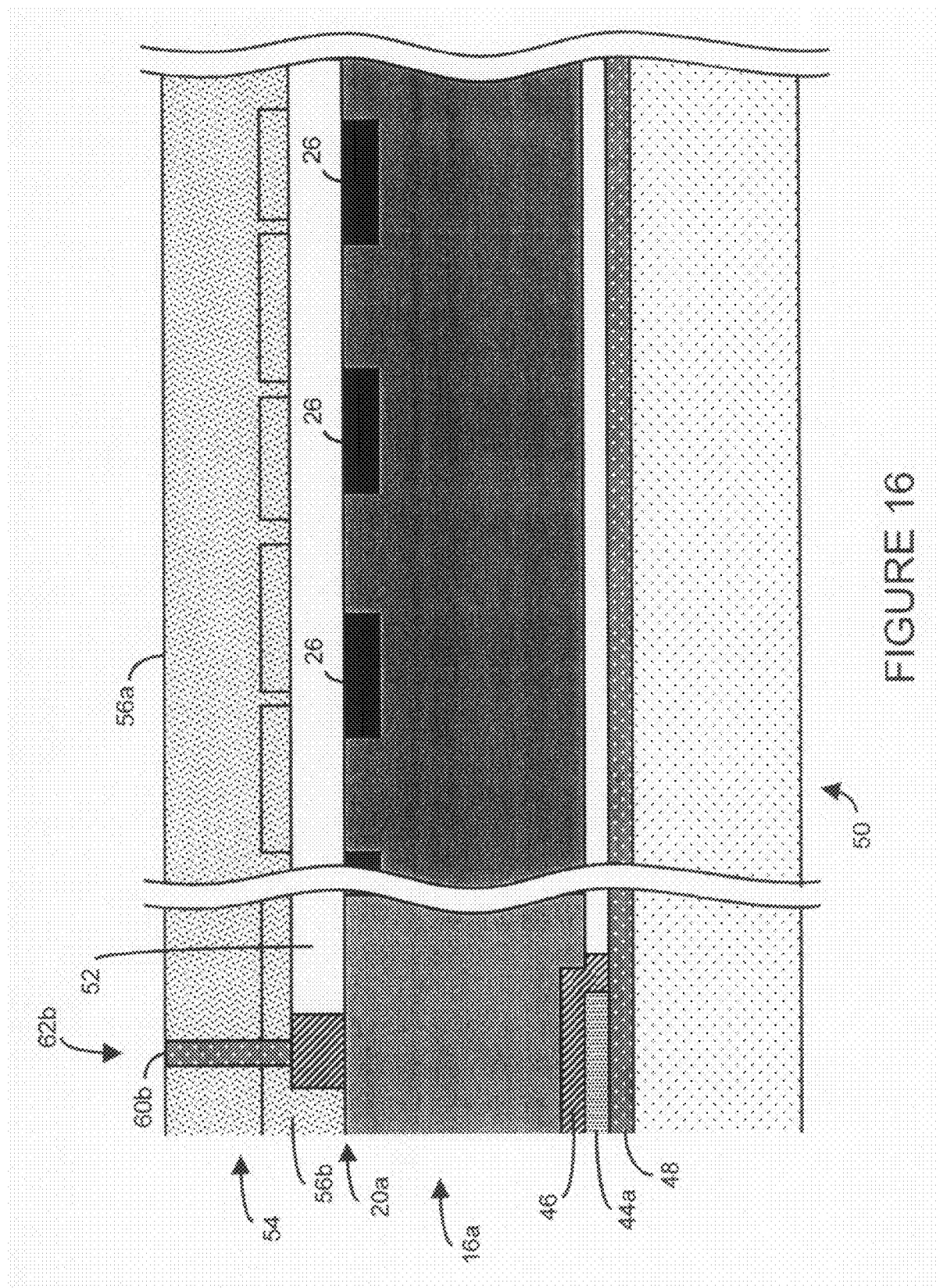

In another embodiment, physical/discrete temperature sensors 26 may be disposed in anchors 16a and 16b in addition to or in lieu of disposing temperature sensors 26 in or on moveable beam 14. (See, FIGS. 15 and 16). It may be advantageous to include sensors 26 in or on anchors 16a and 16b in order to, among other things, acquire additional temperature related information pertaining to mechanical structure 12 in order to enhance the precision of calculating and/or determining the operating temperature of moveable beam 14. In addition, such information may also assist in more precisely and appropriately controlling the amount of current flow (provided by electrical source 28) through heating elements 44a and/or 44b. In this way, control circuitry 24 may more accurately control electrical source 28 and adjust the current flow through heating elements 44a and/or 44b in order to maintain moveable beam 14 at a constant (or relatively constant) and/or predetermined or desired temperature.

Figure 17:
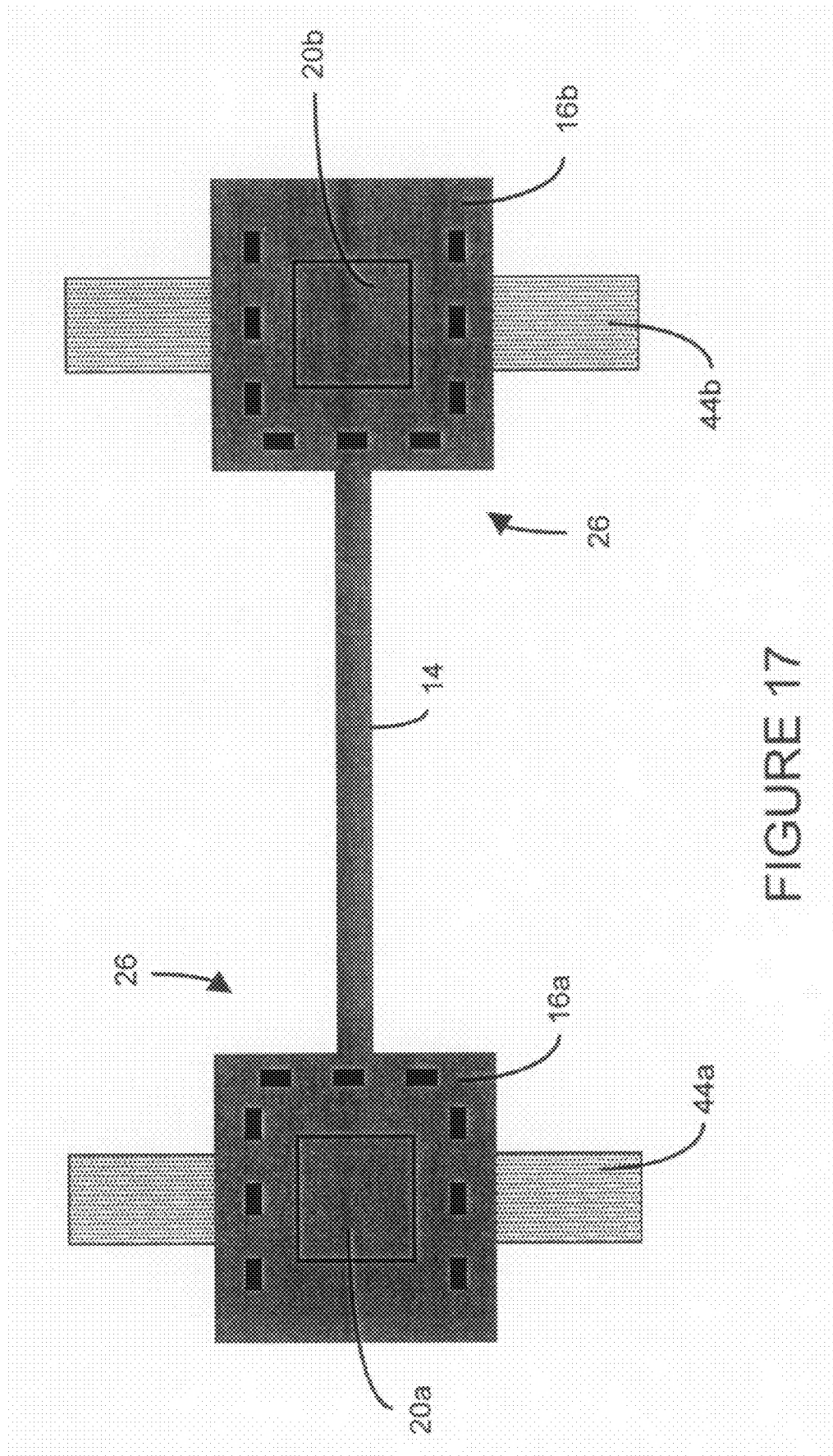
Figure 18:
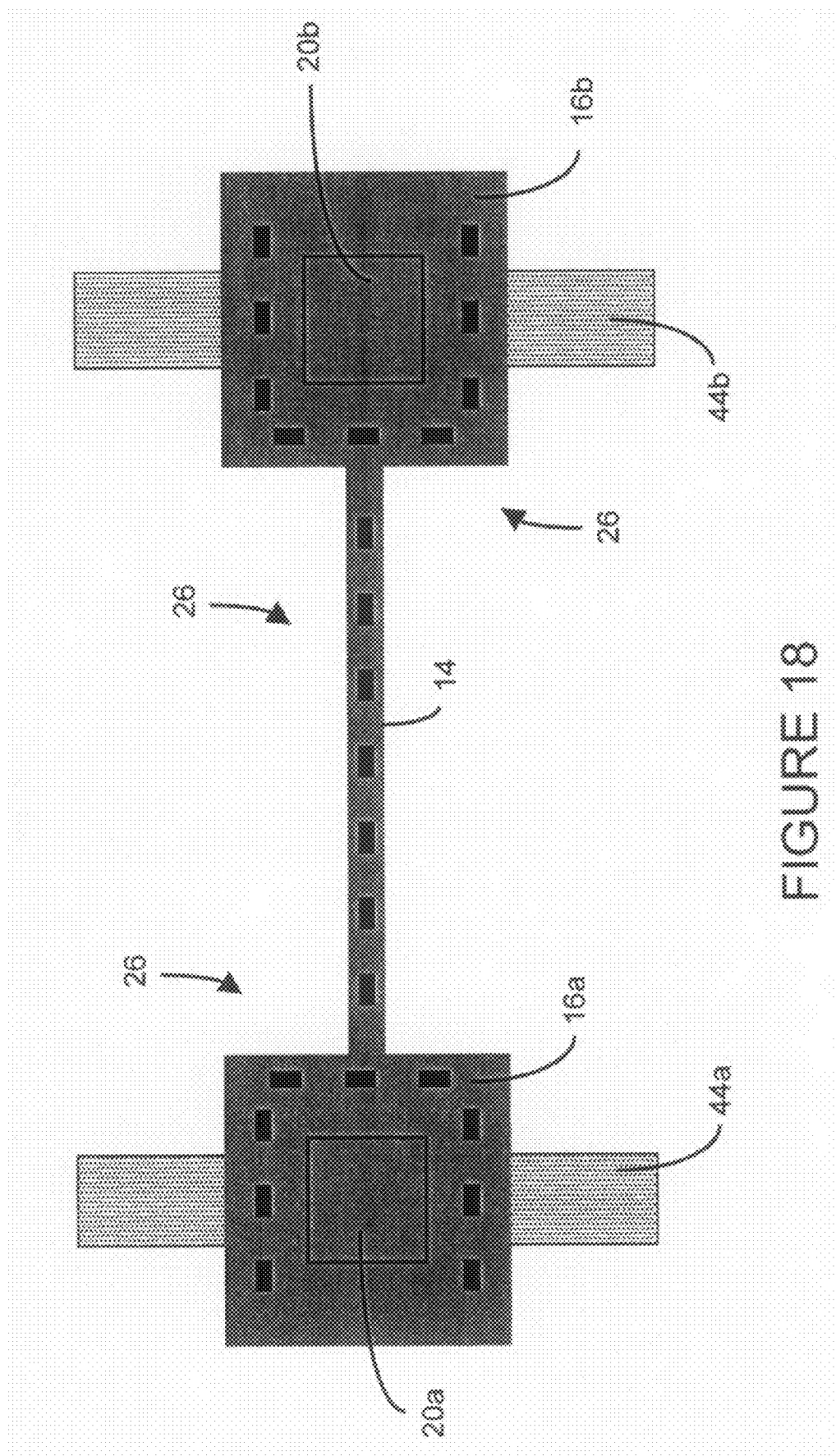
Figure 20:
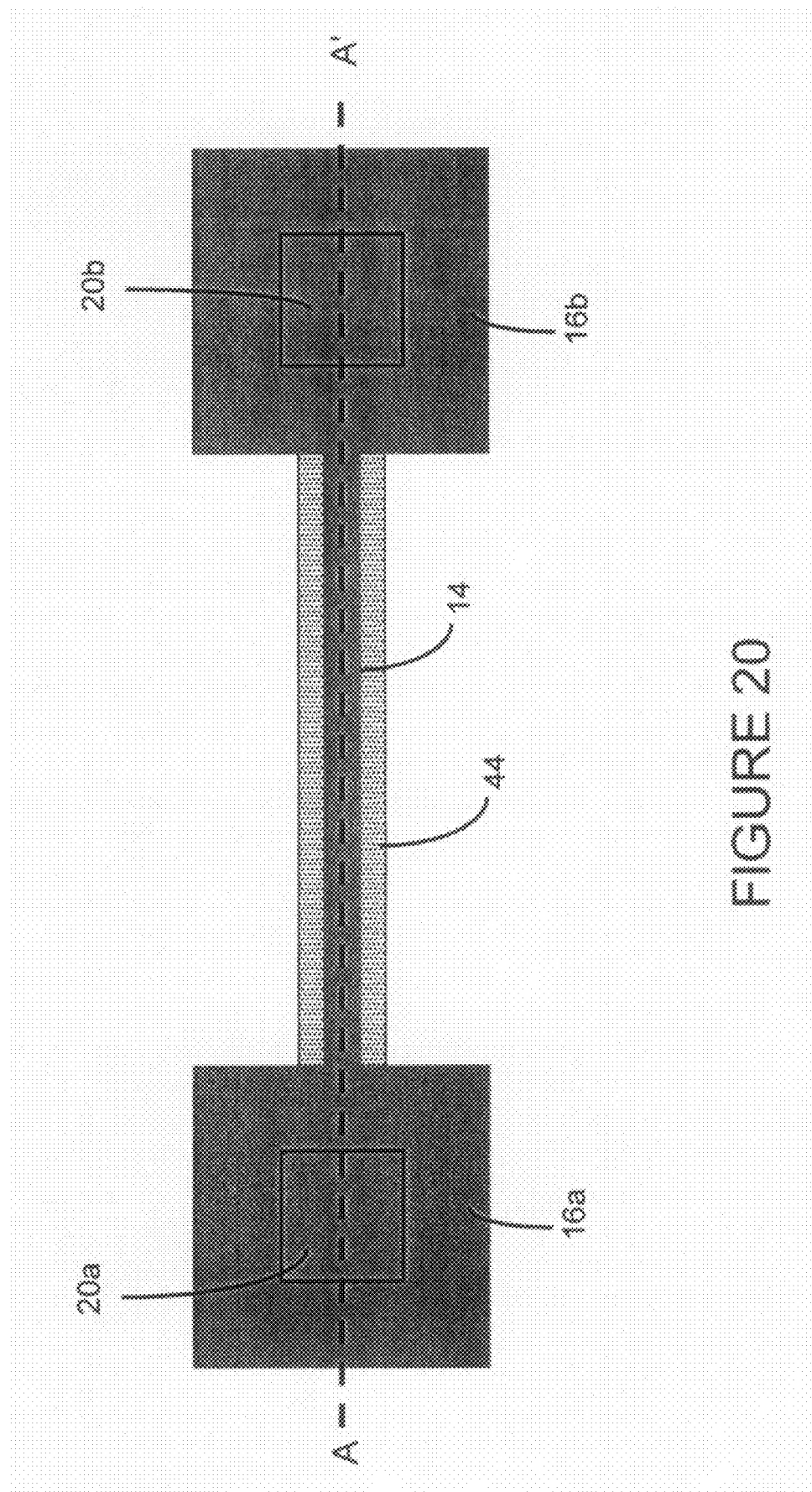
FIG. 20 is a top view of a resonator, having a single oscillating beam, according to one embodiment of a third aspect of the present invention, wherein the heating element is disposed beneath the moveable beam and arranged along the longitudinal axis of the moveable beam.
Figure 21:
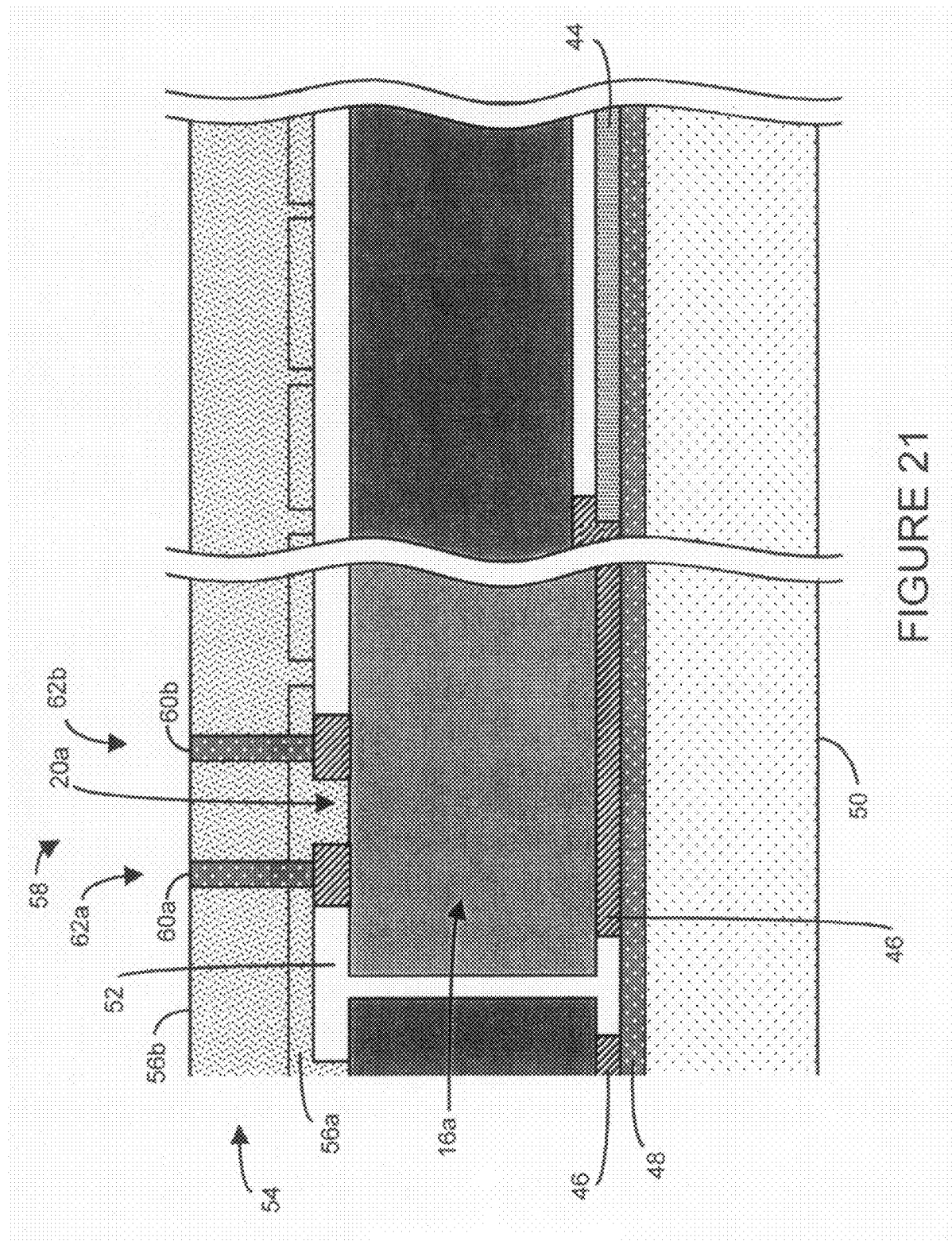
FIG. 21 illustrates a cross-sectional view of the resonator of FIG. 20, sectioned along dotted lines A-A'.
Figure 22:
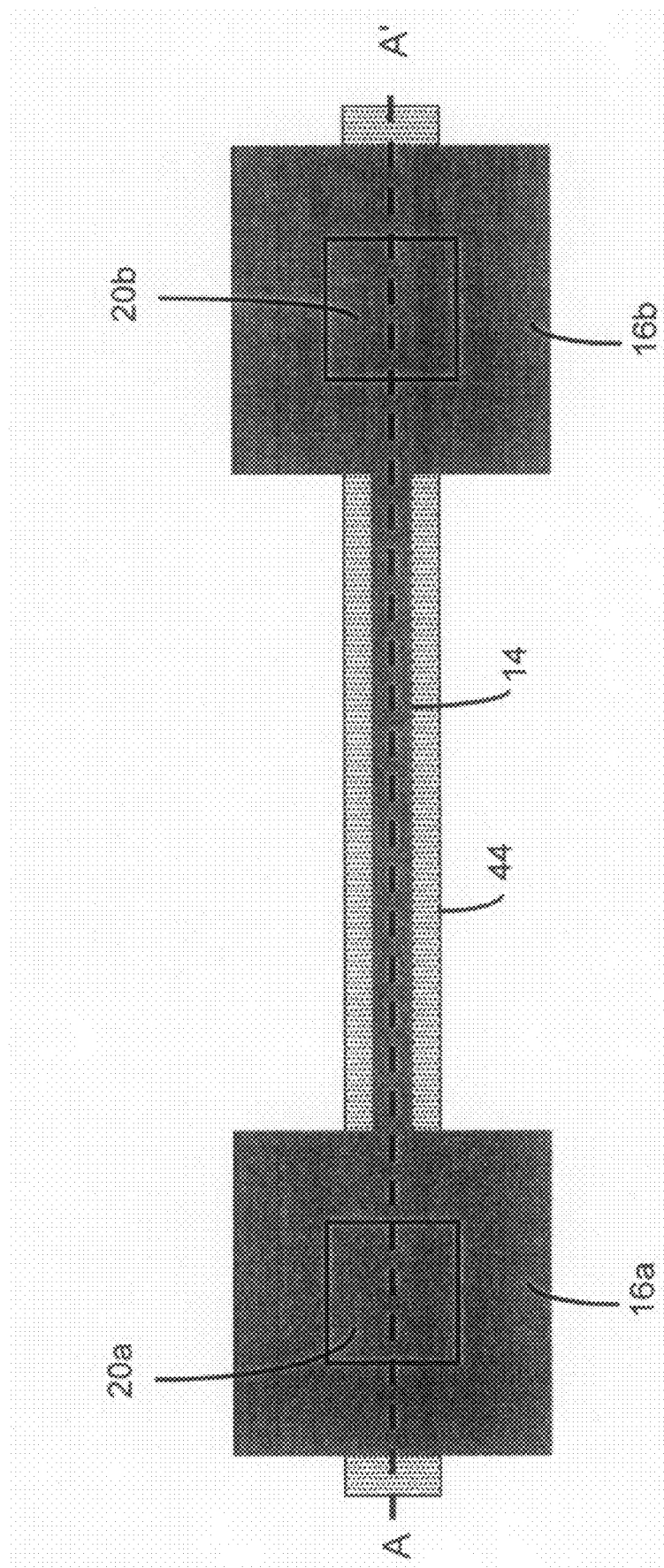
FIG. 22 illustrates a top view of a resonator, having a single oscillating beam, according to an embodiment of a third aspect of the present invention, wherein the heating element is disposed beneath the moveable beam and the anchors, and arranged along the longitudinal axis of the moveable beam.
Figure 23:
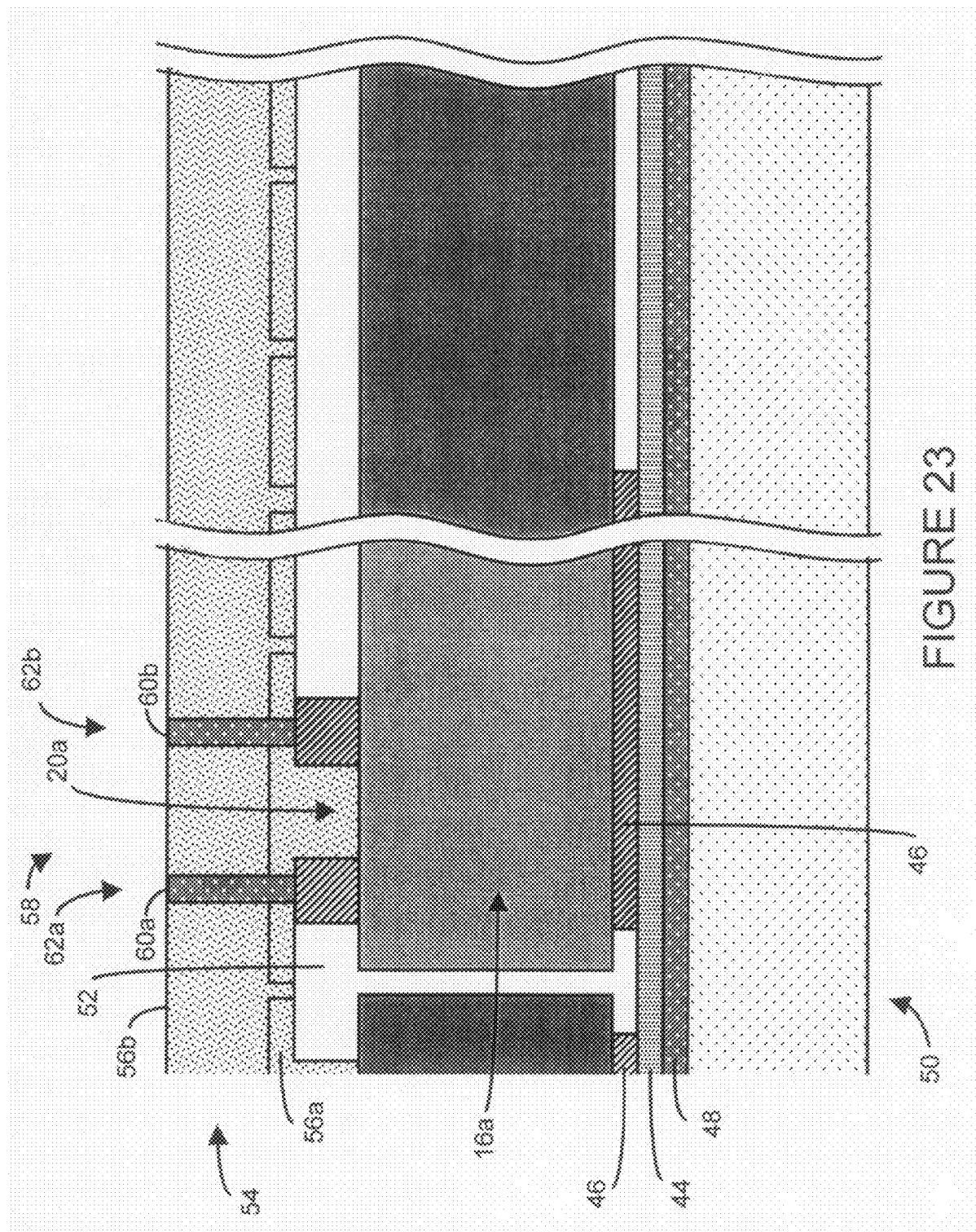
FIG. 23 illustrates a cross-sectional view of the resonator of FIG. 22, sectioned along dotted lines A-A'.
Figure 24:
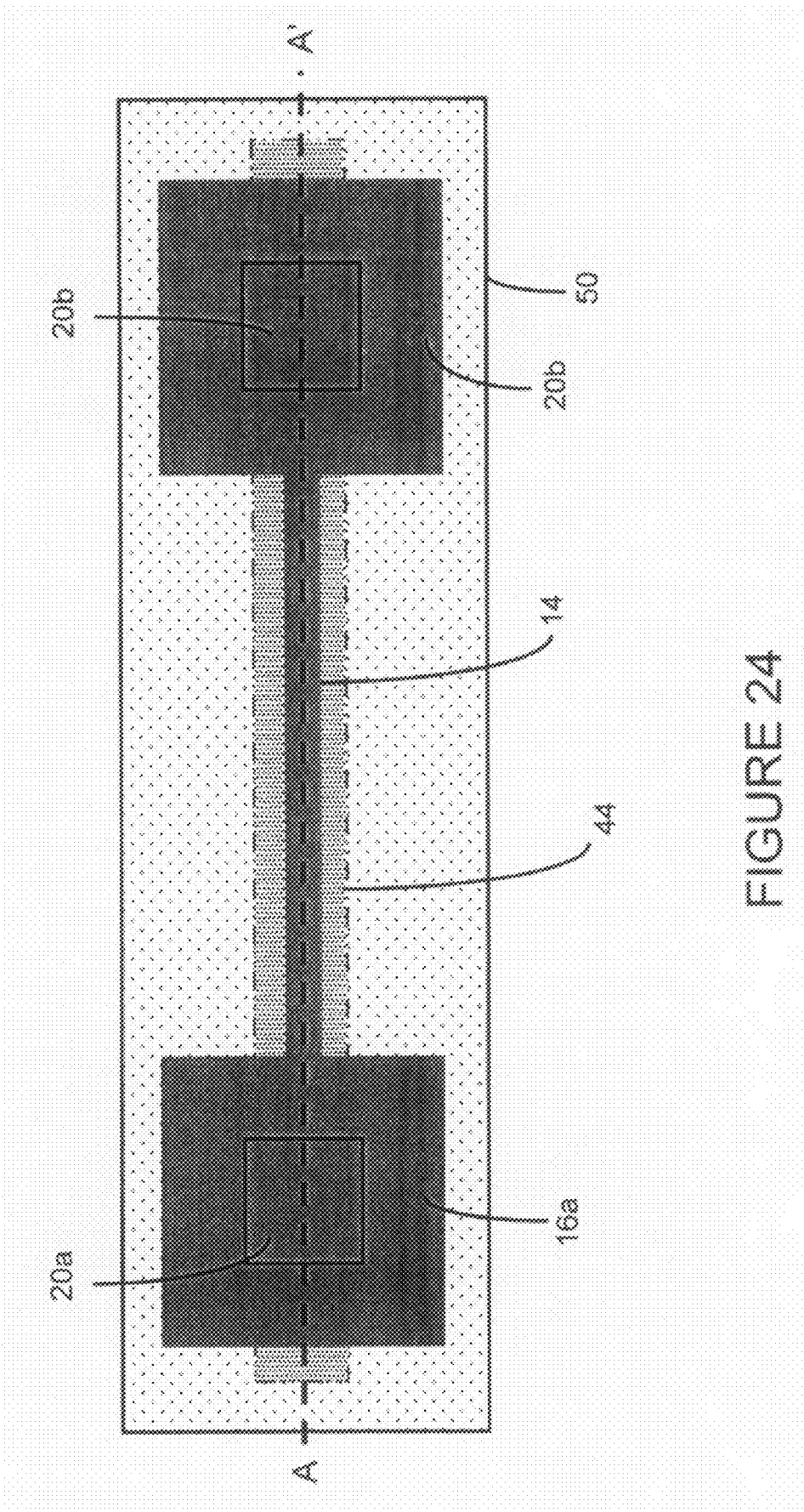
FIGS. 24 and 27 are top views of a resonator, having a single oscillating beam, according to other embodiments of a third aspect of the present invention, wherein the heating element is disposed in or on the substrate, and arranged along the longitudinal axis of the moveable beam.
Figure 25:
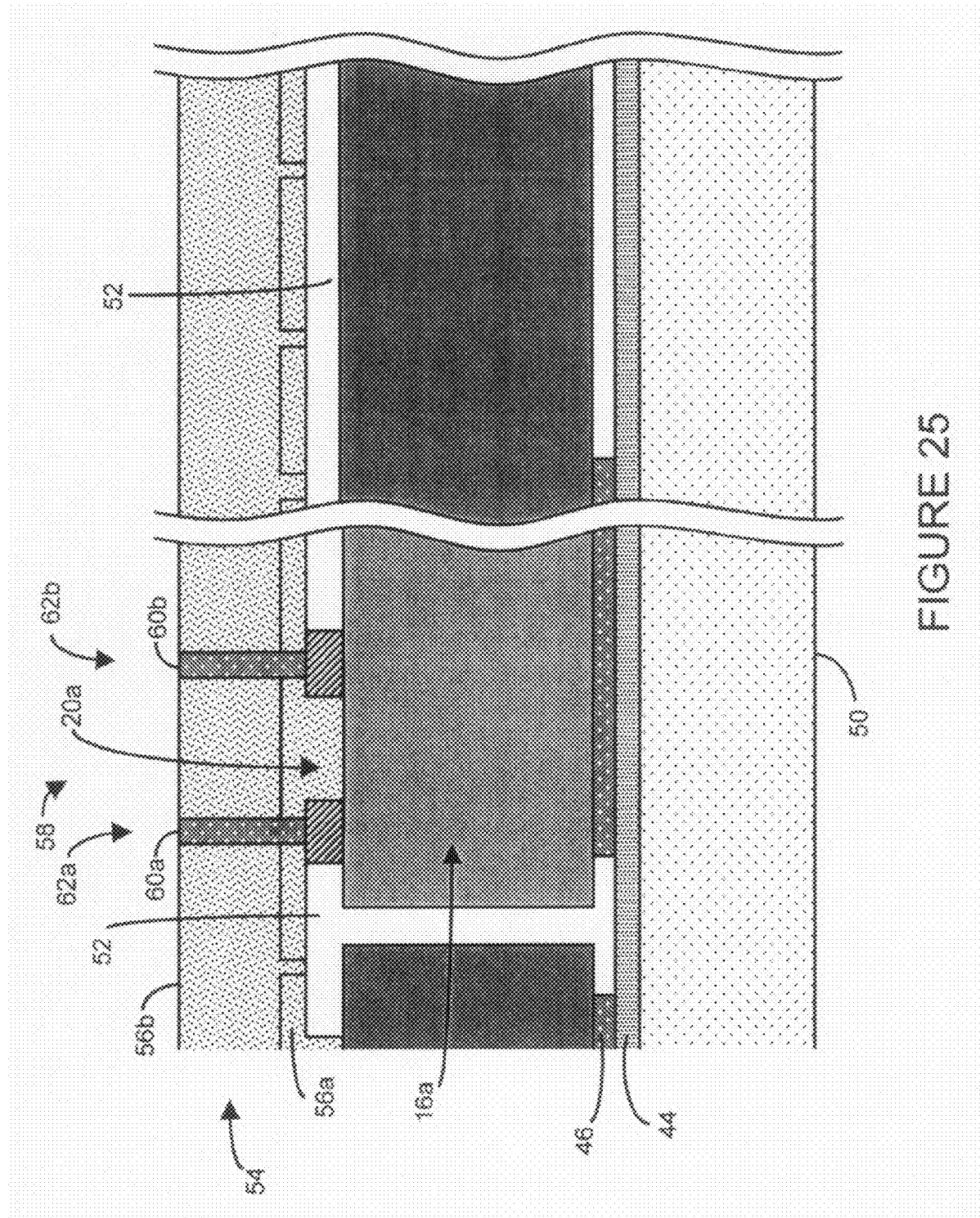
FIG. 25 illustrates a cross-sectional view of the resonator of FIG. 24, sectioned along dotted lines A-A'.
Figure 26:
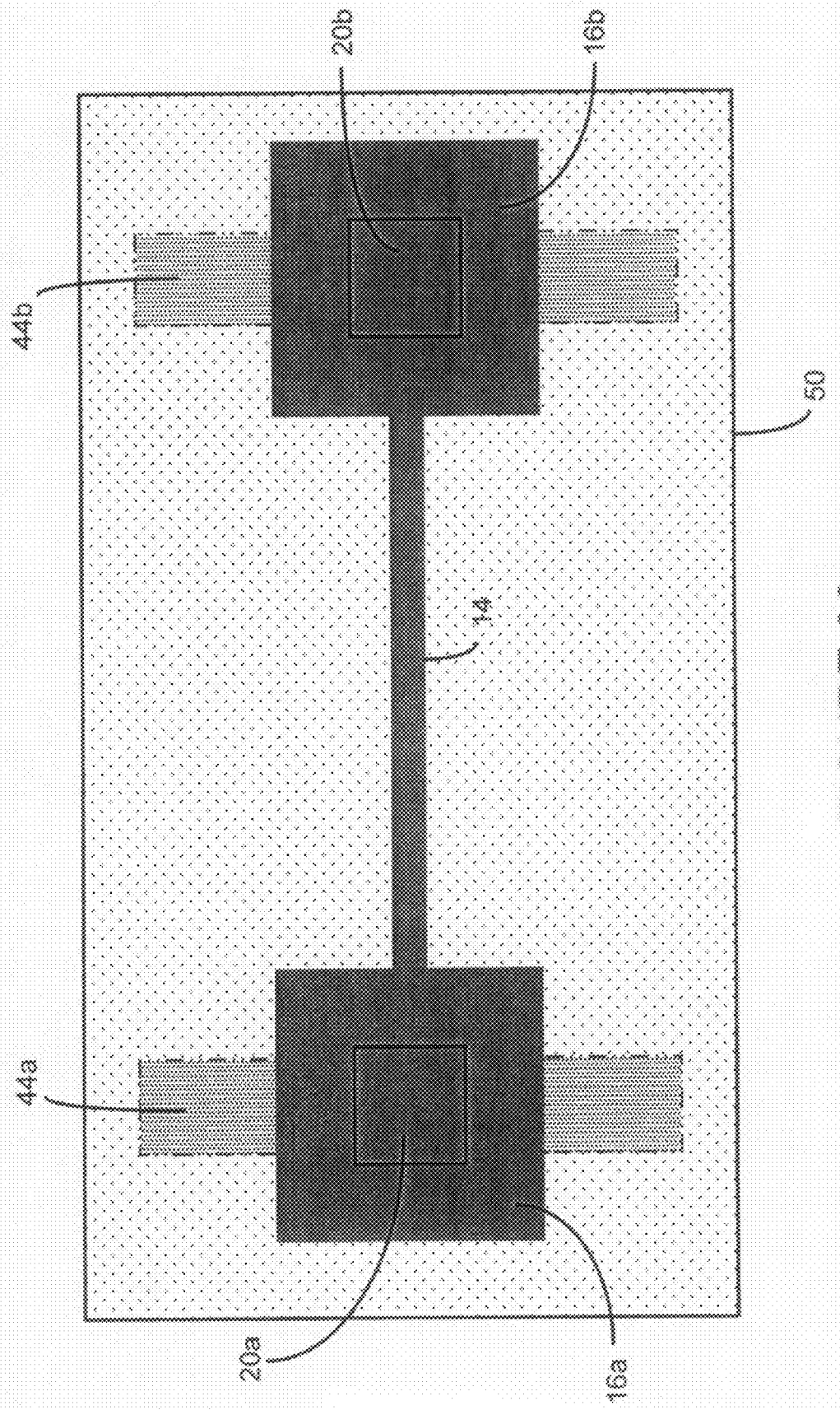
FIGS. 26 illustrates a top view of a resonator, having a single oscillating beam, according to an embodiment of a third aspect of the present invention, wherein the heating elements are disposed in or on the substrate and beneath the anchors.
Figure 27:
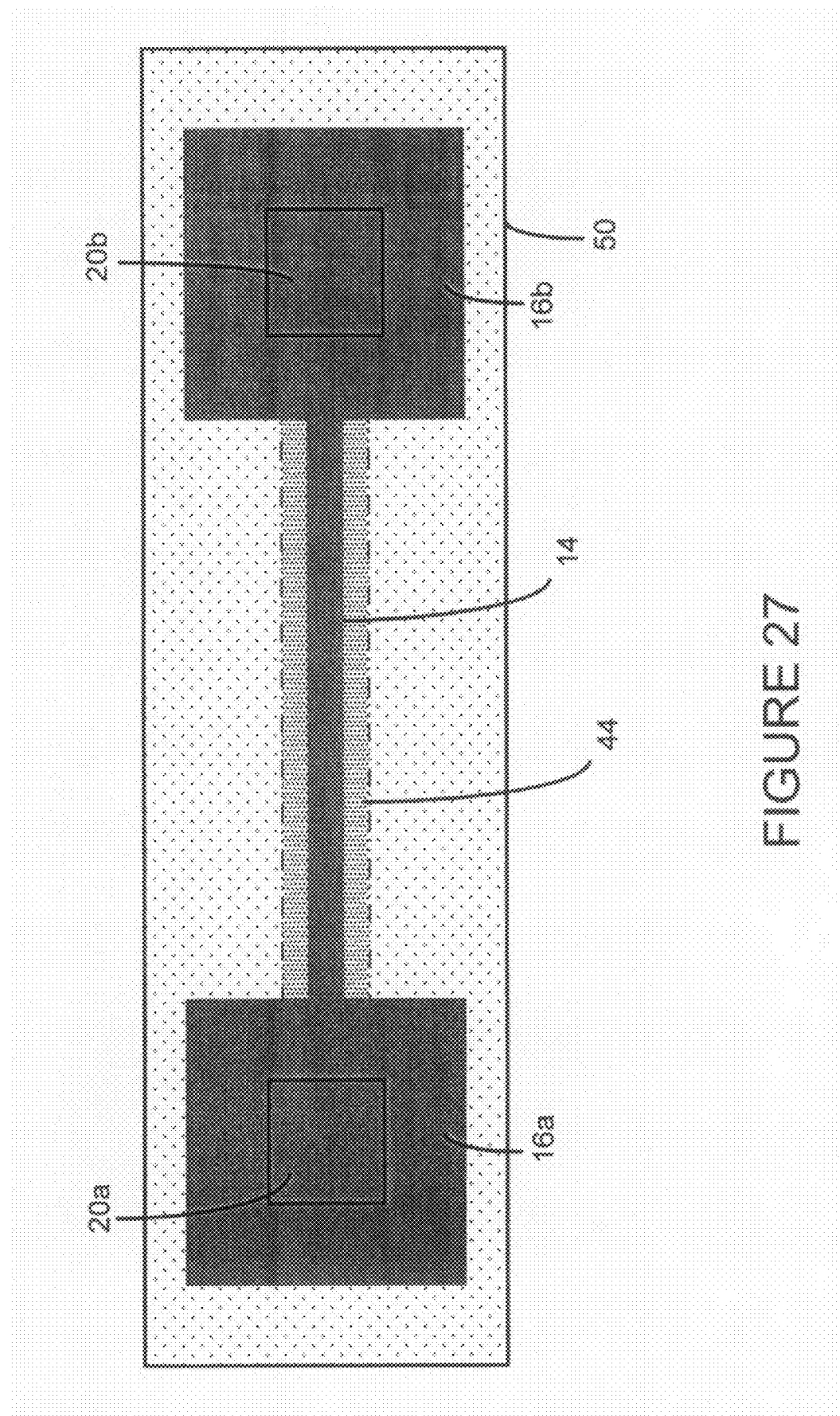

The physical/discrete temperature sensors 26 may be used to sample the operating temperature (for example, diodes, transistors, resistors or varistors, and/or one or more MEMS temperature transducers which are disposed and/or located on or in the substrate of MEMS resonator 10) of moveable beam 14. With reference to FIGS. 17 and 18, in one embodiment, temperature sensors 26 may be disposed in or on moveable beam 14. In this way, a highly precise operating temperature of moveable beam 14 may be determined.

Notably, as mentioned above, anchors 16 may employ the anchoring techniques described and illustrated in the Anchors for Microelectromechanical Systems Patent Application". With reference to FIGS. 19A and 19B, anchor structure 64 may be formed using techniques described and illustrated in Anchors for Microelectromechanical Systems patent application. For the sake of brevity, the details of the anchoring techniques of Anchors for Microelectromechanical Systems patent application will not be repeated in detail. It is expressly noted again, however, that the entire contents of the Anchors for Microelectromechanical Systems patent application, including, for example, the features, attributes, alternatives, materials, techniques and advantages of all of the embodiments and/or inventions, are incorporated by reference herein.

With reference to FIGS. 20-23, in another embodiment, heating element 44 is disposed parallel to the longitudinal axis of moveable beam 14. In this embodiment, heating element 44 may heat moveable beam 14 using a conduction and convection type heating. That is, heating element 44 conductively heats anchors 16a and 16b and, in addition, may heat the fluid (gas or gas vapor), if any, within chamber 52 which imparts heat to moveable beam 14 which is suspended therein.

Figure 28:
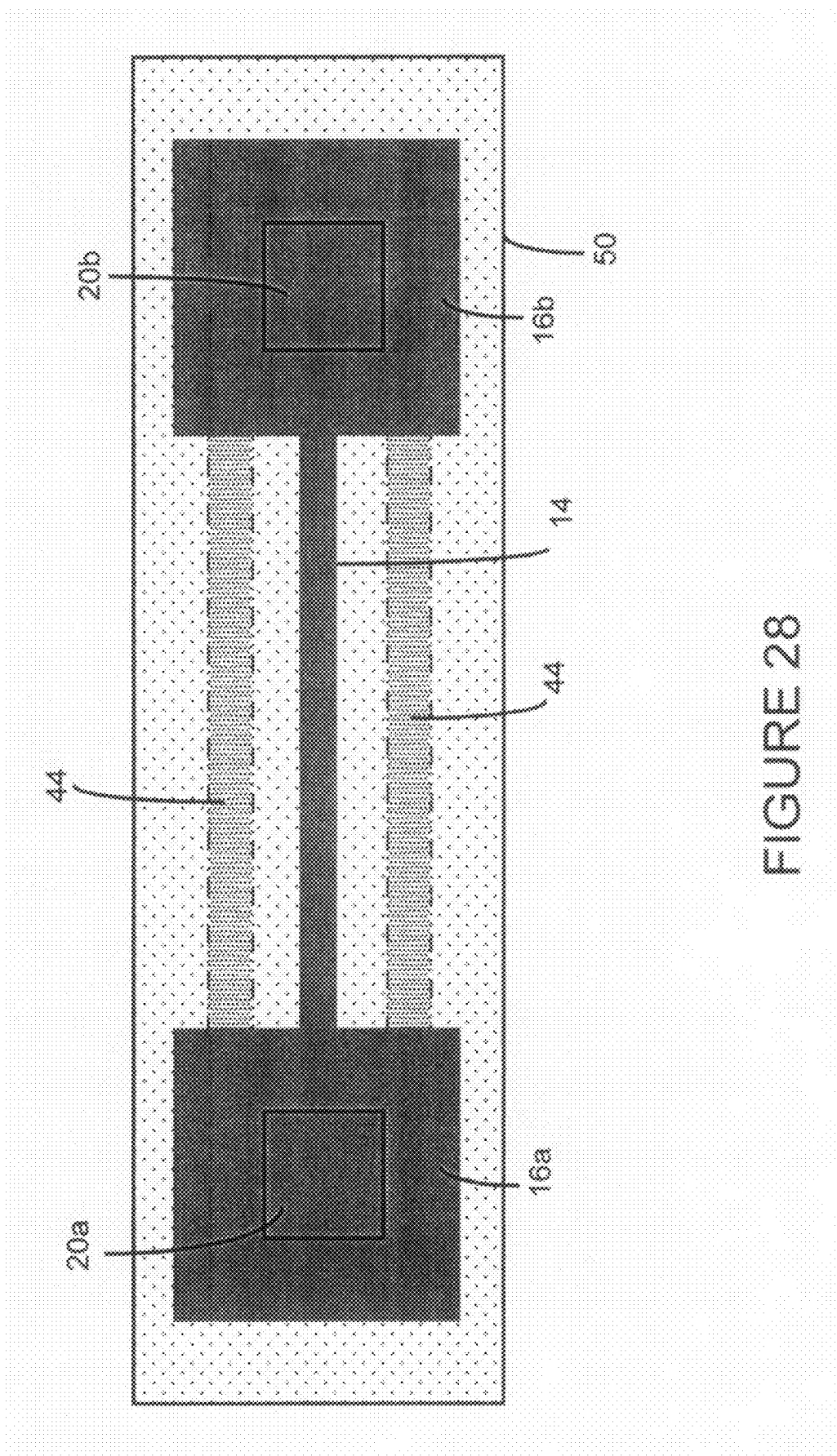
FIG. 28 illustrates a top view of a resonator, having a single oscillating beam, according to an embodiment of a third aspect of the present invention, including two (a plurality of) heating elements that are disposed in or on the substrate, and arranged along the longitudinal axis of the moveable beam.

Notably, heating element 44 may be comprised of an electrically conducting material (for example, a metal material) or semi-conducting material (for example, silicon and/or germanium). The heating element 44 may be disposed above or on substrate 50 (see, for example, FIGS. 20-23) or in substrate 50 (see, for example, FIGS. 24-28). Indeed, heating element 44 may include a plurality of elements in the chamber (see, for example, FIG. 28). A plurality of heating elements may provide more uniform and flexible/controllable heating of the chamber. That is, the heat contribution of each heating element of the plurality of elements may be independently or dependently controlled and/or adjusted by control circuitry 24, in conjunction with electrical source 28.

Figure 29:
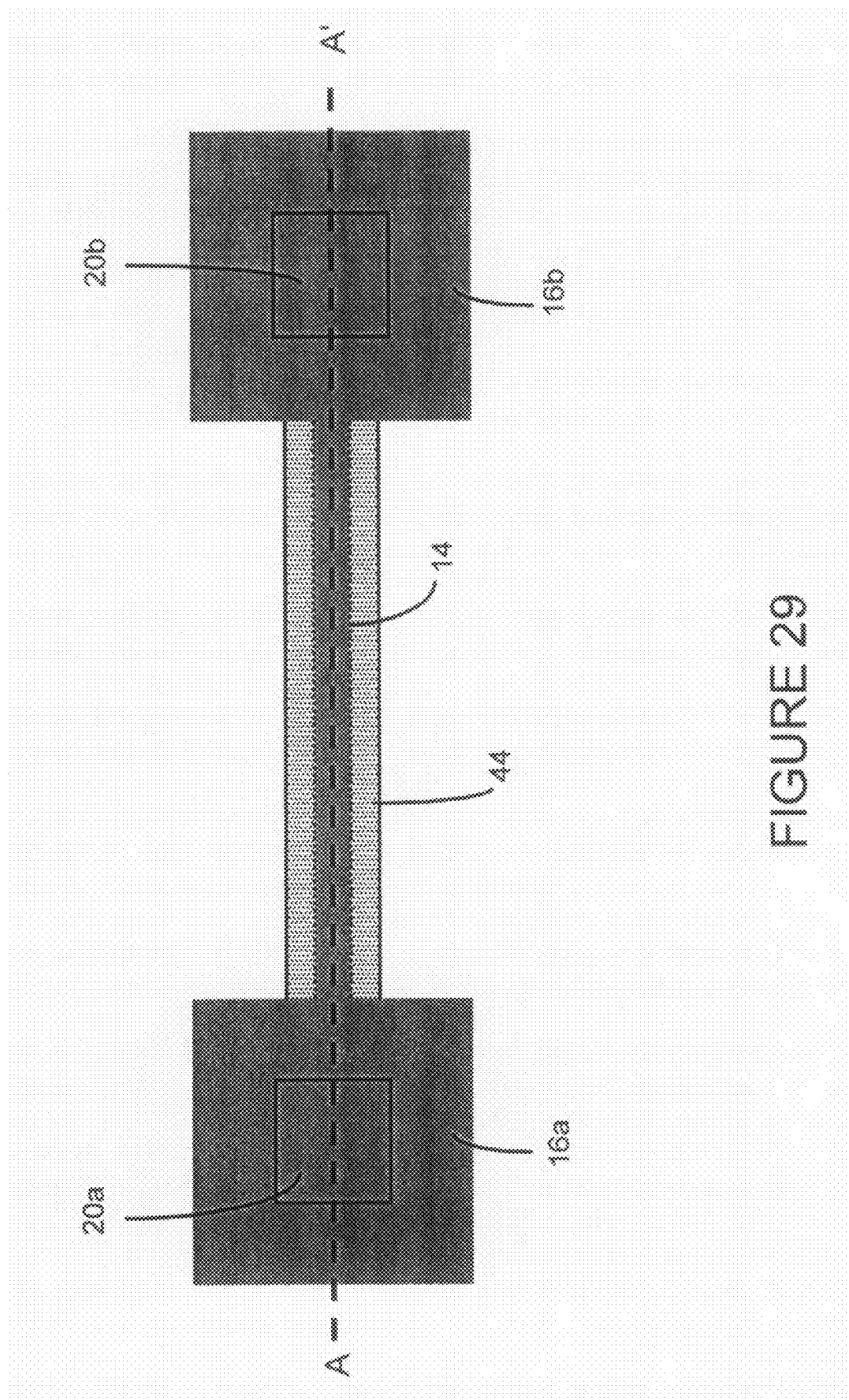
FIG. 29 illustrates a top view of a resonator, having a single oscillating beam, according to an embodiment of a third aspect of the present invention, wherein the heating element is disposed in the chamber and above the moveable beam, and arranged along the longitudinal axis of the moveable beam.
Figure 30:
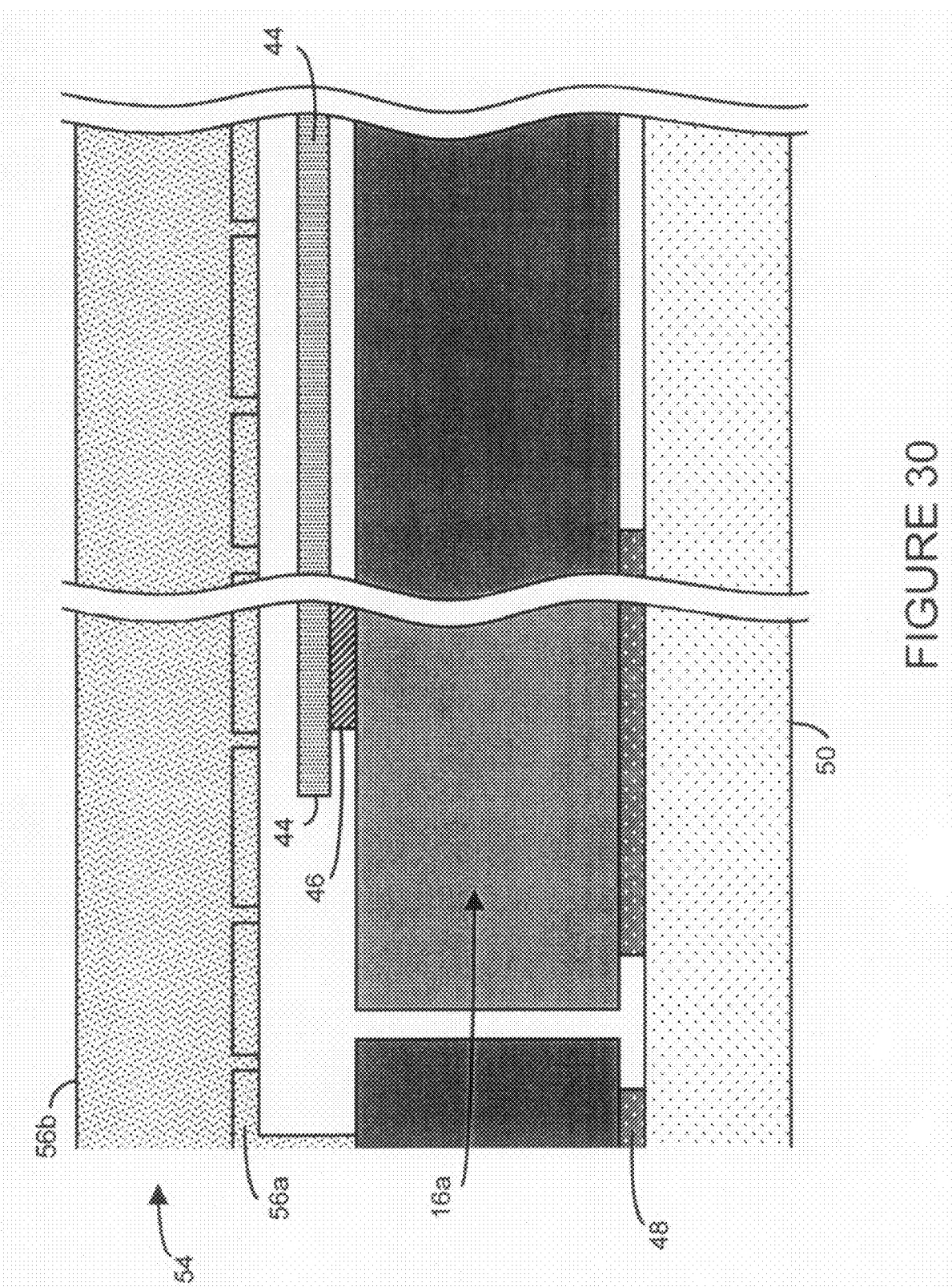
FIGS. 30, 31 and 32 illustrate three exemplary cross-sectional views of the resonator of FIG. 29, sectioned along dotted lines A-A'.
Figure 31:
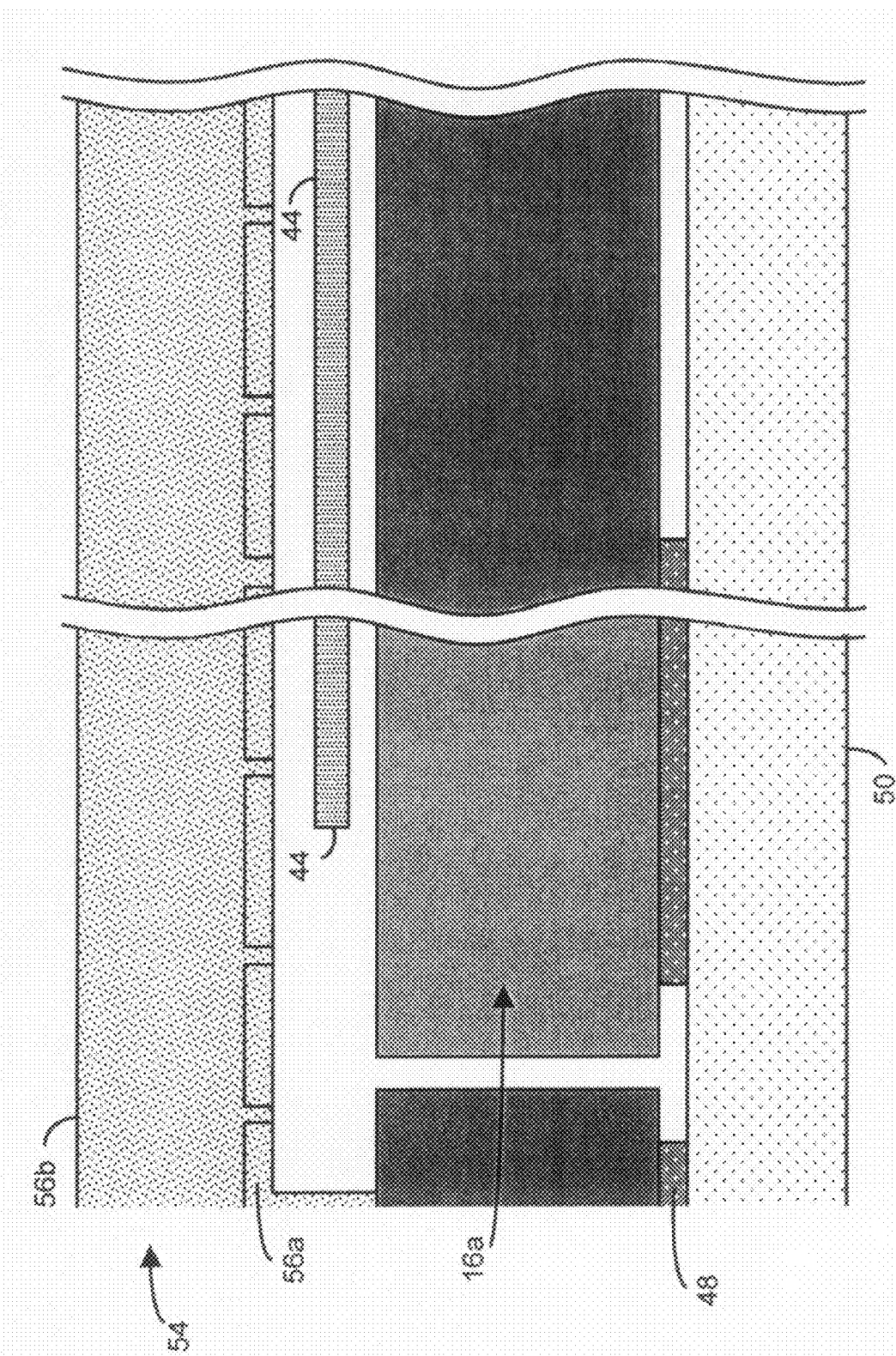

The heating element 44 may be selectively located in the chamber to provide focused, preferential and/or selective heating of moveable beam 14. For example, heating element 44 may be disposed above moveable beam 14 within the chamber. (See, for example, FIGS. 29, 30 and 31). In this regard, heating element 44 may be suspended above moveable beam 14 in a manner that provides both conduction and convection type heating (See, for example, FIG. 30). Moreover, in another embodiment, heating element 44 may be suspended above moveable beam 14 in a manner where there is less conductive type heating via anchor 16a. (See, for example, FIG. 31).

Figure 32:
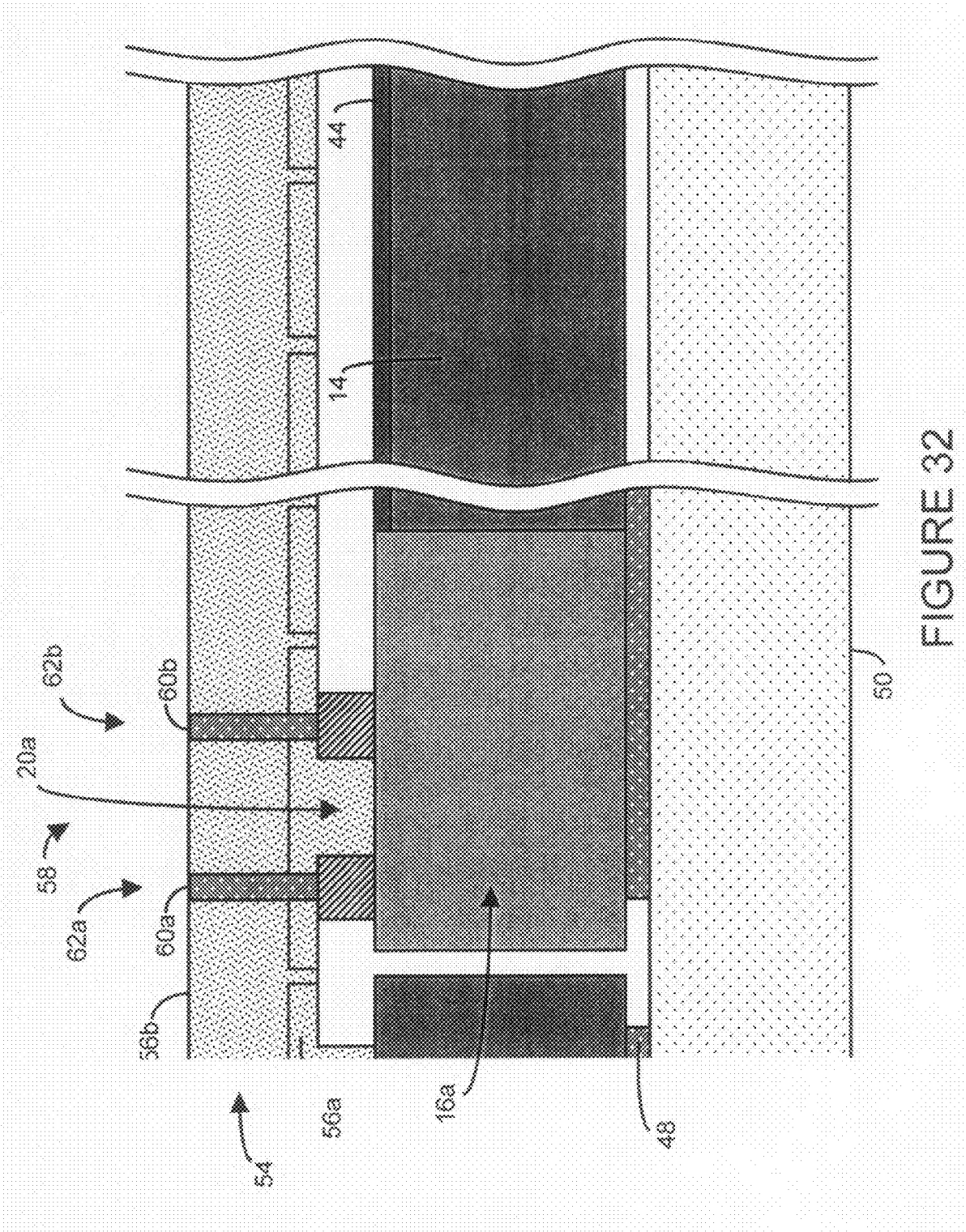

In yet another embodiment, heating element 44 is disposed in or on moveable beam 14 in order to provide conductive and/or resistive type heating. (See, for example, FIG. 32). In this regard, as described above with respect to FIGS. 2, 3A and 3B, heating element 44 may be formed in moveable beam 14 via doping with impurities having the same or an opposite conductivity relative to the impurities (if any) in within moveable beam 14. For example, moveable beam 14 may include n-type impurities (such as phosphorous or arsenic) and heating element 44 may be formed and/or created in or on moveable beam 14 by doping selected regions of moveable beam 14 with additional n-type impurities thereby providing a more heavily doped region. In this way, a substantial portion of the electrical current will pass through heating element 44 and, as such, provides both conductive and resistive type heating.

As mentioned above, alternatively, moveable beam 14 may be heavily counter-doped with p-type impurities (such as boron to create a p-type region) to form and/or create heating element 44. In this way, after formation of moveable beam 14 and through the use of selected voltages applied to moveable beam 14 and heating element 44, a reverse biased junction exists such that heating element 44 is electrically "isolated" from the remaining portion of moveable beam 14.

For the sake of brevity, the discussions with respect to FIGS. 2, 3A and 3B are not repeated here in detail; however, all of the inventions and embodiments (and permutations thereof are fully applicable to this aspect of the invention.

Figure 33:
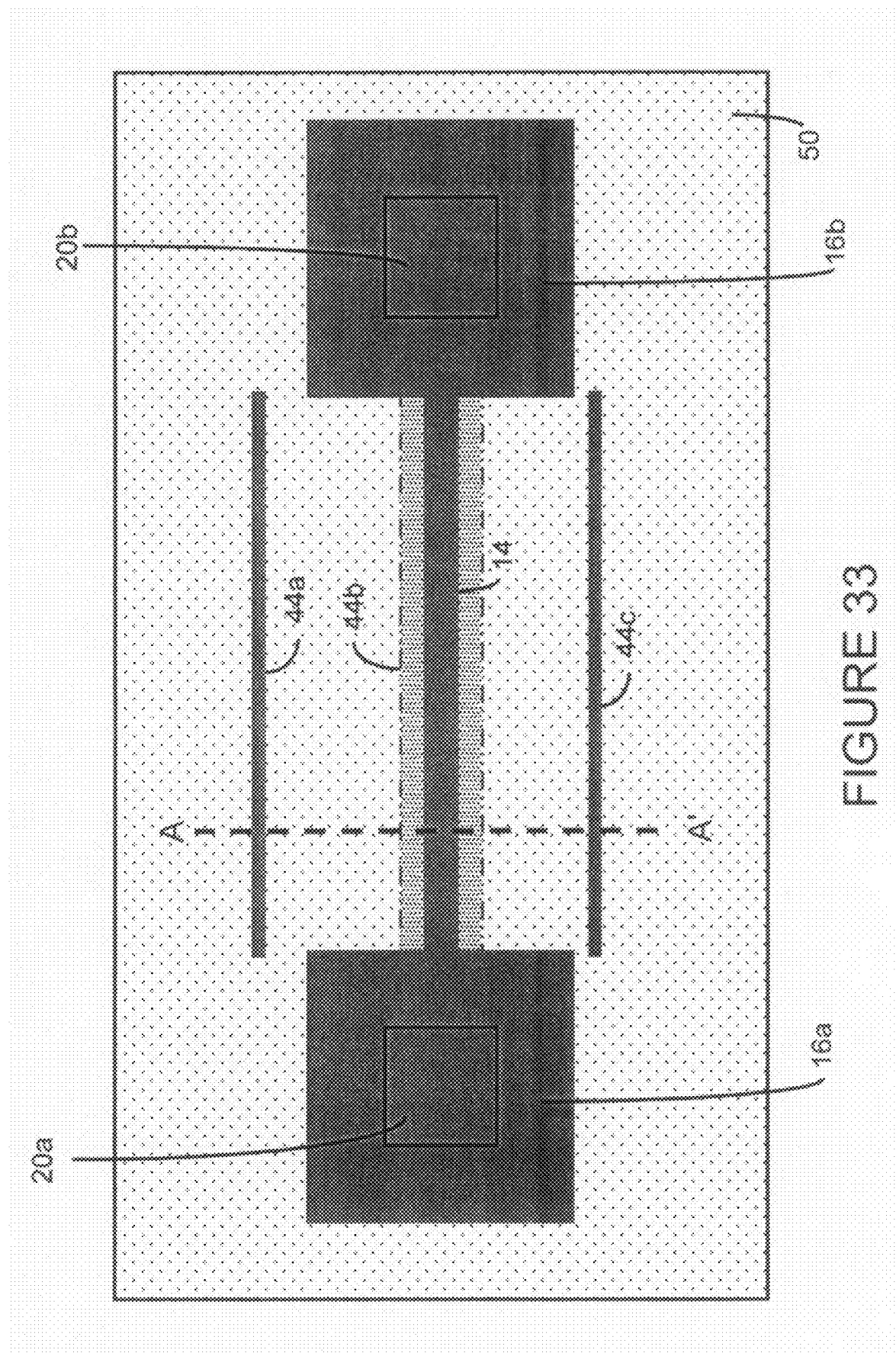
FIG. 33 illustrates a top view of a resonator, having a single oscillating beam, according to an embodiment of a third aspect of the present invention, wherein the heating element includes a plurality of heating elements (independently or dependently controlled) that are disposed in the chamber.
Figure 34:
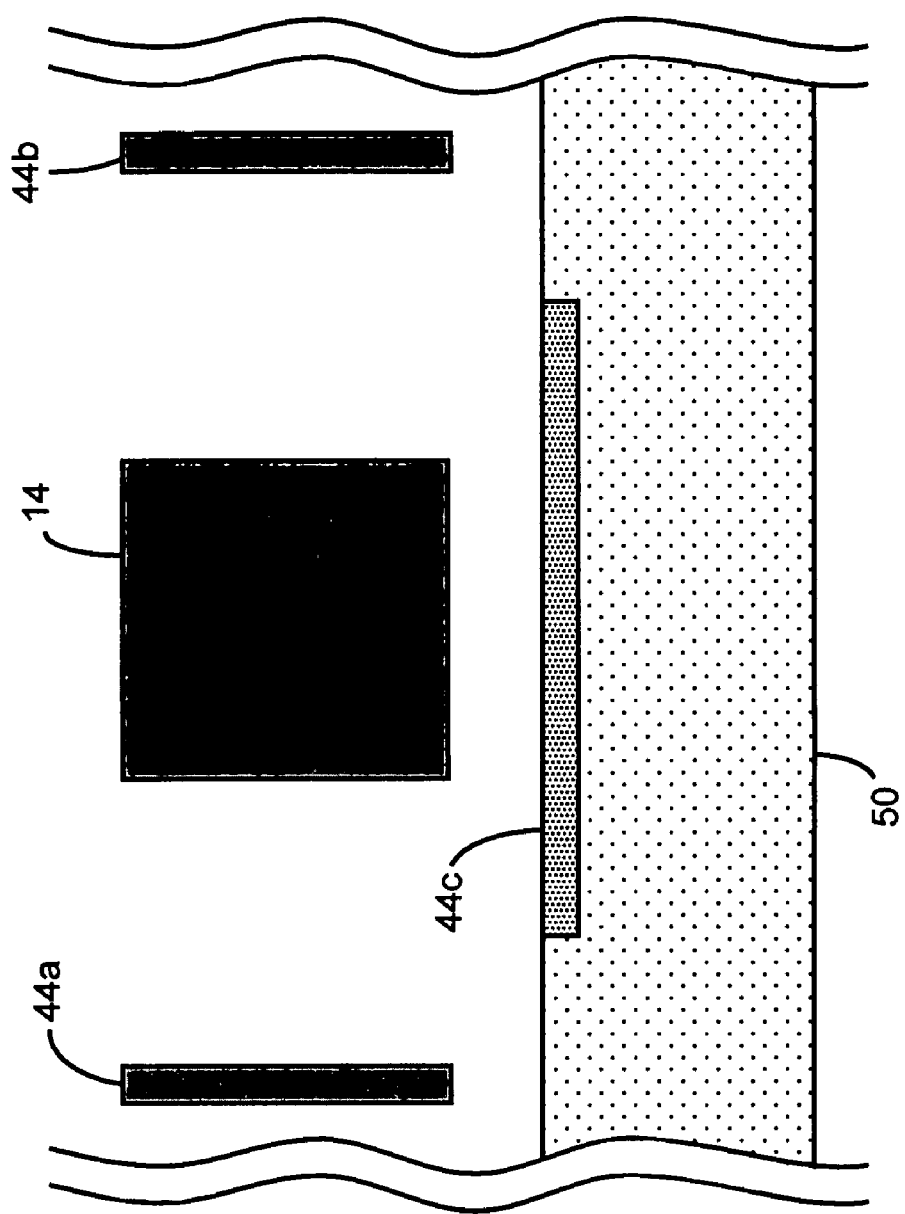
FIG. 34 illustrates an exemplary cross-sectional view of the resonator of FIG. 33, sectioned along dotted lines A-A'.
Figure 35:
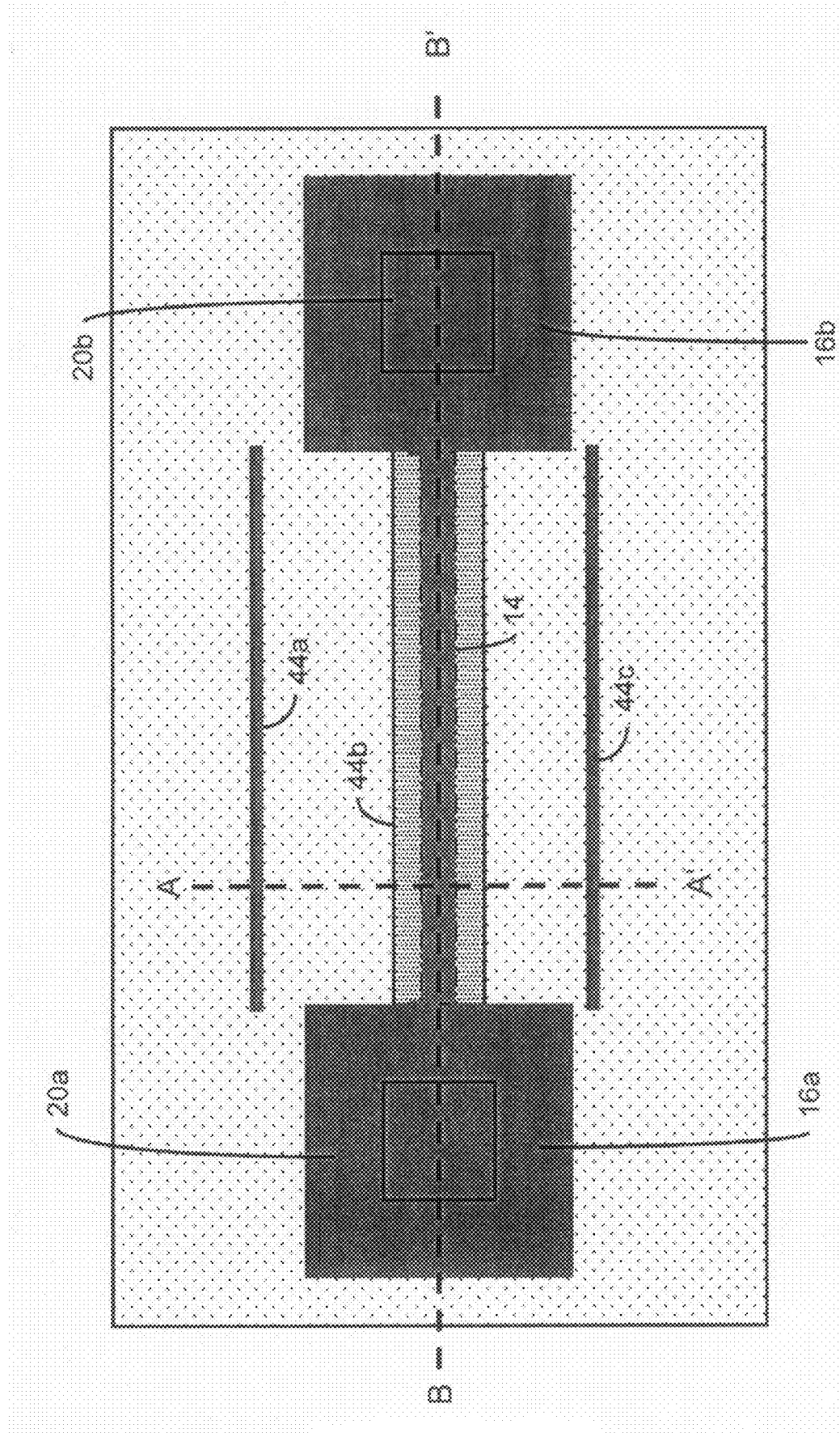
FIG. 35 is a top view of a resonator, having a single oscillating beam, according to an embodiment of a third aspect of the present invention, wherein the heating element includes a plurality of heating elements (independently or dependently controlled) that are disposed in the chamber.
Figure 36A:
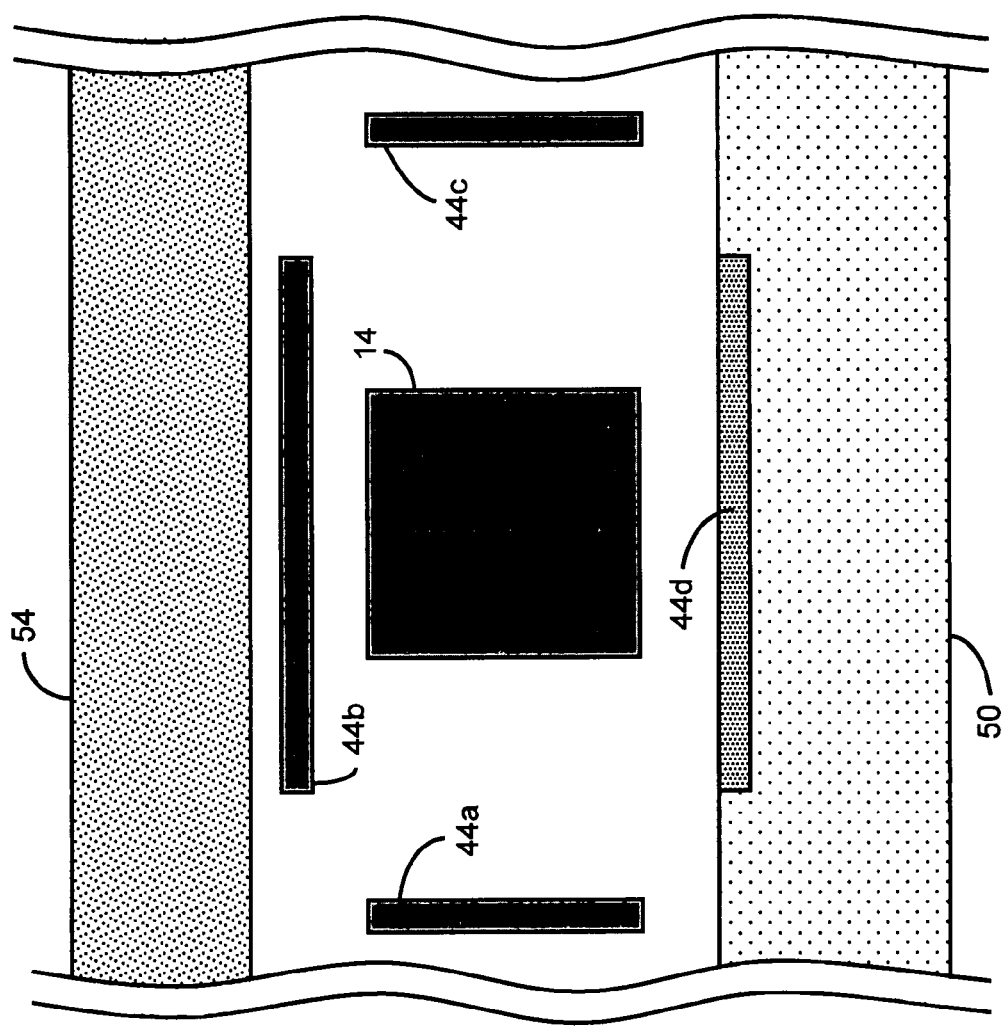
FIGS. 36A and 36B illustrate cross-sectional views of the resonator of FIG. 35, sectioned along dotted lines A-A' and B-B', respectively.
Figure 36B:
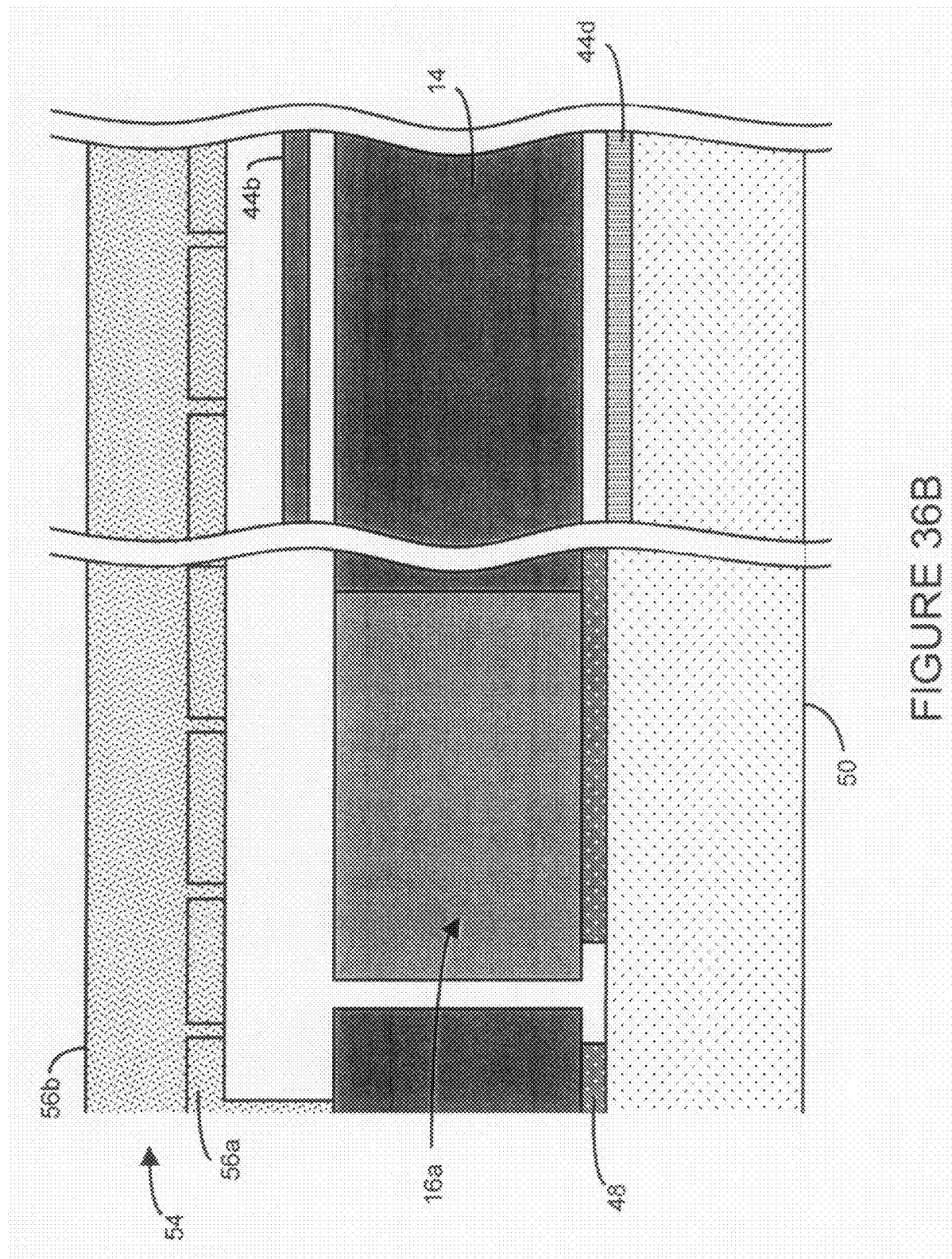
Figure 37:
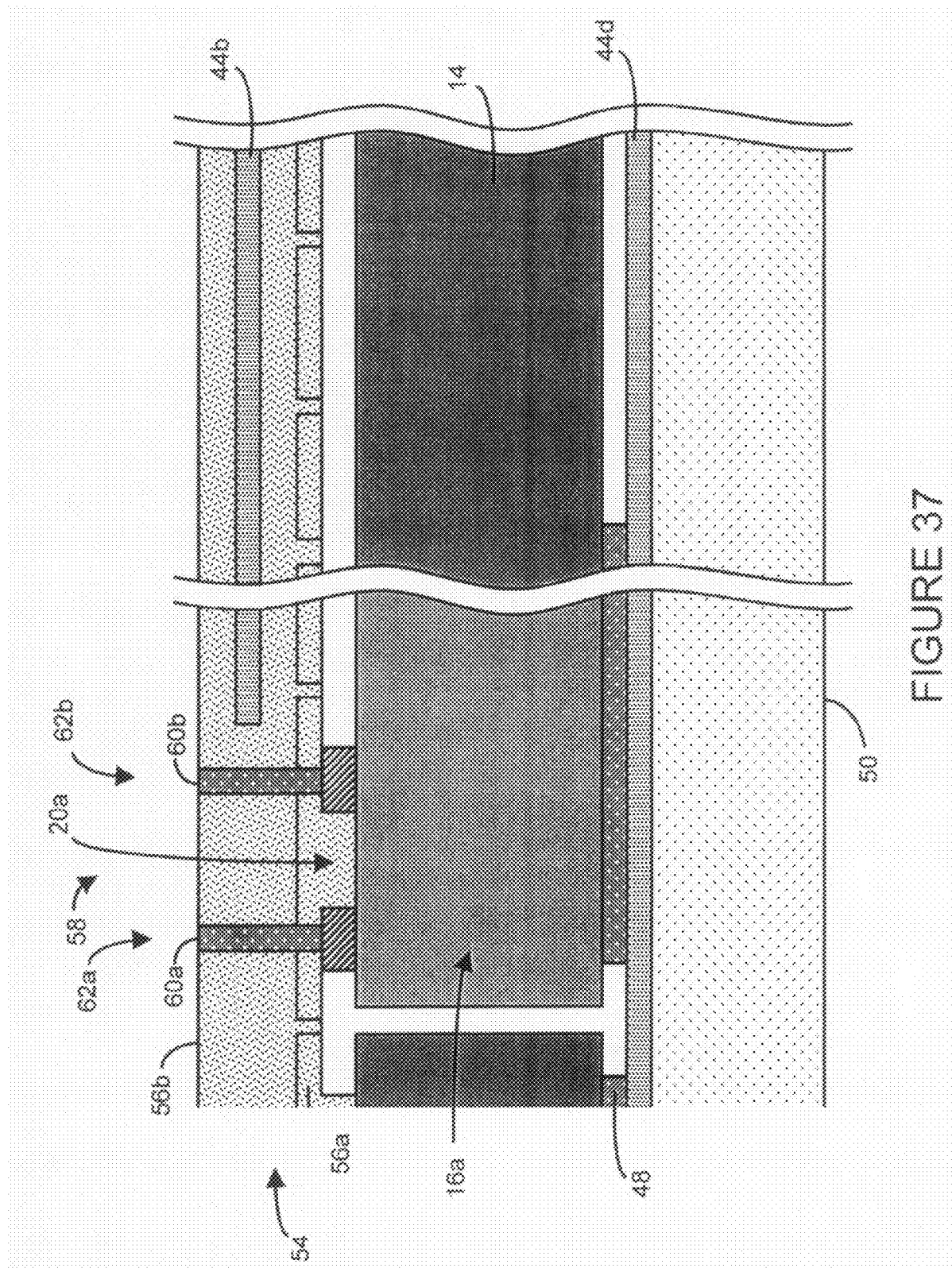
FIGS. 37 and 38 illustrate additional exemplary cross-sectional views of the resonator of FIG. 35, sectioned along dotted lines A-A'.
Figure 38:
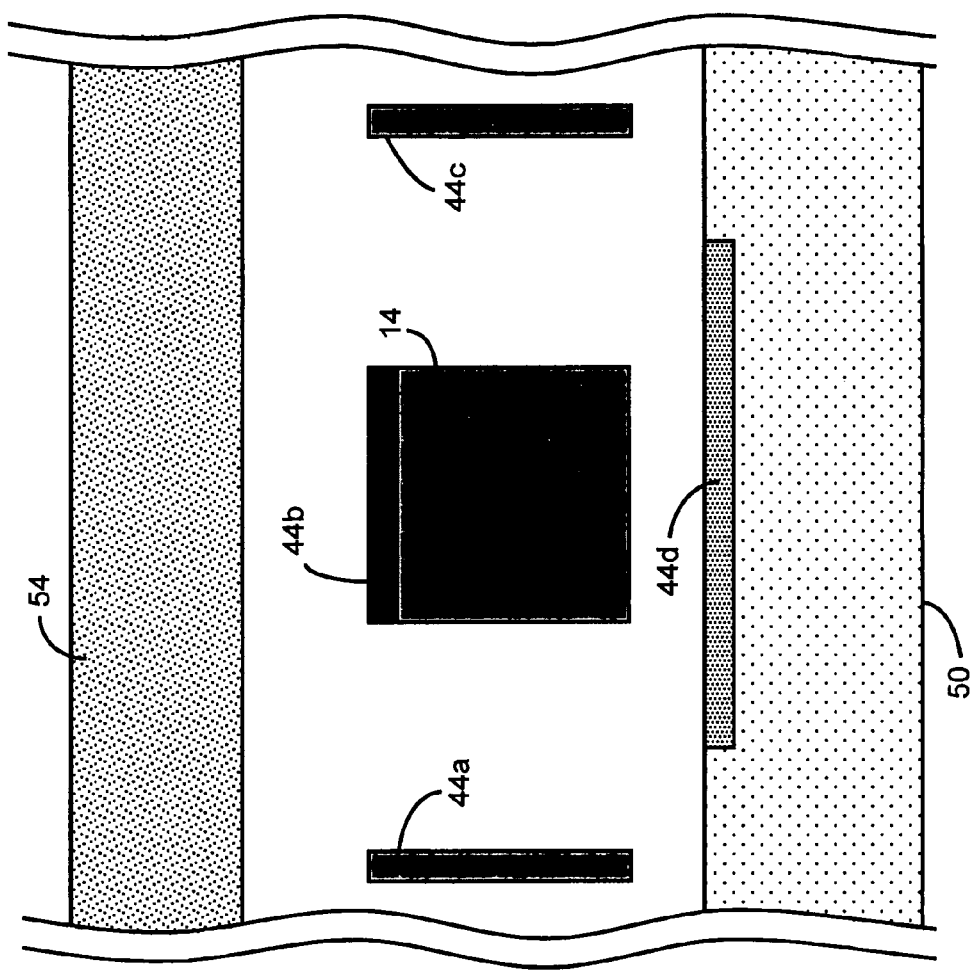
Figure 39A:
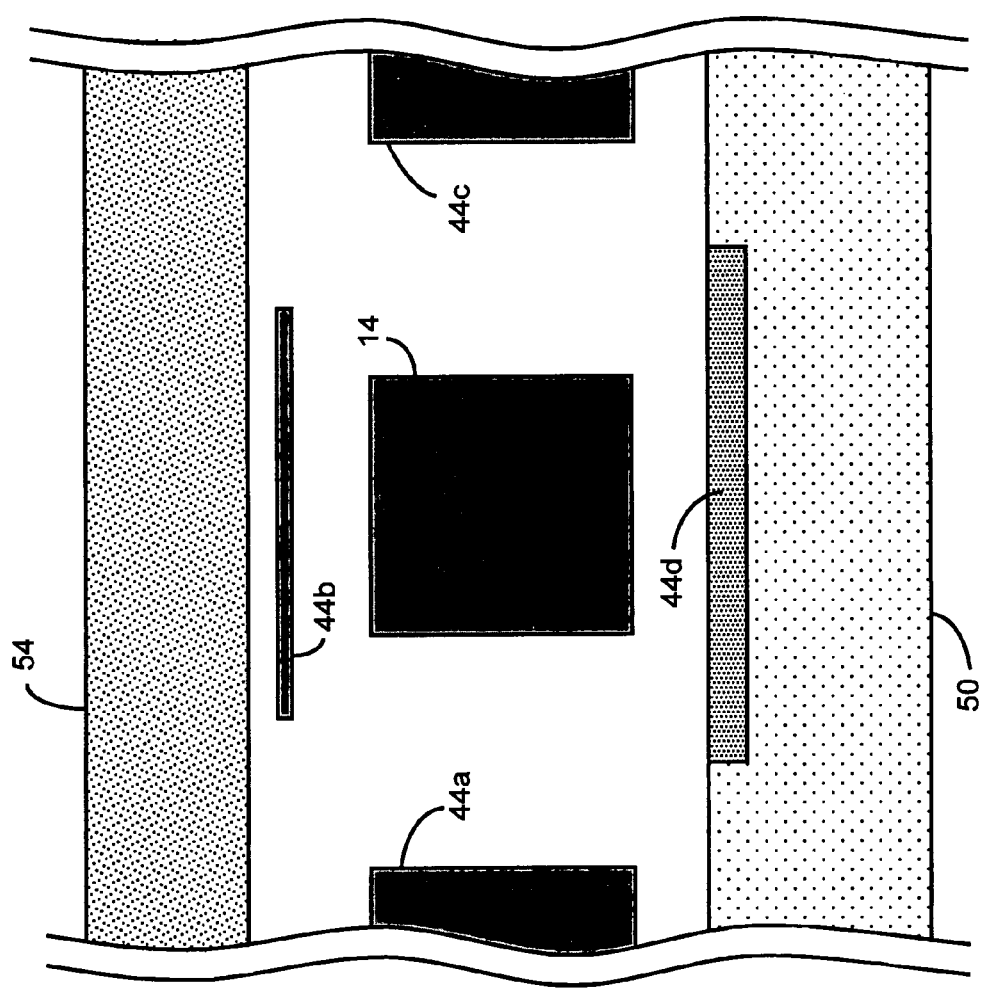
FIGS. 39A-39C illustrate exemplary cross-sectional views of the resonator including heating elements having various dimensions and configurations that are disposed in the chamber.
Figure 39B:
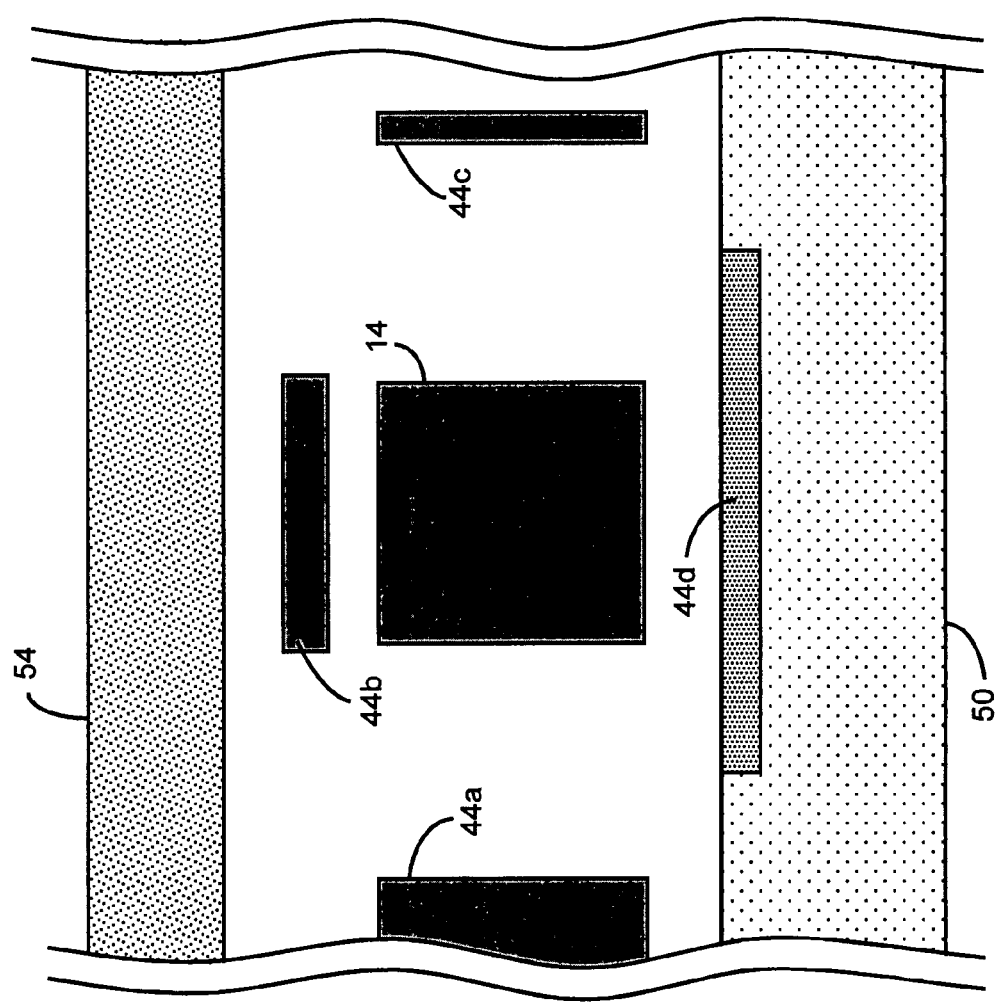
Figure 39C:
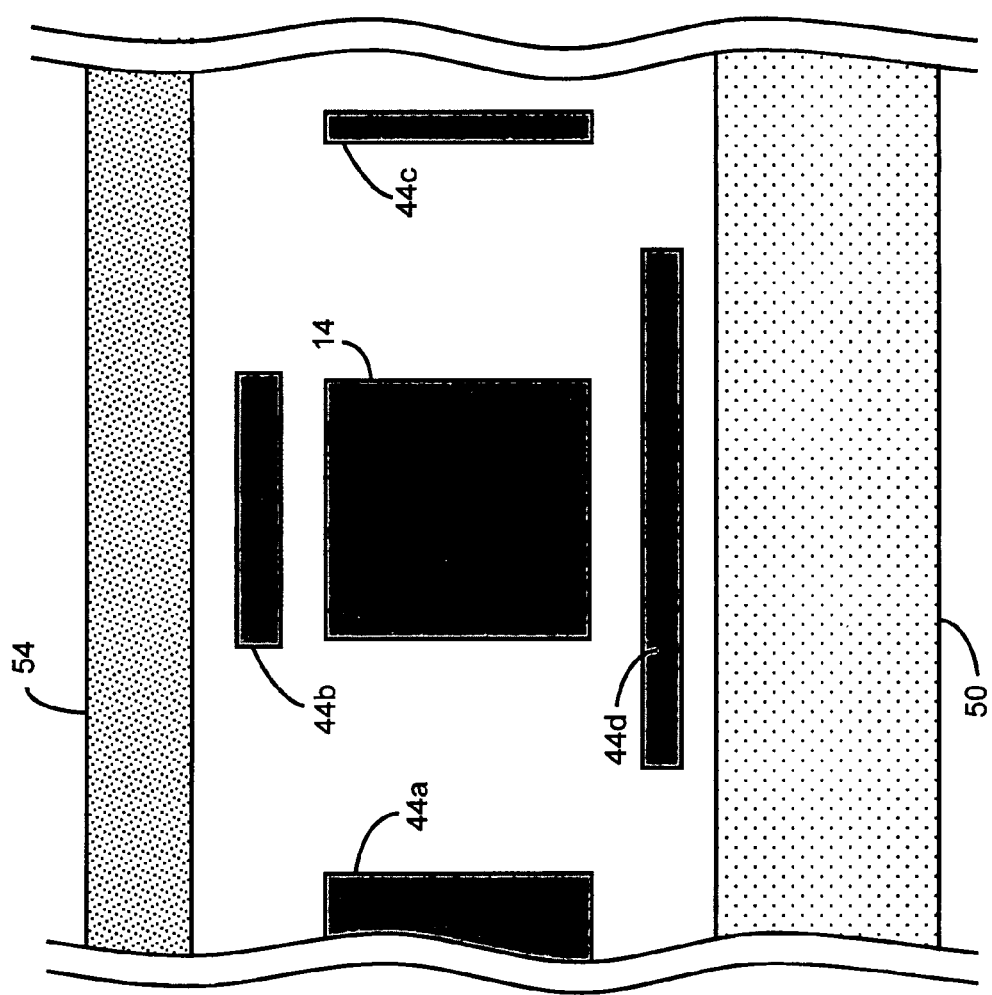
Figure 40:
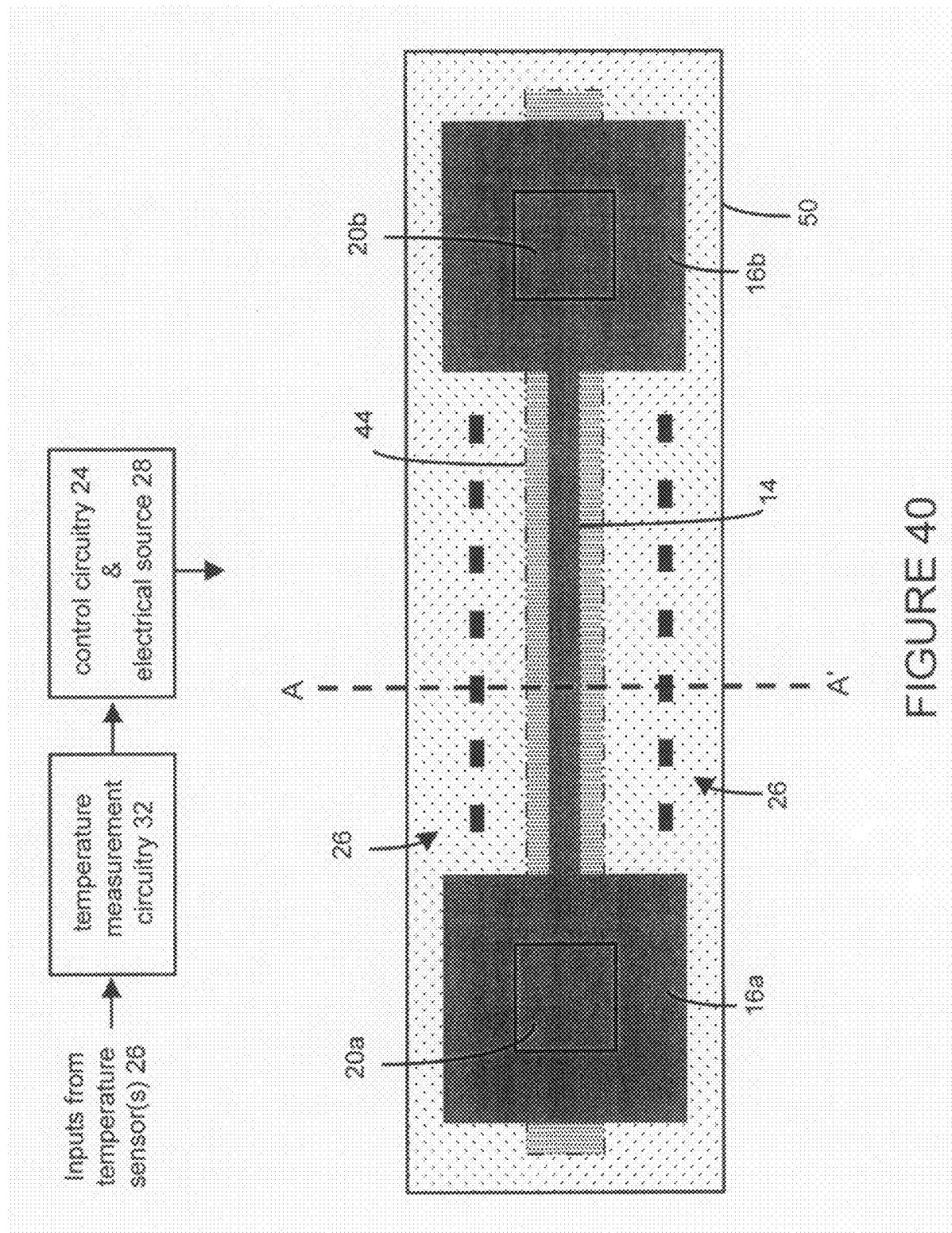
FIGS. 40, 42 and 43 illustrate top views of a resonator, having a single oscillating beam including physical/discrete temperature sensors disposed in or on the moveable beam and/or the anchors.
Figure 41:
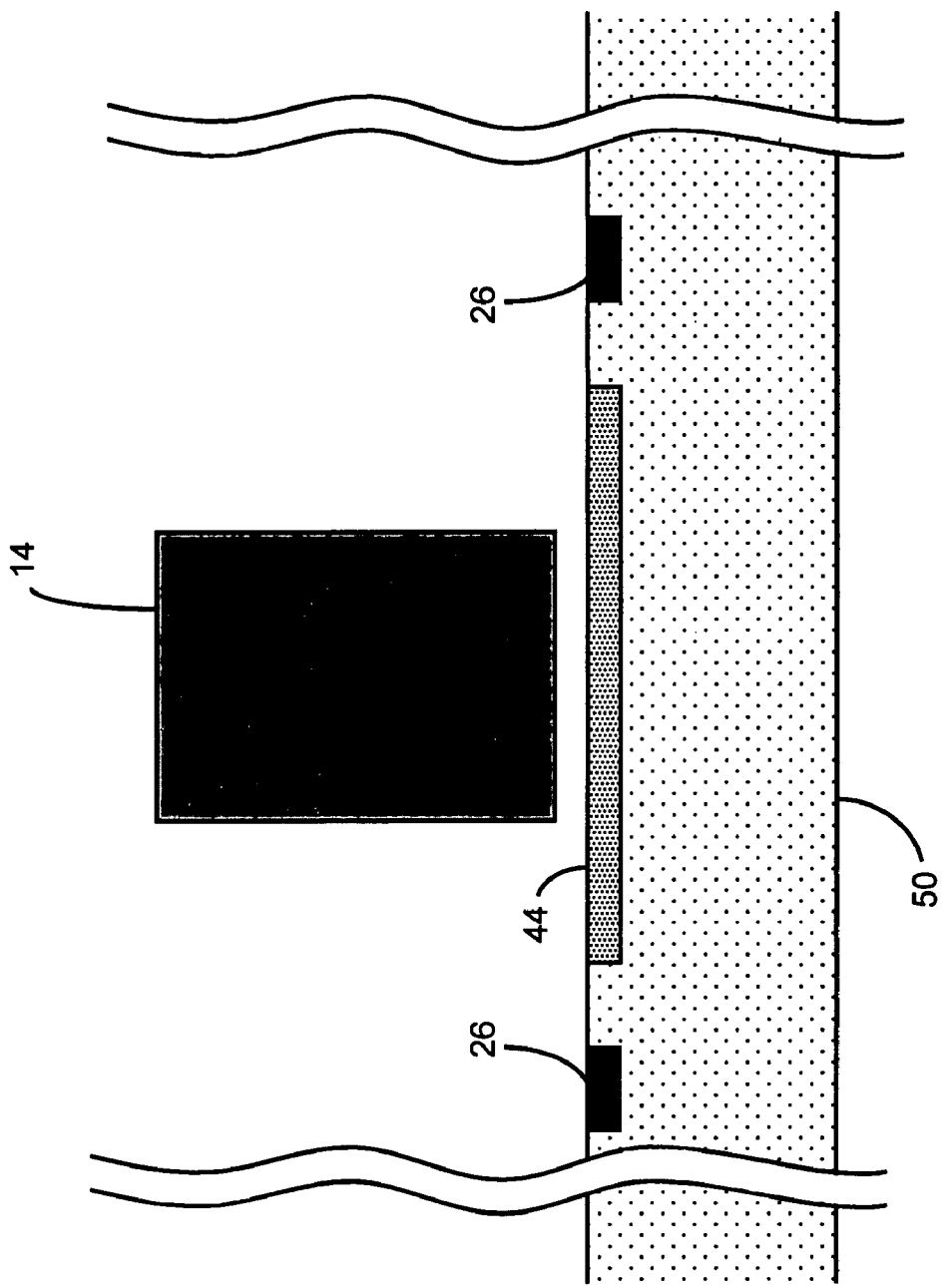
FIG. 41 illustrates an additional exemplary cross-sectional view of the resonator and temperature sensors of FIG. 40, sectioned along dotted lines A-A'.
Figure 42:
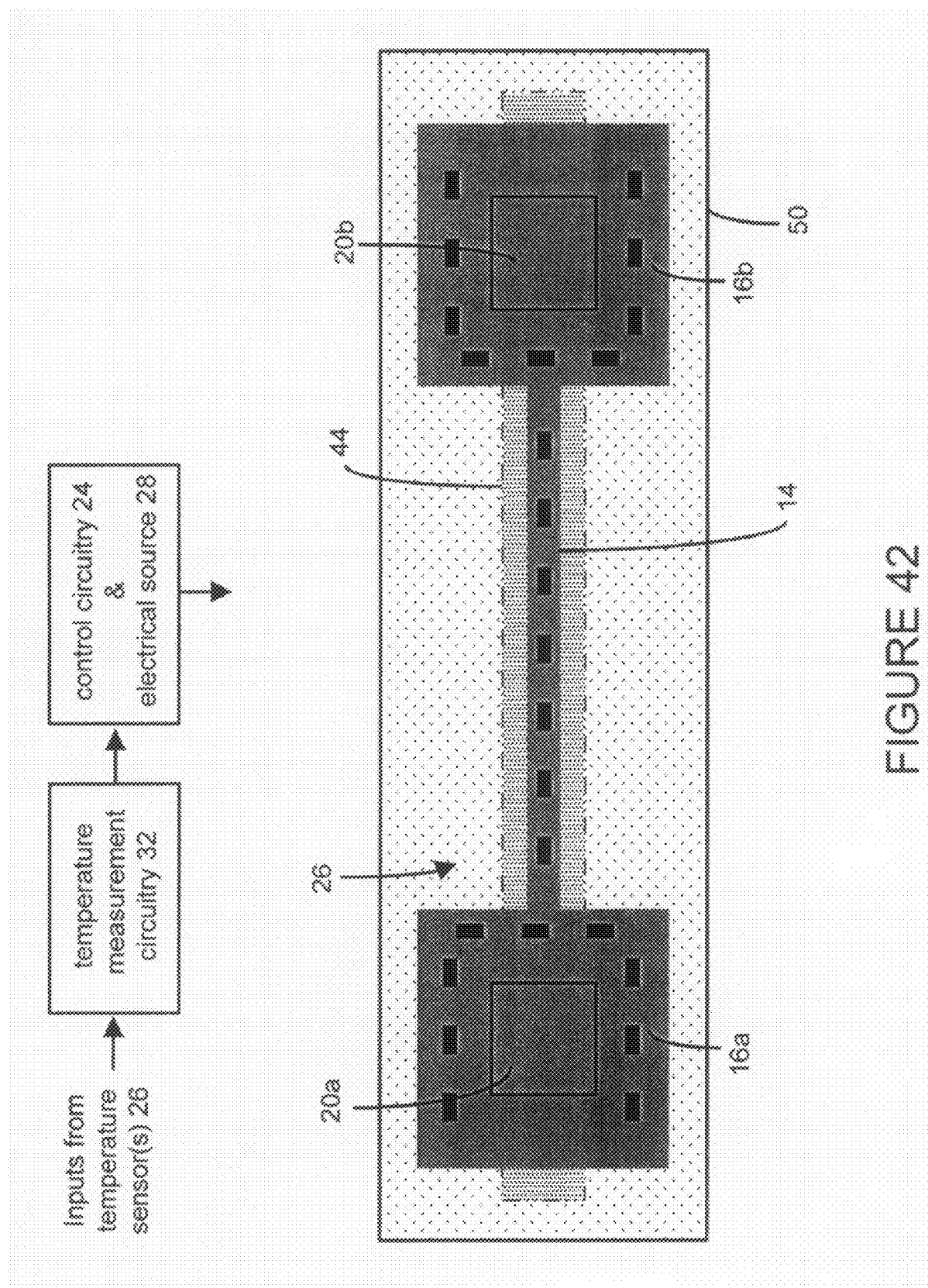
Figure 43:
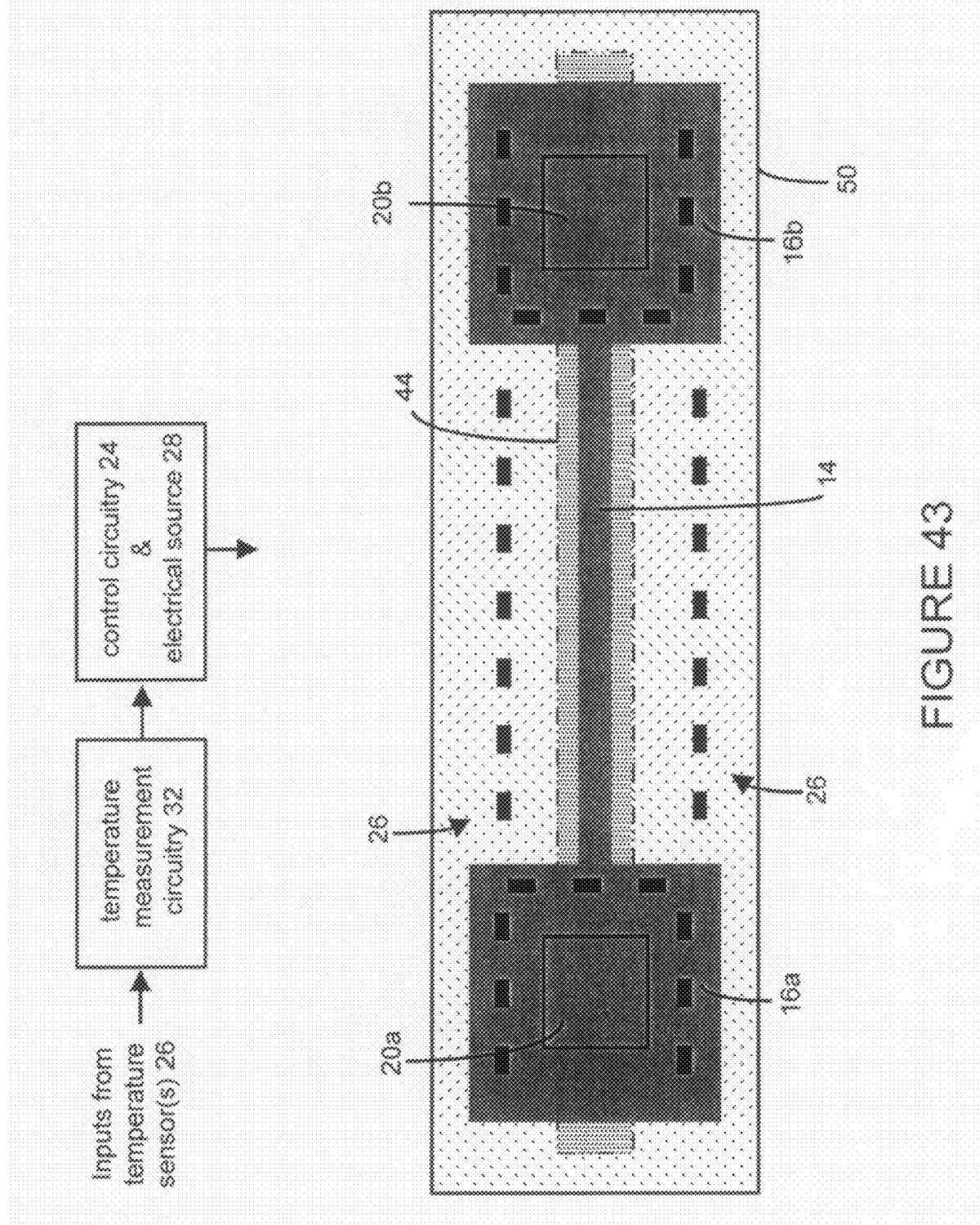

In another embodiment, heating element 44 includes a plurality of elements in or on the chamber within which mechanical structure 12 is contained. For example, with reference to FIGS. 33 and 34, in one embodiment, heating elements 44a-c are located in the chamber to provide focused, preferential and/or selective heating of moveable beam 14. In this way, control circuitry 24 (not illustrated) may precisely control one or more electrical source(s) 28 (not illustrated) to adjust/control the current flow through heating elements 44a, 44b and/or 44c in order to maintain moveable beam 14 (for example, the entire length of moveable beam 14) at a constant (or relatively constant) and/or predetermined or desired temperature or temperatures.

With reference to FIGS. 35, 36A, 36B, 37 and 38, in another embodiment, heating elements 44a-d may be located in the chamber and/or within the "walls" of the chamber wherein moveable beam 14 is conductively and/or resistively heated from a plurality of directions. In particular, with reference to FIGS. 35, 36A and 36B, heating elements 44a-d may be positioned and/or located in the chamber to provide focused, preferential and/or selective heating of moveable beam 14. As mentioned above, control circuitry 24 may precisely control the temperature of moveable beam 14 (for example, the entire length of moveable beam 14) to maintain the temperature thereof at a constant (or relatively constant) and/or predetermined or desired temperature or temperatures.

Notably, heating elements 44 may be disposed in or on the chamber in which mechanical structure 12 resides. For example, heating elements 44 may be disposed in encapsulation structure 54 (see, for example, heating element 44b in FIG. 37). Further, heating element 44 may provide heating to both anchor 16 and moveable beam 14 (see, for example, heating element 44d in FIG. 37). Moreover, heating elements 44 may provide resistive and/or conductive heating. (See, for example, heating element 44b in FIG. 38). Indeed, heating elements 44 may be formed having different sizes, shapes, widths and/or lengths. (See, for example, heating elements 44a-d in FIG. 36B, 37, 39A-C).

As mentioned above, control circuitry 24 determines and/or calculates the electrical current necessary to maintain and/or control the operating temperature of mechanical structure 12 and, in turn, provide a predetermined, selected, desired and/or defined output frequency over, for example, a range of ambient temperatures. The control circuitry 24 employs information/data from temperature sensors 26 (for example, diodes, transistors, resistors or varistors, and/or one or more MEMS temperature transducers which are disposed and/or located on or in the substrate of MEMS resonator 10) to appropriately control electrical source 28.

In one embodiment, temperature sensors 26 may be employed on and/or in close proximity to moveable beam 14 and/or anchor 20 to measure, sense and/or sample information of the actual temperature of moveable beam 14. (See, for example, FIGS. 40, 41, 42 and 43). The temperature sensors 26 provide the information of the actual temperature of moveable beam 14 to control circuitry 24. In this way, control circuitry 24 may determine or calculate the operating temperature of moveable beam 14 and, in response, control and/or instruct electrical source 28 to apply or provide a current through heating element(s) 44 to thereby resistively and/or conductively heat moveable beam 14 via resistive heating of heating element(s) 44 and/or moveable beam 14. The control circuitry 24 may compare the actual operating temperature to the predetermined, selected and/or desired operating temperature using one of a number of conventional feedback and/or control techniques, as discussed in detail above.

The control circuitry 24 (in conjunction with temperature measurement circuitry 32) may periodically, intermittently and/or continuously sample, inspect, measure and/or evaluate the operating temperature of moveable beam 14 in order to detect, determine or predict a change in the output frequency of MEMS resonator 10. In this way, the control of the operating temperature of moveable beam 14 is enhanced. That is, by periodically, intermittently and/or continuously determining a resistance value of moveable beam 14 in relation to the temperature measuring current and/or temperature measuring voltage, and using the resistance value to calculate an approximate operating temperature, a temperature feedback circuit is implemented. (See, for example, FIGS. 7, 8A and 8B).

The control circuitry 24 may use the data/information which is representative of the operating temperature of moveable beam 14 to control electrical source 28. In this regard, electrical source 28 may change and/or modify the current applied through heating element(s) 44 and thereby adjust the operating temperature of moveable beam 14. Thus, in one embodiment, the resistance of the beam structure is used as a form of temperature feedback information. The temperature feedback information is used to control the heating currents applied to electrical contacts 20.

Notably, as mentioned above, electrical contacts 20a and 20b may be employed to facilitate measuring, detecting and/or sampling the temperature of moveable beam 14. In this regard, temperature measurement circuitry 32 may be coupled to electrical contacts 20a and 20b to measure, detect and/or sample the electrical resistance of moveable beam 14. This control circuitry 24 may determine and/or calculate the operating temperature of moveable beam 14 using the resistance of moveable beam 14, for a given measurement current.

As mentioned above, there are many techniques and/or configurations for detecting, sampling, measuring and/or evaluating the operating temperature of moveable beam 14. For example, control circuitry 24 may employ a look-up table and/or a predetermined or mathematical relationship (contained in memory) to adjust and/or control the heating of certain beam structures (for example, moveable beam 14) of MEMS resonator 10 to compensate and/or correct for changes in ambient temperature (i.e., the temperature of MEMS resonator 10). As also mentioned above, all techniques and/or configurations, whether now known or later developed, including those discussed above, are intended to be within the scope of the present invention.

Moreover, in this aspect of the present inventions, MEMS resonator 10 may employ any type of design and/or control of mechanical structure 12. For example, mechanical structure 12 may be configured in a cantilever, tuning fork beam structure that includes one or more moveable electrodes, or may be configured as illustrated in FIGS. 6, 9-11. Indeed, MEMS resonator 10 of this aspect of the present invention may also employ the compensation configurations and techniques described and illustrated in relation to FIGS. 12A-D.

Figure 44A:
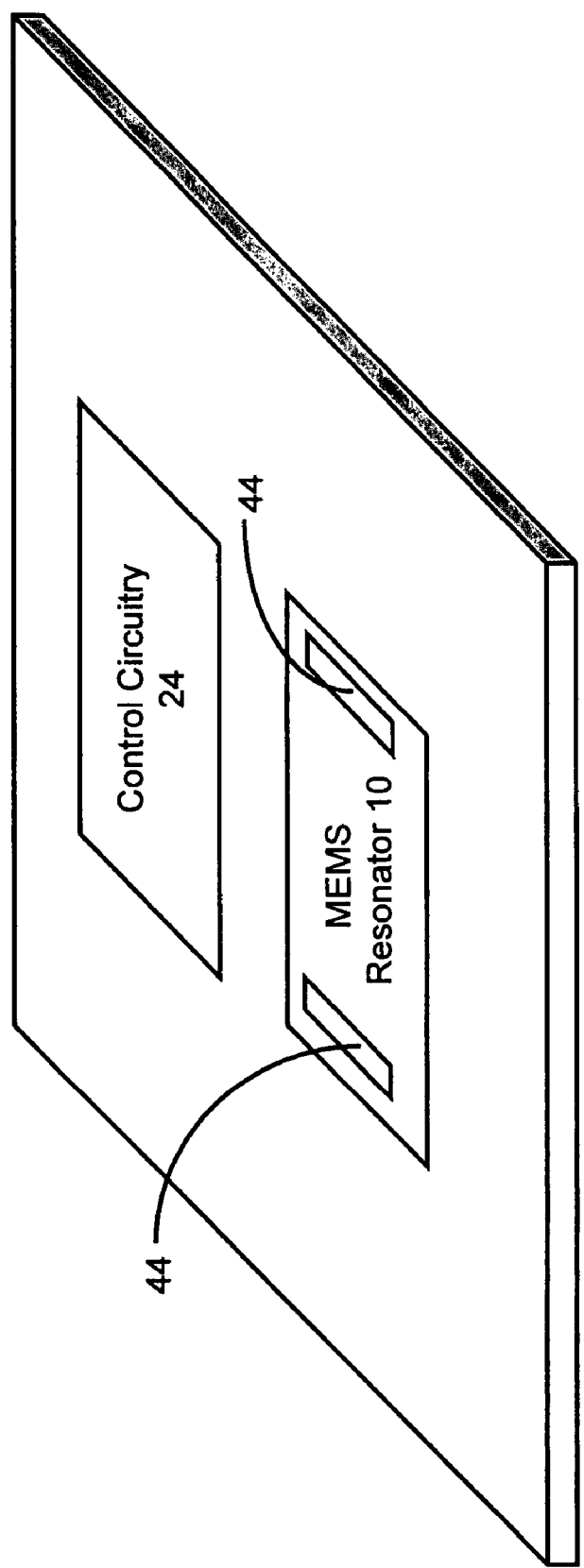
FIGS. 44A-44D are block diagram representations of exemplary MEMS including a resonator, electrical/electronic circuitry, heating elements and/or temperature sensors, integrated on a common substrate, according to certain aspects of the present inventions.
Figure 44B:
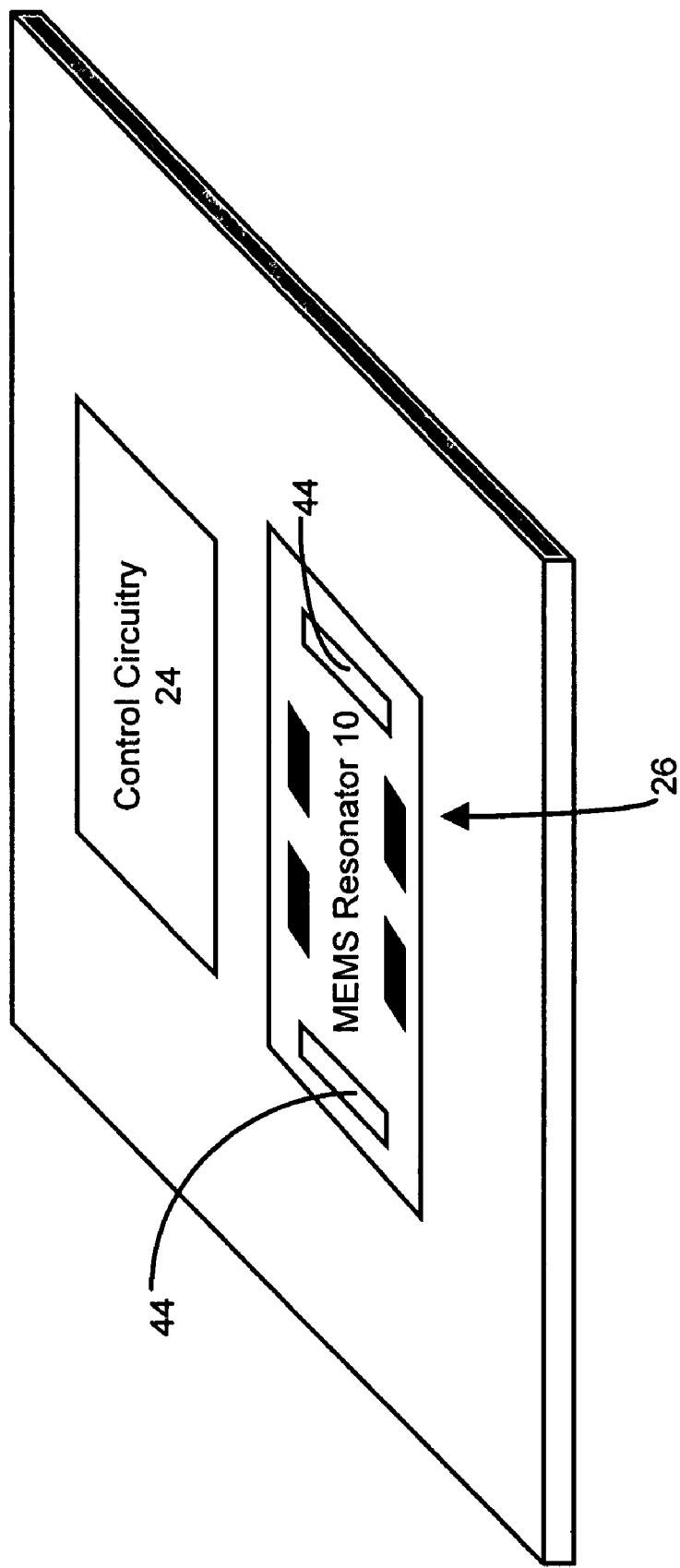
Figure 44C:
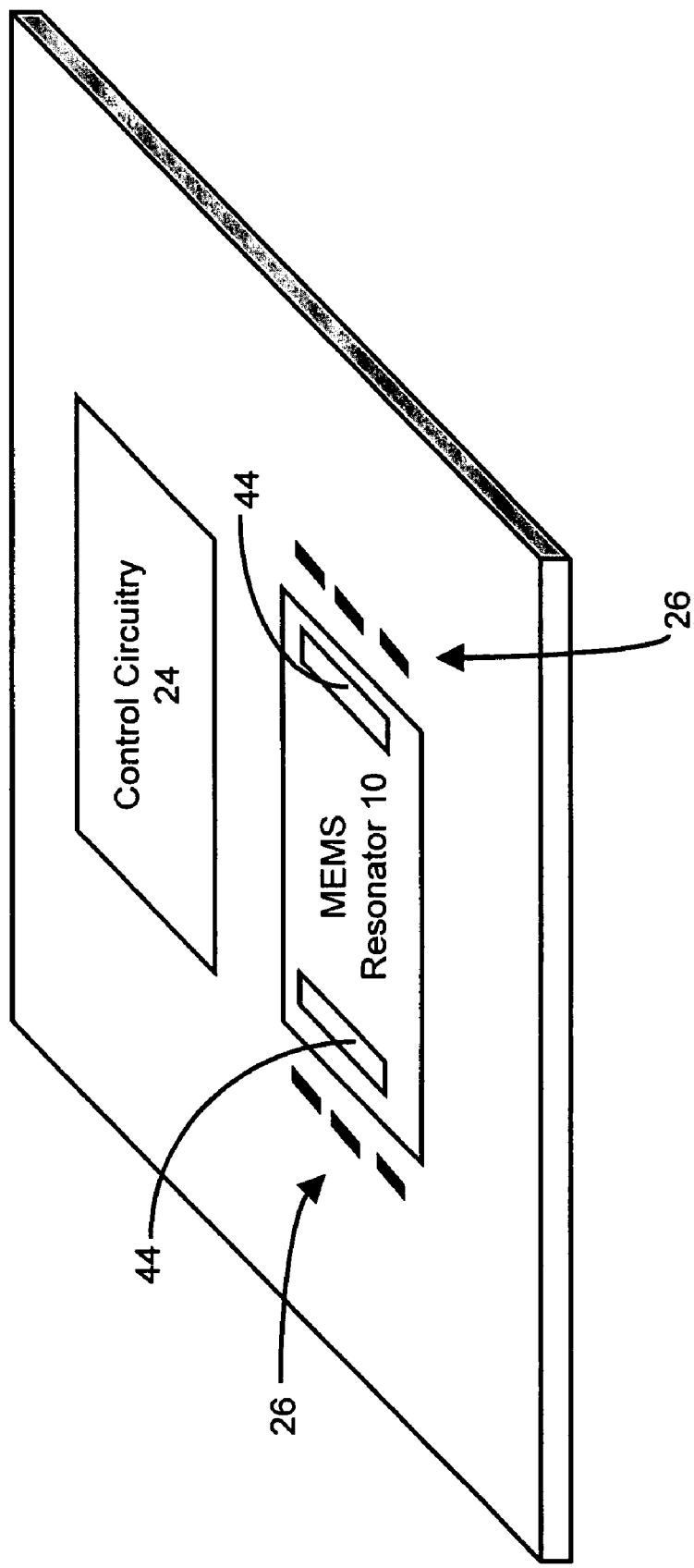
Figure 44D:
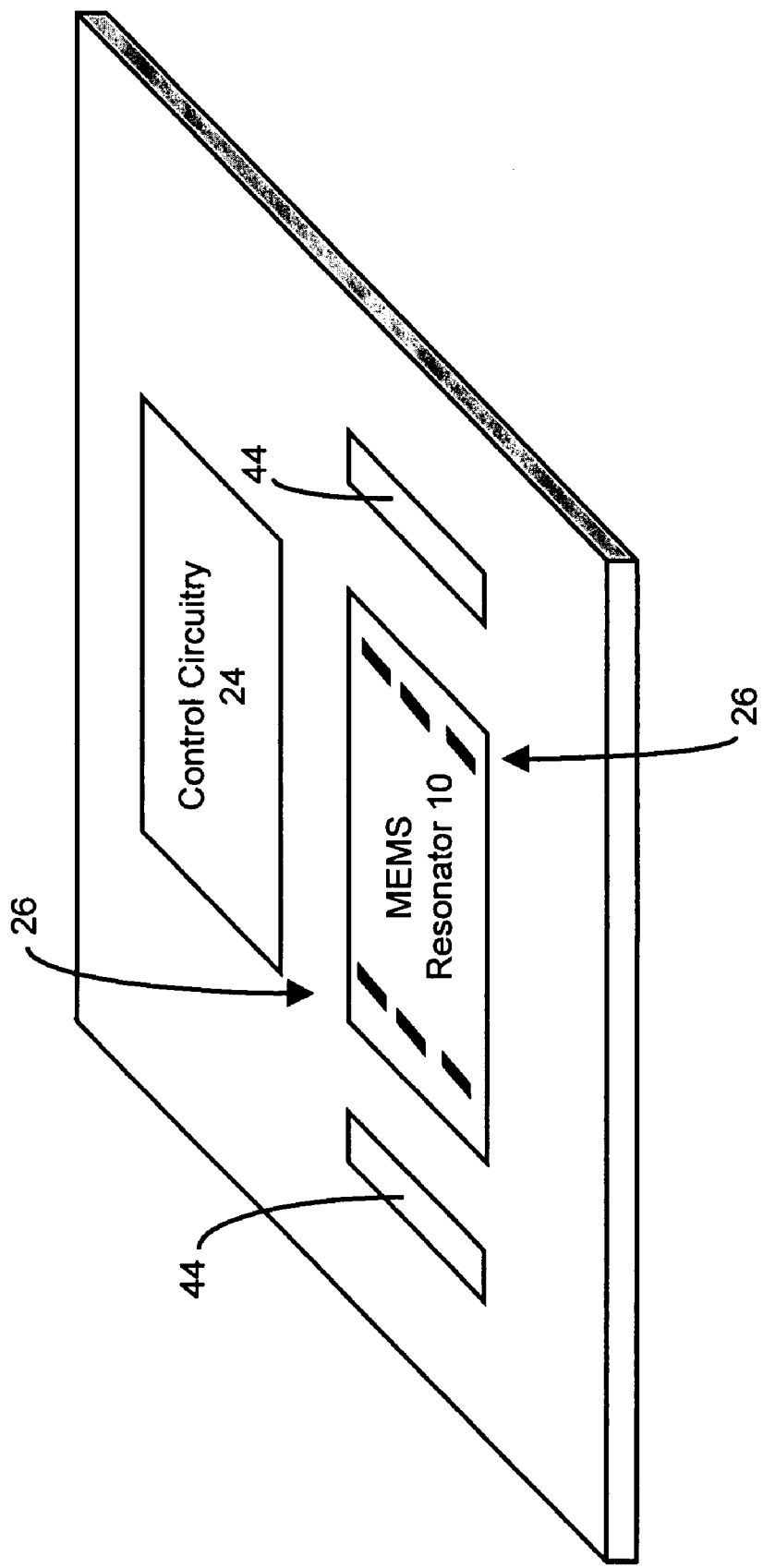
Figure 44E:
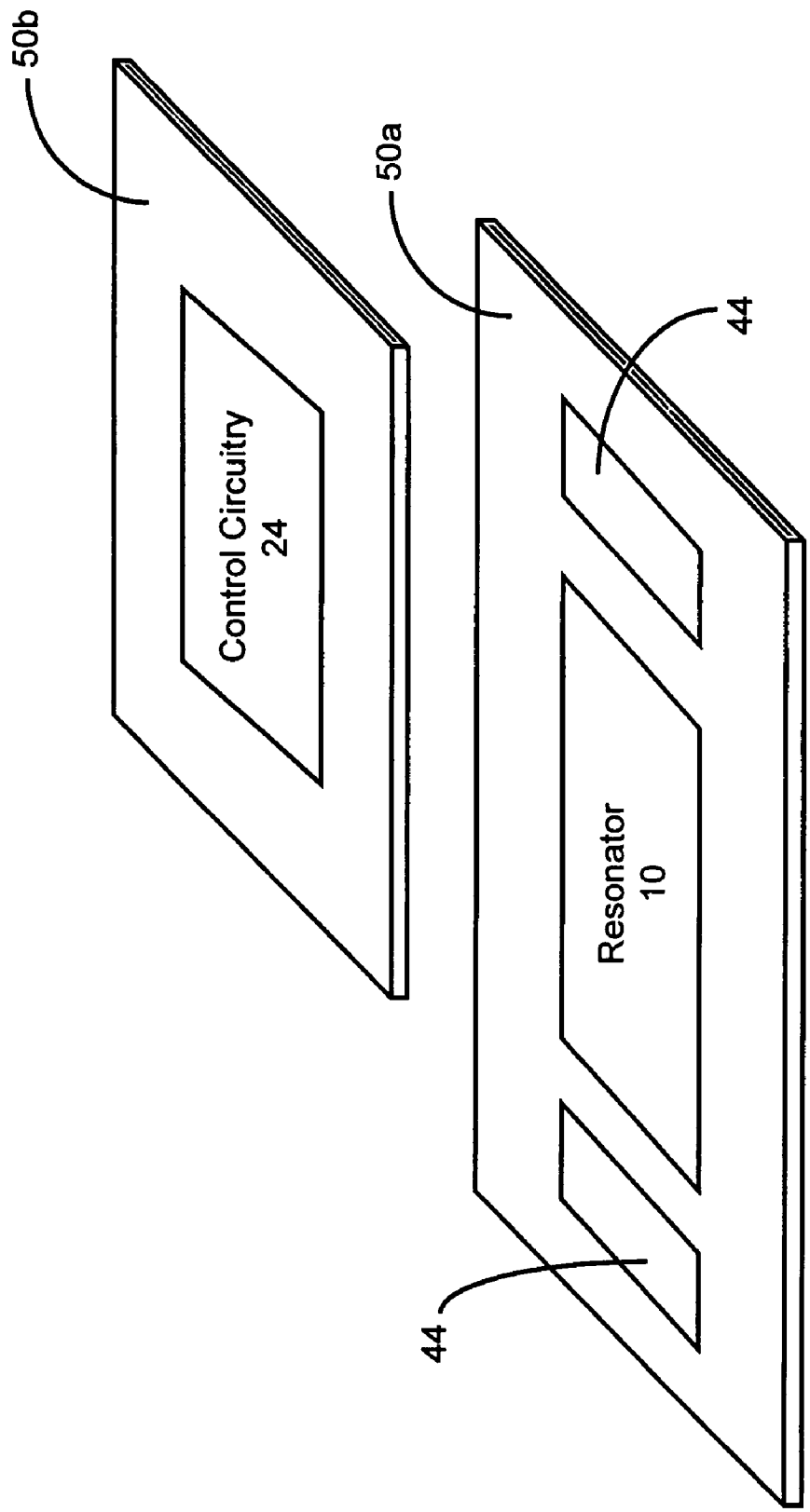
FIGS. 44E-44G are block diagrams of exemplary MEMS including mechanical structures and processing and control circuitry disposed on separate substrates, according to certain aspects of the present invention.
Figure 44F:
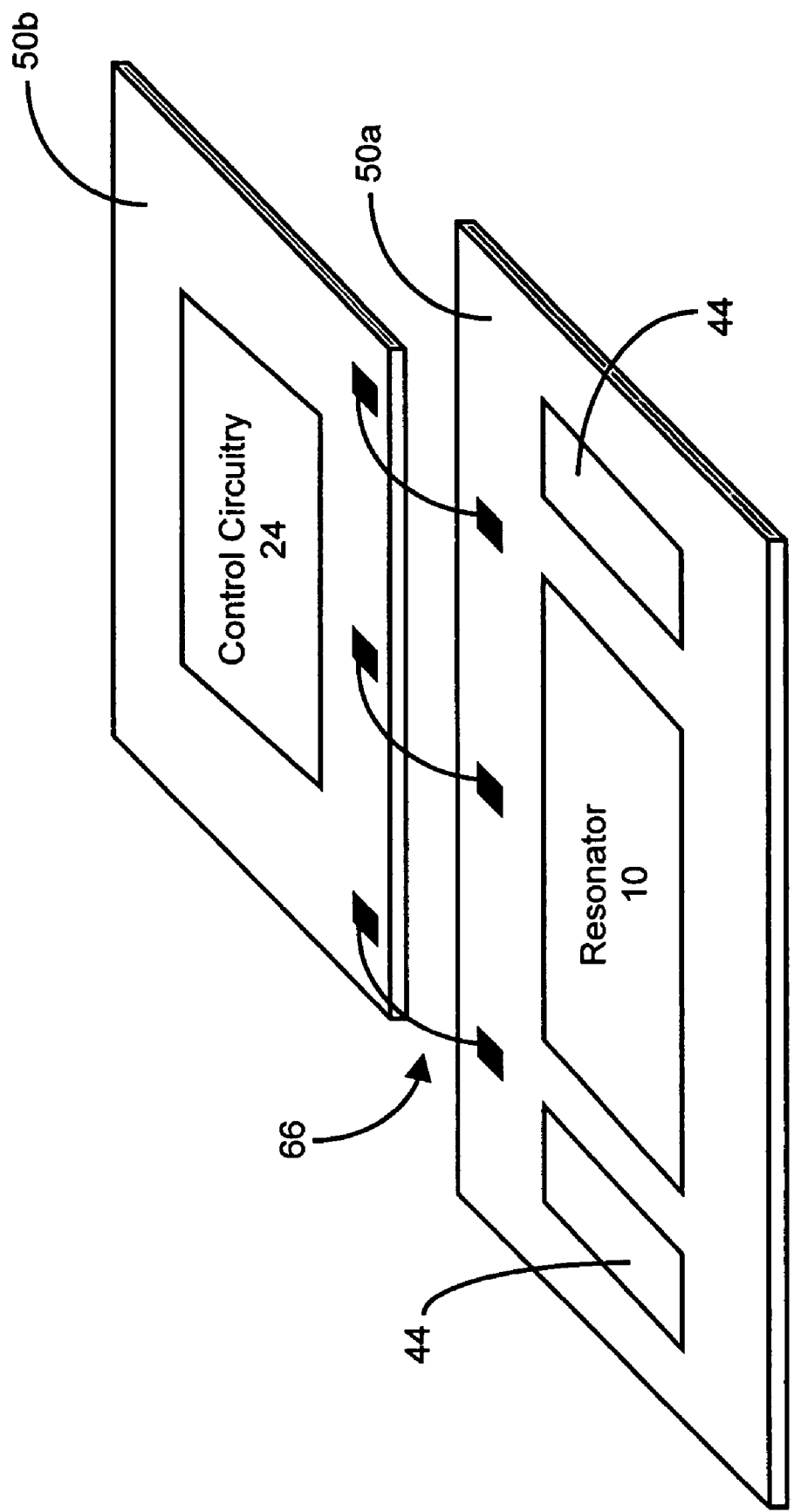
Figure 44G:
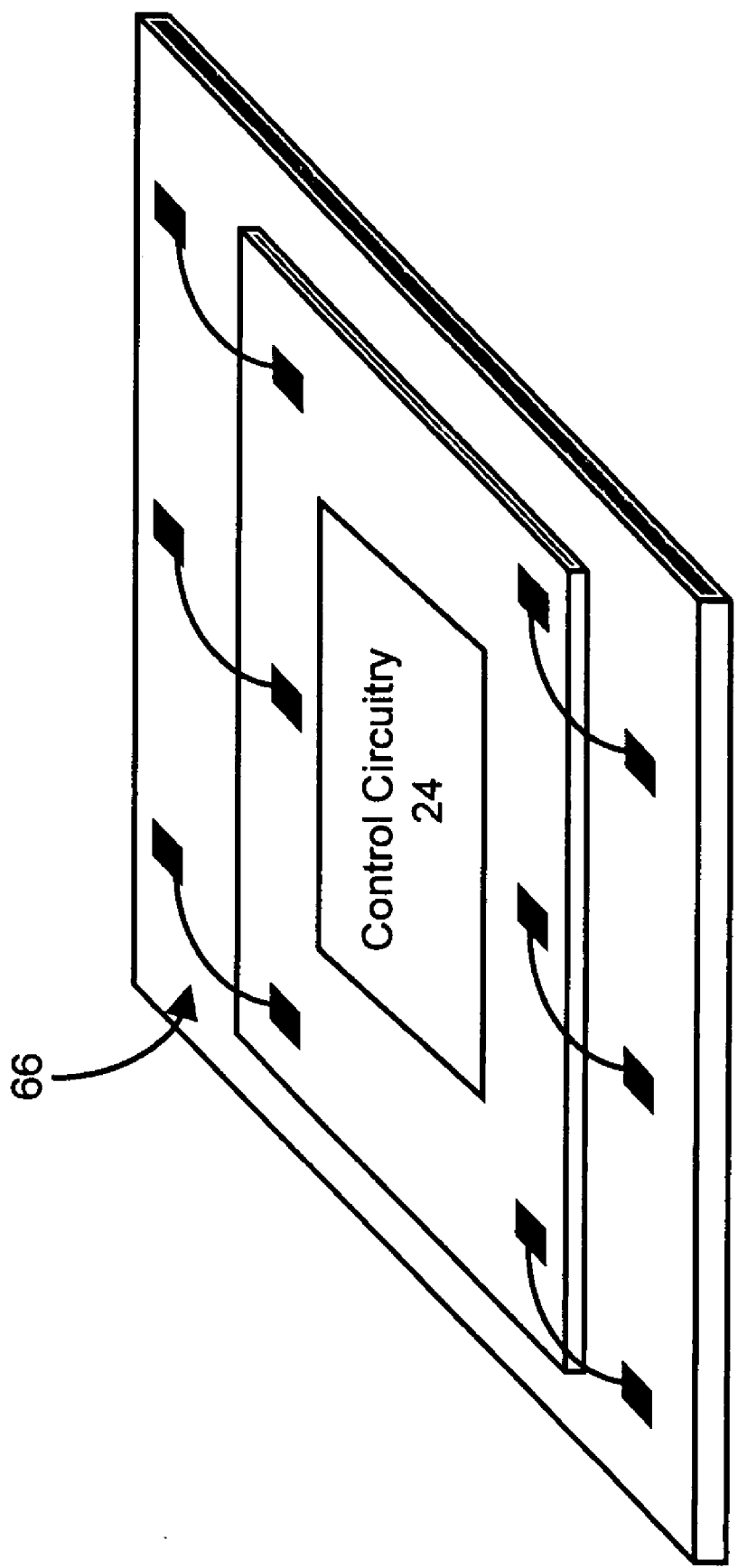
Figure 45:
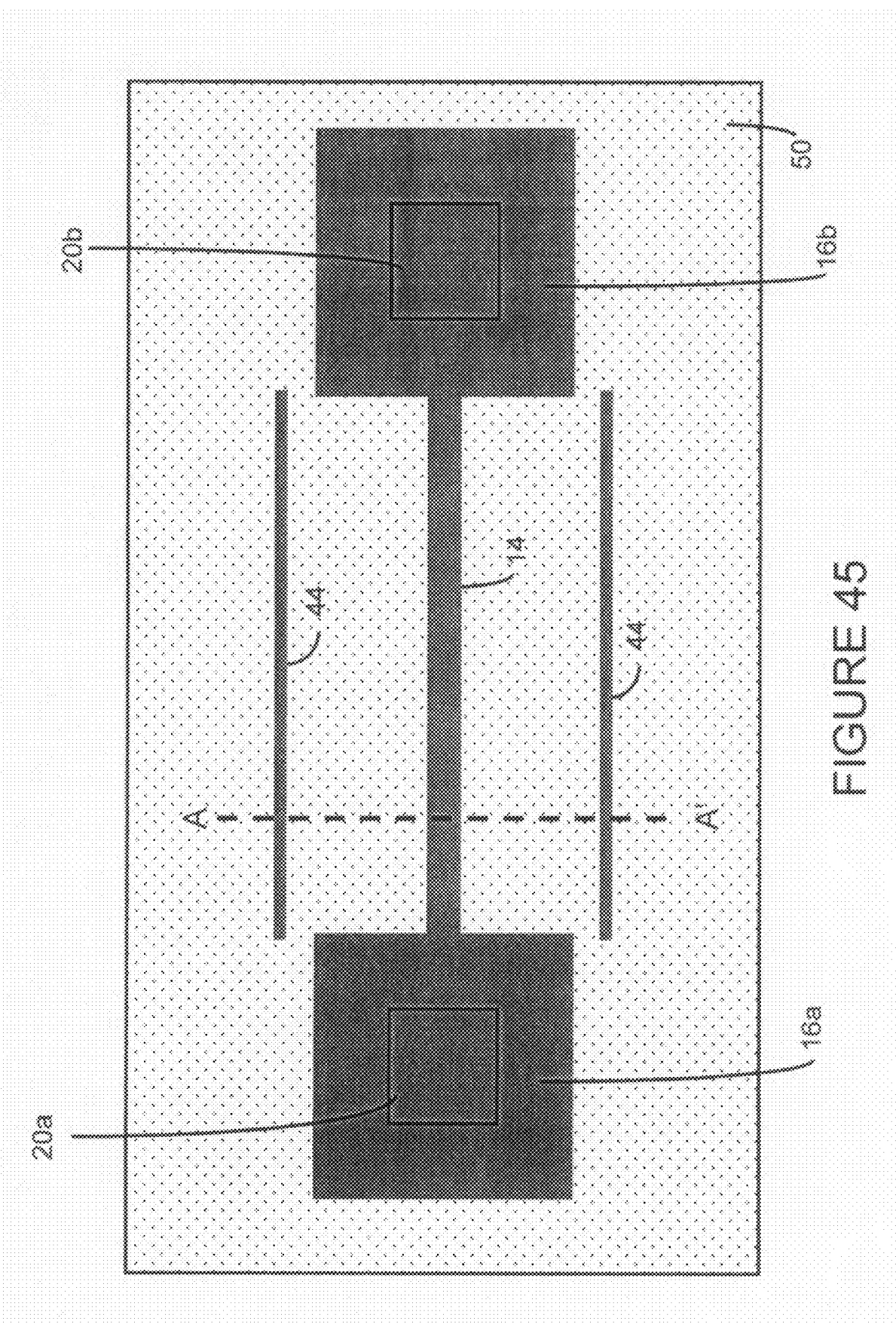
FIG. 45 illustrates a top view of a resonator, having a single oscillating beam, wherein the heating element includes a plurality of (independently or dependently controlled) heating elements that are disposed in the chamber.
Figure 46:
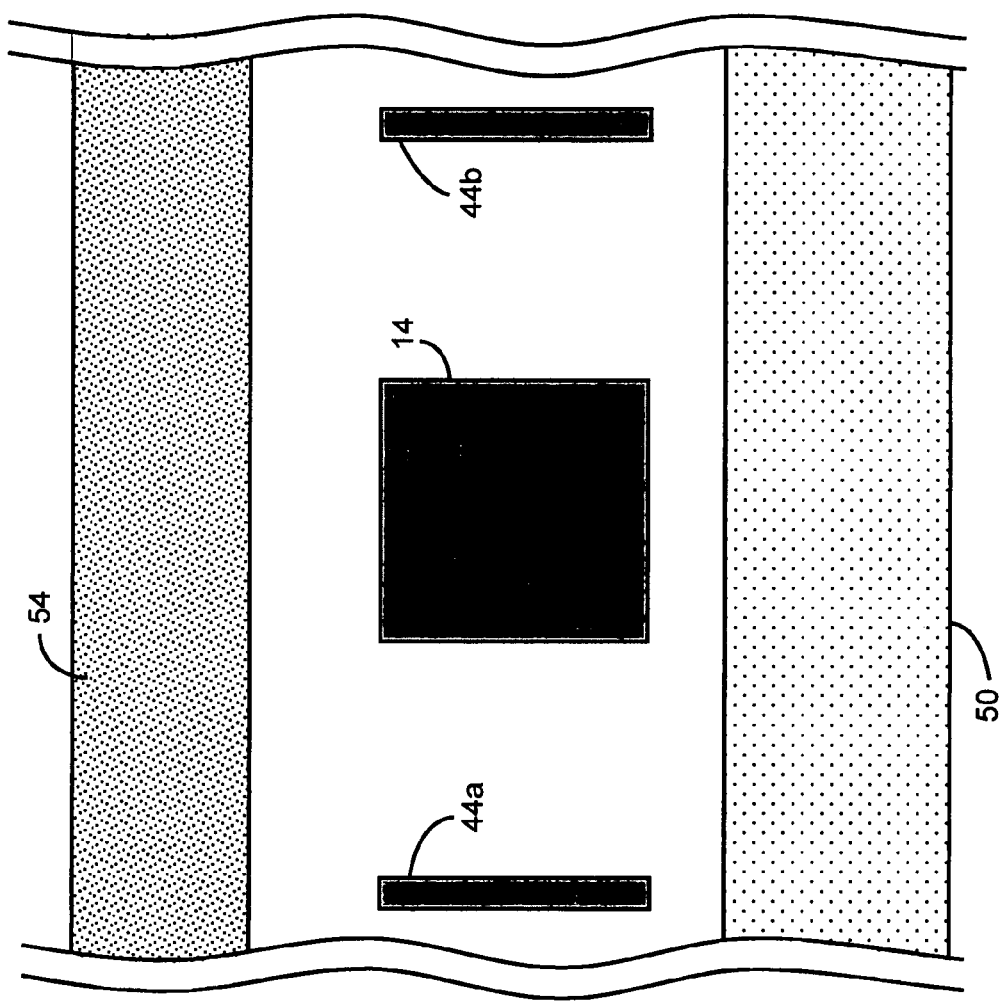
FIG. 46 illustrates an exemplary cross-sectional view of the resonator of FIG. 45, in conjunction with a plurality of (independently or dependently controlled) heating elements, sectioned along dotted lines A-A'.

The present inventions may be implemented in an integrated configuration having MEMS resonator 10 disposed on, for example, an SOI substrate, with control circuitry 24, temperature sensors 26, electrical source 28 (not shown) and/or temperature measurement circuitry 32 (not shown). (See, for example, FIGS. 44A-44D). Notably, with reference to FIGS. 44E-44G, MEMS resonator 10 and control circuitry 24, temperature sensors 26, electrical source 28 (not shown) and/or temperature measurement circuitry 32 (not shown)) may be disposed on separate substrates, namely 50a and 50b. In this embodiment, the various control and data signals (for example, the current and temperature information) may be exchanged using wire interconnects 66 electrically interconnecting bond pads located on substrates 50a and 50b.

There are many inventions described and illustrated herein. While certain embodiments, features, materials, configurations, attributes and advantages of the inventions have been described and illustrated, it should be understood that many other, as well as different and/or similar embodiments, features, materials, configurations, attributes, structures and advantages of the present inventions that are apparent from the description, illustration and claims. As such, the embodiments, features, materials, configurations, attributes, structures and advantages of the inventions described and illustrated herein are not exhaustive and it should be understood that such other, similar, as well as different, embodiments, features, materials, configurations, attributes, structures and advantages of the present inventions are within the scope of the present invention.

For example, the heating elements may be arranged in many different and diverse configurations in order to provide focused, preferential and/or selective heating of moveable beam 14. For example, one or more independent heating elements may be disposed on in the chamber in which mechanical structure 12 resides. (See, for example, (FIGS. 28, 33, 35, 39A-39C and 45). In this way, control circuitry 24 may more precisely control the temperature of moveable beam 14 and maintain the temperature thereof at a constant (or relatively constant) and/or predetermined or desired temperature or temperatures.

The electrical source that provides current to the heating elements may include one or more independent sources to enhance the flexibility of the heating/temperature control of the moveable beam. For example, one of a plurality of electrical sources may be "dedicated" to one or more heating elements. In this regard, each of heating element 44a-d of FIG. 35 (and related FIGURES) may be independently controlled via one or more electrical sources. All permutations and configurations of independently or dependently controlling the plurality heating elements are intended to be within the present invention.

Further, the present inventions may employ any temperature sensor or sensing technique, whether now known or later developed. For example, the present inventions may employ a temperature sensing technique using the moveable beam itself as a first temperature sensor and at least a second temperature sensor, disposed in the MEMS resonator, which measures, for example, the temperature of the substrate distant from the heating element(s) or sufficiently disposed therefrom such that the heating element(s) do not prevent the sensor from detecting, sampling and/or measuring the temperature of the substrate. In this embodiment, the non-conformal temperature of the moveable beam may depend on the temperature difference between the desired beam temperature and the temperature of the substrate. Thus, by calculating and/or determining this difference, the actual temperature of the moveable beam may be approximated and/or extrapolated using, for example, a look-up table that correlates the aforementioned difference and the actual temperature. Alternatively, the control circuitry may employ a predetermined or mathematical relationship to estimate the temperature of the moveable beam wherein that relationship uses temperature difference between the desired beam temperature and the temperature of the substrate. Such temperature sensing techniques may significantly improve the temperature estimate of the moveable beam, which in turn, may result in an enhanced accuracy of the frequency of the output signal of the MEMS resonator.

Moreover, the present inventions may be implemented in systems that dynamically and/or statically change the resonant frequency of a moveable beam by changing, modifying and/or controlling the operating temperature of the moveable beam. In this regard, the control circuitry, in conjunction the temperature sensor(s), electrical source(s) and/or temperature measurement circuitry, may be employed to determine an appropriate or a predetermined temperature of the moveable beam based on a desired, predetermined and/or selectable frequency of the output of MEMS resonator. Such change, modification and/or control may be part of a calibration or start-up procedure and/or a dynamic operating requirement of the system.

As mentioned above, MEMS resonator 10 may employ any type of MEMS design and/or control, whether now known or later developed, including those discussed in detail above. Accordingly, the resonator configurations of the illustrative examples are not to be construed or interpreted in a limiting sense.

Moreover, MEMS resonator 10, as mentioned above, may be encapsulated using any thin film encapsulation techniques, whether now known or later developed. For example, the present invention may employ the encapsulation techniques described and illustrated in non-provisional patent application entitled "Microelectromechanical Systems, and Method of Encapsulating and Fabricating Same", which was filed on Jun. 4, 2003 and assigned Ser. No. 10/454,867 (hereinafter "Microelectromechanical Systems and Method of Encapsulating patent application"). In this regard, any and all of the embodiments of MEMS resonator 10 according to the present invention may be encapsulated using the techniques described and illustrated in Microelectromechanical Systems and Method of Encapsulating patent application. Moreover, MEMS resonator 10 according to the present invention may also include or employ the techniques of electrically isolating contact areas and/or field areas from other electrically conductive materials, as described and illustrated in Microelectromechanical Systems and Method of Encapsulating patent application. For the sake of brevity, the encapsulation and isolation techniques of Microelectromechanical Systems and Method of Encapsulating patent application, implemented in conjunction with the inventions described and illustrated herein, will not be repeated. It is expressly noted, however, that the entire contents of the Microelectromechanical Systems and Method of Encapsulating patent application, including, for example, the features, attributes, alternatives, materials, techniques and advantages of all of the embodiments and/or inventions, are incorporated by reference herein.

Further, while the exemplary embodiments of the present inventions have been described in the context of microelectromechanical systems including micromechanical structures or elements, the present inventions are not limited in this regard. Rather, the inventions described herein are applicable to other electromechanical systems including, for example, nanoelectromechanical systems. Thus, the present inventions may be pertinent to electromechanical systems, for example, resonators, made in accordance with fabrication techniques, such as lithographic and other precision fabrication techniques, which reduce mechanical components to a scale that is generally comparable to microelectronics.

The terms "resonator", "MEMS resonator" or "micromechanical resonator" as used throughout this description cover a broad class of micro-machined structures and useful combinations of these structures. Such combinations typically include electronic circuitry, such as circuitry used to drive, power, monitor, and control the resonator. Micro-machined structures, such as holes, channels, cantilevers, bending beams, springs, tuning forks, membranes, substrate anchors, electrical contacts, etc., are building blocks for more complex devices, such as transducers. A transducer is generally any device capable of converting one form of energy into another. Transducers, including sensors and actuators, are an example of the type of devices susceptible to the benefits of the present invention.

Contemporary resonators often include at least one micro-machined structure generally referred to hereafter as a "beam structure." The term is broadly construed to cover any transducer designed to mechanically move when acted upon by an external force (for example, electrical, magnetic, and/or physical). Single bending beams, multiple beam tuning forks are examples of beam structures. Both continuous and discrete structures are encompassed by the term beam structure.

It should be further noted that while the present inventions have been described in connection with SOI, other substrates are suitable. For example, the first semiconductor layer may be materials in column IV of the periodic table, for example, silicon, germanium, carbon; also combinations of these, for example, silicon germanium, or silicon carbide; also of III-V compounds, for example, gallium phosphide, aluminum gallium phosphide, or other III-V combinations; also combinations of III, IV, V, or VI materials, for example, silicon nitride, silicon oxide, aluminum carbide, or aluminum oxide; also metallic silicides, germanides, and carbides, for example, nickel silicide, cobalt silicide, tungsten carbide, or platinum germanium silicide; also doped variations including phosphorus, arsenic, antimony, boron, or aluminum doped silicon or germanium, carbon, or combinations like silicon germanium; also these materials with various crystal structures, including single crystalline, polycrystalline, nanocrystalline, or amorphous; also with combinations of crystal structures, for instance with regions of single crystalline and polycrystalline structure (whether doped or undoped). Indeed, the first semiconductor layer may also be a metal or metal type material (in which case it would be a first conductor layer disposed on the first substrate layer). Notably, the mechanical structure (for example, moveable beam 14) may be comprised of the same materials as described above with respect to the first semiconductor layer.

The materials used to form, for example, moveable beam 14 are often characterized by a well understood Temperature Coefficient of Electrical Resistivity (TCR). TCR values may be used to equate a measured resistance for a beam structure with an approximation of its actual temperature. Thus, with foreknowledge of the TCR values, a MEMS designer may convert a measured resistance value for a beam structure into an accurate approximation of the corresponding actual temperature. This may be accomplished using many different techniques and/or modeling and, accordingly, all such techniques and/or modeling, whether now known or later developed, are intended to be within the scope of the present invention.

It should be further noted that the term "circuit" may mean, among other things, a single component or a multiplicity of components (whether in integrated circuit form or otherwise), which are active and/or passive, and which are coupled together to provide or perform a desired function. The term "circuitry" may mean, among other things, a circuit (whether integrated or otherwise), a group of such circuits, a processor(s), a state machine, a group of state machines, software, a processor(s) implementing software, or a combination of a circuit (whether integrated or otherwise), a group of such circuits, a state machine, group of state machines, software, a processor(s) and/or a processor(s) implementing software, processor(s) and circuit(s), and/or processor(s) and circuit(s) implementing software.

Finally, the term "data" may mean, among other things, a current or voltage signal(s) whether in an analog or a digital form. The term "measure" means, among other things, sample, sense, inspect, detect, monitor and/or capture. The phrase "to measure" or similar, means, for example, to sample, to sense, to inspect, to detect, to monitor and/or to capture.

What is claimed is:

1. A MEMS resonator having a resonant frequency defined in relation to an operating temperature, comprising:
    a first substrate anchor;
    a second substrate anchor;
    a moveable beam connected between and thermally coupled to the first and second substrate anchors;
    for each substrate anchor, a respective heating element coupled to the respective substrate anchor;
    an electrical source, coupled to each of the heating elements, to provide a controlled current to the heating elements, each of the heating elements thereby conductively heating the respective substrate anchors to which the respective heating element is coupled, thereby heating the moveable beam; and
    an encapsulation layer which forms a chamber between the moveable beam and the encapsulation layer, wherein, the heating element is disposed in the chamber.

2. The MEMS resonator of claim 1 further including temperature measurement circuitry to determine the resistance of the moveable beam.

3. The MEMS resonator of claim 2 wherein the temperature measurement circuitry applies an electrical signal to the moveable beam and measures the response to the electrical signal by the moveable beam to determine information that is representative of the temperature of the moveable beam.

4. The MEMS resonator of claim 3 wherein the electrical signal is an AC or DC voltage.

5. The MEMS resonator of claim 3 wherein the electrical signal is an AC or DC current.

6. The MEMS resonator of claim 2 further including control circuitry, coupled to the temperature measurement circuitry, to generate control information and provide the control information to the electrical source to maintain the temperature of the moveable beam at a predetermined operating temperature or within a predetermined range of temperatures while the MEMS resonator is in operation.

7. The MEMS resonator of claim 6 wherein the control circuitry, in response to information which is representative of the temperature of the moveable beam, generates the control information using a mathematical relationship or data contained in a look-up table.

8. The MEMS resonator of claim 1 further including:
a temperature sensor, disposed in proximity to the moveable beam, to measure temperature; and
control circuitry, coupled to the temperature sensor, to generate control information and provide the control information to the electrical source to control the operating temperature of the moveable beam.

9. The MEMS resonator of claim 8 wherein the control circuitry, in response to temperature data measured by the temperature sensor, generates the control information using a mathematical relationship or data contained in a look-up table.

10. A MEMS resonator having a resonant frequency defined in relation to an operating temperature, comprising:
a first substrate anchor including a first electrical contact;
a second substrate anchor including a second electrical contact;
a beam structure disposed between the first and the second substrate anchors;
a heating element disposed proximal to the beam structure and between the first and second substrate anchors; and
an electrical source, coupled to the first and second electrical contacts, to provide an electrical current to the heating element and thereby convectively and conductively heat the beam structure;
wherein at least one of:
the beam structure includes a composite structure formed from a plurality of materials, wherein at least two of the materials in the plurality of materials have different thermal expansion coefficients; and
at least one of the first and second substrate anchors includes a composite structure formed from a plurality of materials, wherein at least two of the materials in the plurality of materials have different thermal expansion coefficients.

11. A MEMS resonator having a resonant frequency defined in relation to an operating temperature, comprising:
a first substrate anchor including a first electrical contact;
a second substrate anchor including a second electrical contact;
a beam structure which comprises a plurality of moveable beams disposed between the first and the second substrate anchors;
a heating element disposed proximal to the beam structure and between the first and second substrate anchors; and
an electrical source, coupled to the first and second electrical contacts, to provide an electrical current to the heating element and thereby convectively and conductively heat the beam structure.

12. The MEMS resonator of claim 11, wherein the heating element conductively heats the first and second substrate anchors.

13. A MEMS resonator having a resonant frequency defined in relation to an operating temperature, comprising:
a first substrate anchor including a first electrical contact;
a second substrate anchor including a second electrical contact;
a beam structure disposed between the first and the second substrate anchors;
an encapsulation layer which forms a chamber between the beam structure and the encapsulation layer,
a heating element that:
is disposed proximal to the beam structure and between the first and second substrate anchors;
conductively heats the first and second substrate anchors; and
for the convective heating, heats a fluid in the chamber, the fluid imparting heat to the beam structure; and
an electrical source, coupled to the first and second electrical contacts, to provide an electrical current to the heating element and thereby convectively and conductively heat the beam structure.

14. The MEMS resonator of claim 13 wherein the beam structure is fixed at a first end to the first substrate anchor and at a second end to the second substrate anchor.

15. The MEMS resonator of claim 13 further including:
a temperature sensor, placed in proximity to the beam structure, to measure temperature; and
control circuitry, coupled to the temperature sensor, to generate control information and provide the control information to the electrical source to maintain the beam structure at the operating temperature.

16. The MEMS resonator of claim 15 wherein the control circuitry, in response to temperature data measured by the temperature sensor, generates the control information using a mathematical relationship or data contained in a look-up table.

17. The MEMS resonator of claim 13 wherein the beam structure comprises a single oscillating beam.

18. The MEMS resonator of claim 13, wherein the MEMS resonator is adapted for the beam structure to be heated by the heating element to maintain the temperature of the beam structure within a predetermined range of temperatures while the MEMS resonator is in operation.

19. The MEMS resonator of claim 13, wherein the heating element is disposed in the chamber.

20. The MEMS resonator of claim 19, wherein the heating element includes a plurality of heating elements for uniform heating of the chamber.

21. The MEMS resonator of claim 20, wherein at least one of the plurality of heating elements is controllable independently of other ones of the plurality of heating elements.

22. The MEMS resonator of claim 13, wherein the heating element is disposed in the encapsulation layer.

23. A method of controlling the resonant frequency of a MEMS resonator, wherein the MEMS resonator comprises a first substrate anchor comprising a first electrical contact, a second substrate anchor comprising a second electrical contact, a beam structure disposed between the first and the second substrate anchors, and encapsulation layer that forms a chamber between the beam structure and the encapsulation layer, and a heating element disposed proximal to the beam structure and between the first and second substrate anchors, the method comprising:

passing a heating current via the first and second electrical contacts to the heating element, the passing the heating current causing convective and conductive heating of the beam structure, wherein:

the heating element conductively heats the first and second substrate anchors; and for the convective heating, the heating element heats a fluid in the chamber, the fluid imparting heat to the beam structure; and adjusting the heating current in relation to an actual operating temperature for the beam structure.

* * * * *